(12) United States Patent
Takada

(10) Patent No.: US 8,288,226 B2
(45) Date of Patent: Oct. 16, 2012

(54) SEMICONDUCTOR DEVICE AND METHOD OF MANUFACTURING SEMICONDUCTOR DEVICE

(75) Inventor: Kazuhiko Takada, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/072,919

(22) Filed: Mar. 28, 2011

(65) Prior Publication Data

US 2012/0025290 A1    Feb. 2, 2012

(30) Foreign Application Priority Data

Jul. 28, 2010    (JP) .................. 2010-169183

(51) Int. Cl.
*H01L 21/00*    (2006.01)
(52) U.S. Cl. ..................................... 438/257
(58) Field of Classification Search .................. 438/257, 438/778
See application file for complete search history.

(56) References Cited

U.S. PATENT DOCUMENTS

| | | | |
|---|---|---|---|
| 5,705,027 A | 1/1998 | Katayama et al. | |
| 5,950,086 A | 9/1999 | Takahashi et al. | |
| 2001/0019150 A1 | 9/2001 | Kawai et al. | |
| 2003/0025147 A1 | 2/2003 | Nomoto et al. | |
| 2006/0051977 A1* | 3/2006 | Adachi et al. ................. | 438/778 |
| 2007/0228498 A1* | 10/2007 | Toba et al. .................... | 257/411 |

FOREIGN PATENT DOCUMENTS

| | | |
|---|---|---|
| JP | 8-288252 A | 11/1996 |
| JP | 10-163456 A | 6/1998 |
| JP | 2000-150678 A | 5/2000 |
| JP | 2003-168750 A | 6/2003 |

* cited by examiner

*Primary Examiner* — Charles Garber
*Assistant Examiner* — Andre' C Stevenson
(74) *Attorney, Agent, or Firm* — Westerman, Hattori, Daniels and Adrian, LLP

(57) ABSTRACT

A conductive film having a first width in a first direction, an ONO film, and a control gate are formed above a tunnel gate insulating film. With the control gate as a mask, the conductive film is etched to form a floating gate. Then, an inter-layer insulating film is formed. A contact hole whose width in the first direction is larger than the first width is formed in the inter-layer insulating film. Then, sidewall spacer is formed on an inside wall of the contact hole.

14 Claims, 56 Drawing Sheets

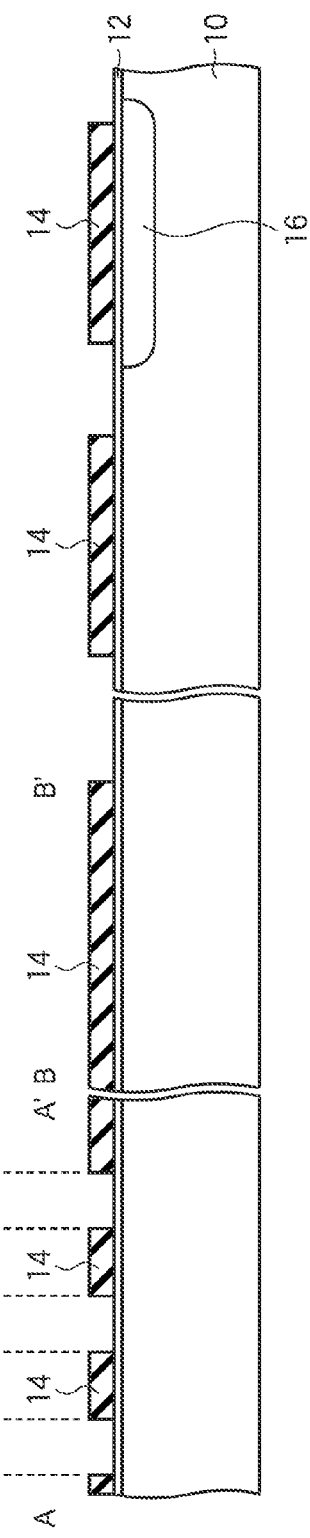
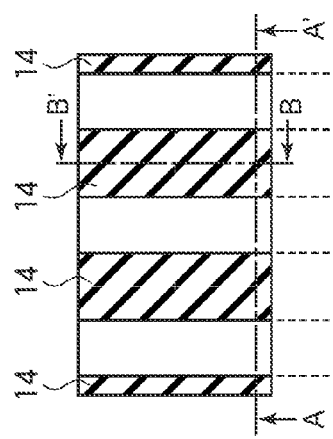

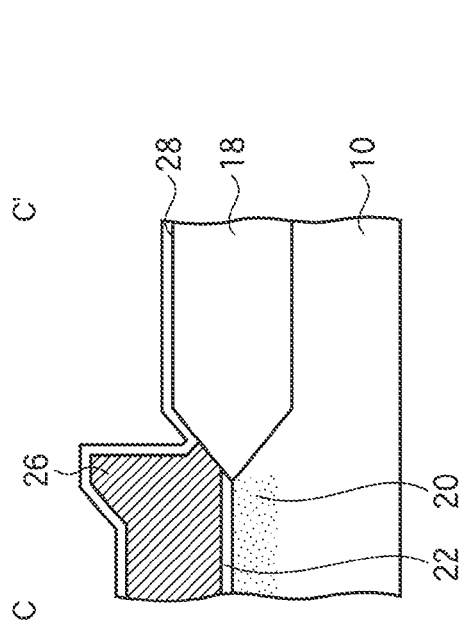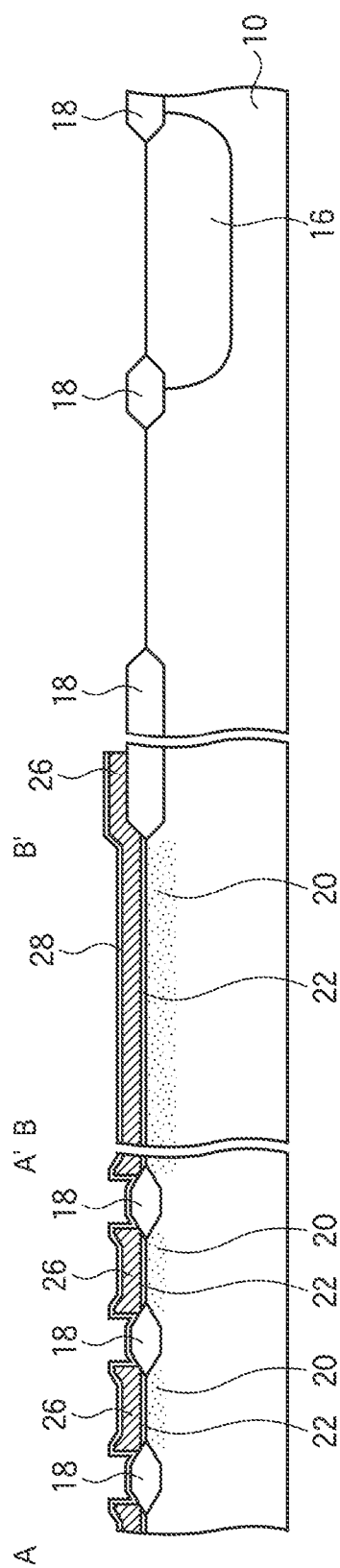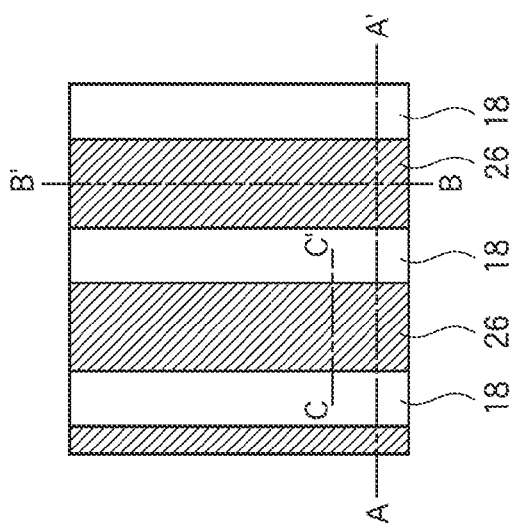

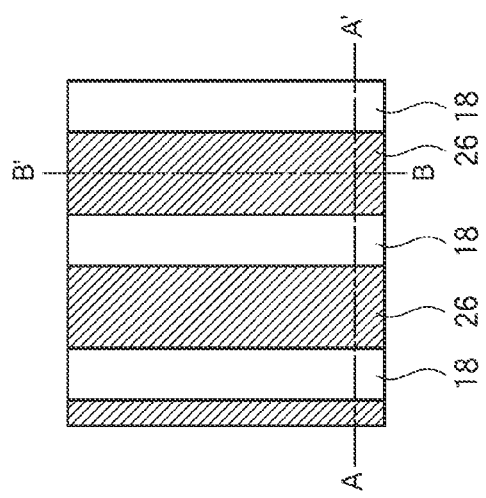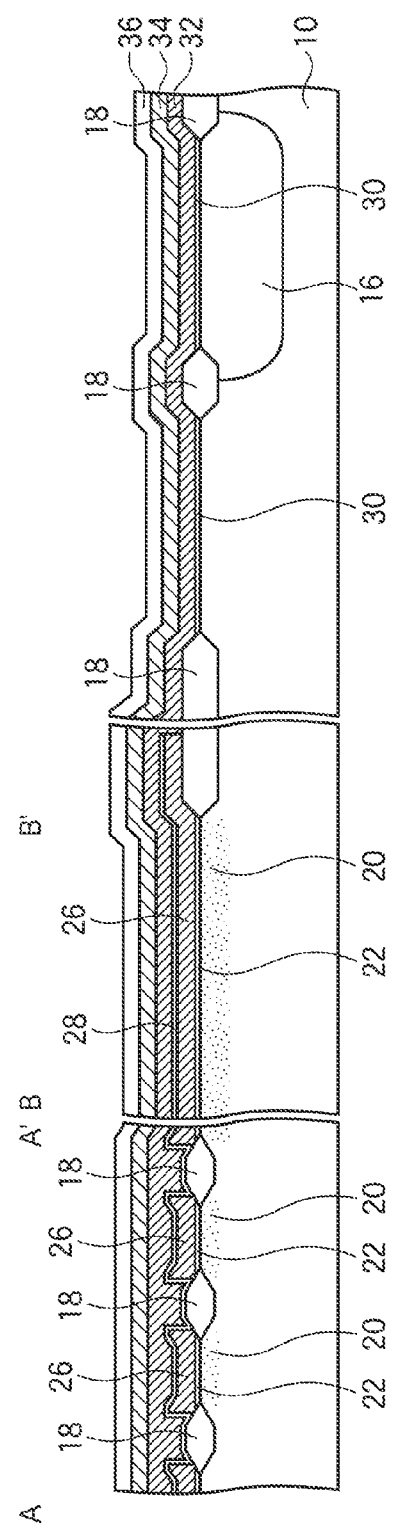

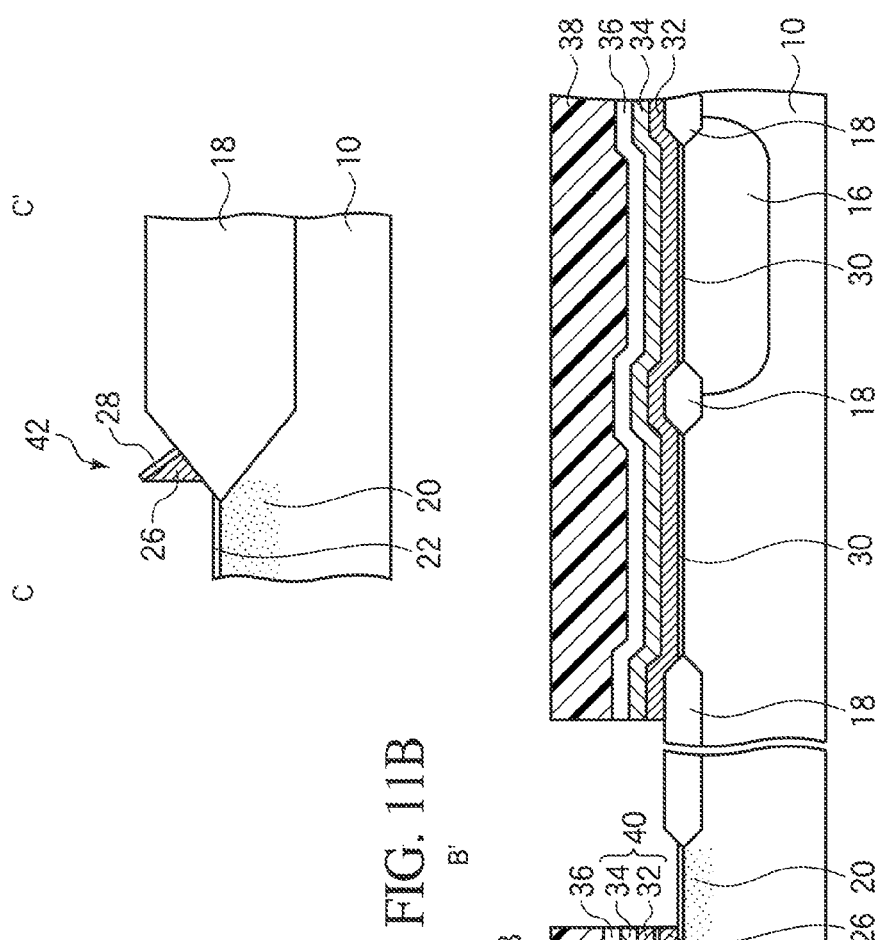
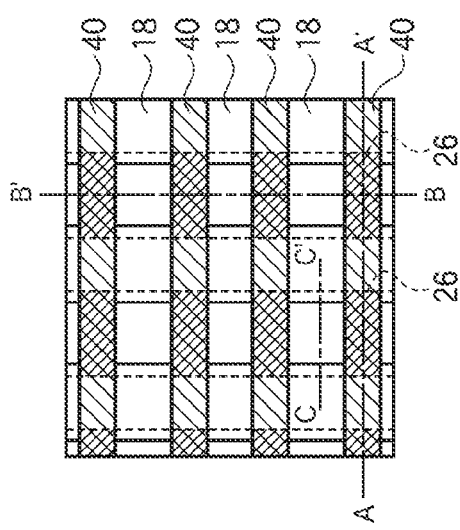
FIG. 11A
FIG. 11B
FIG. 11C

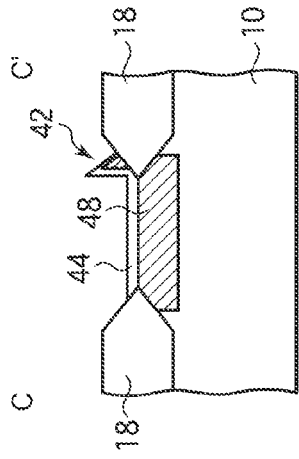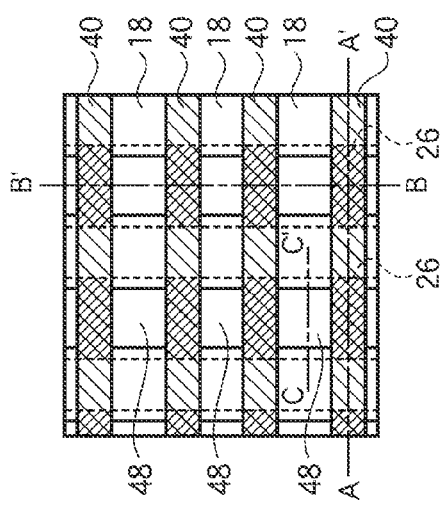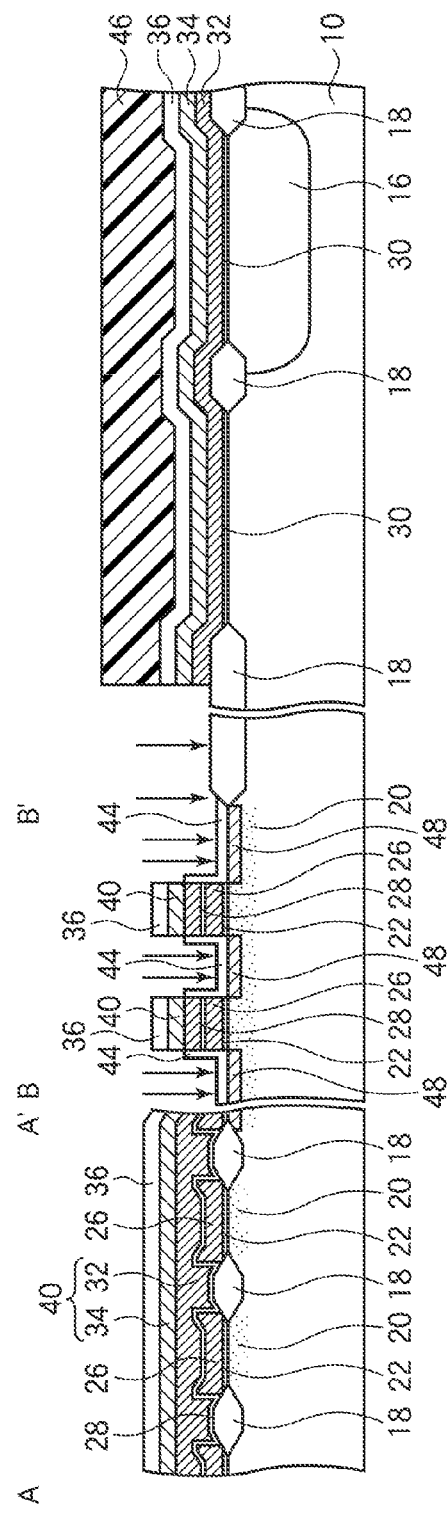

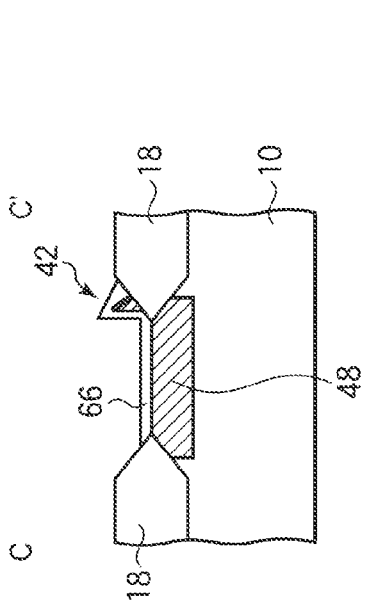
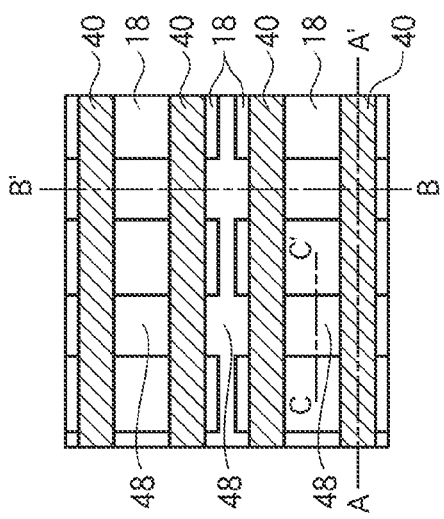
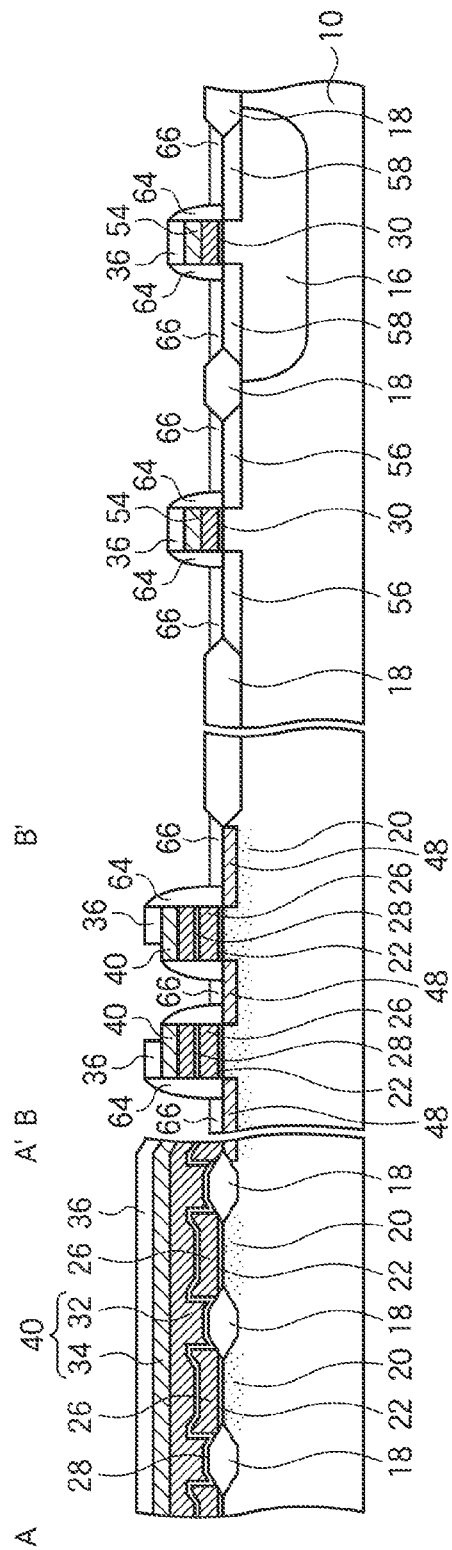

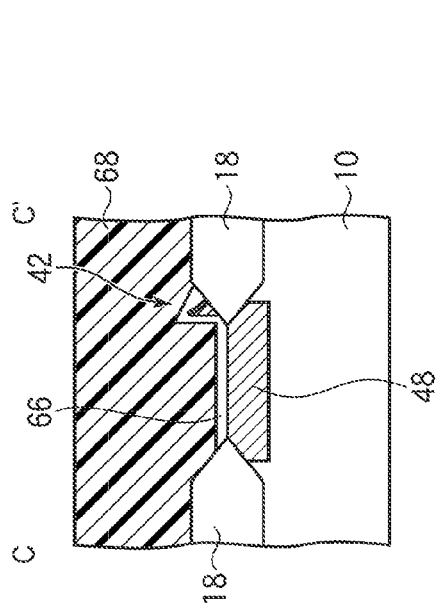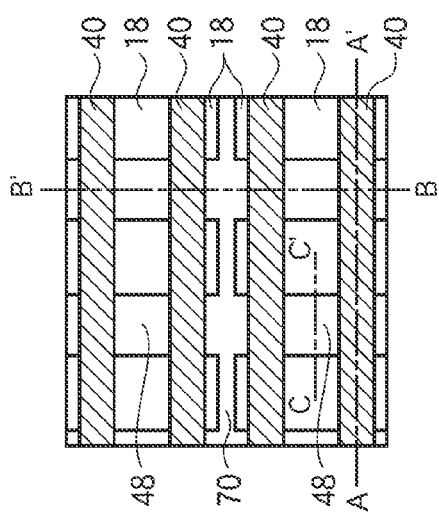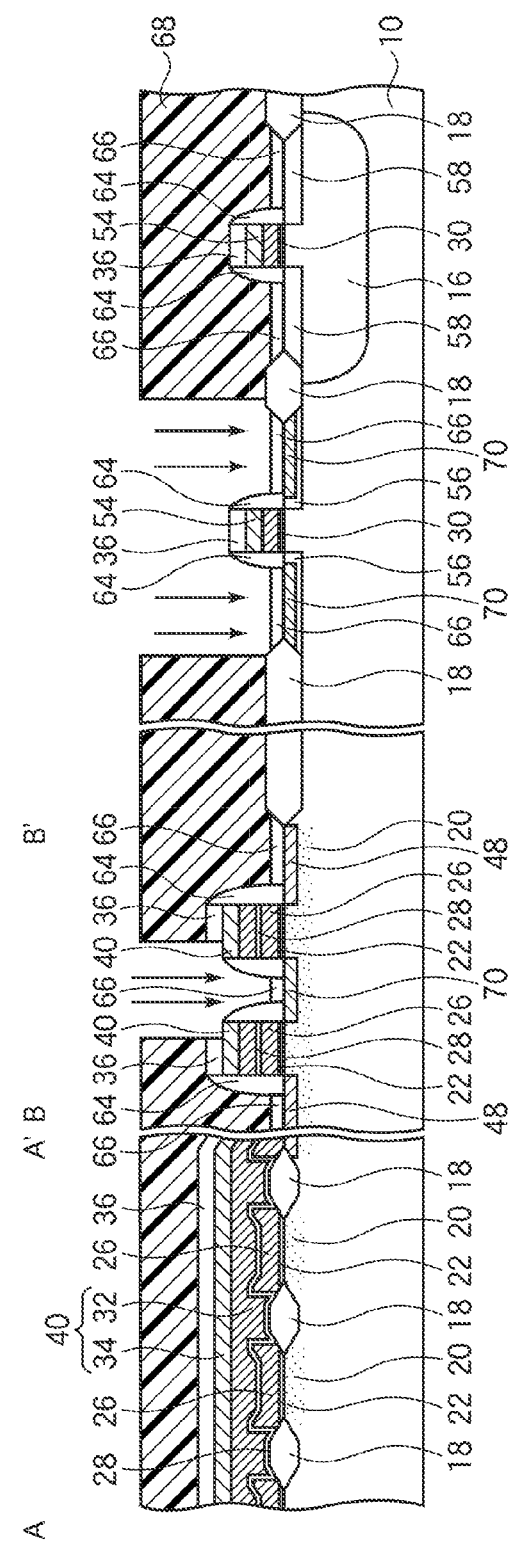

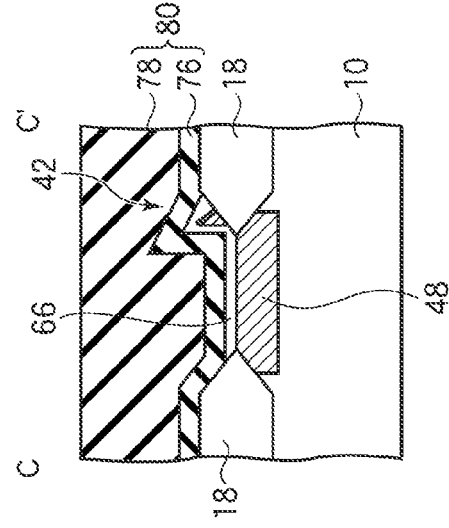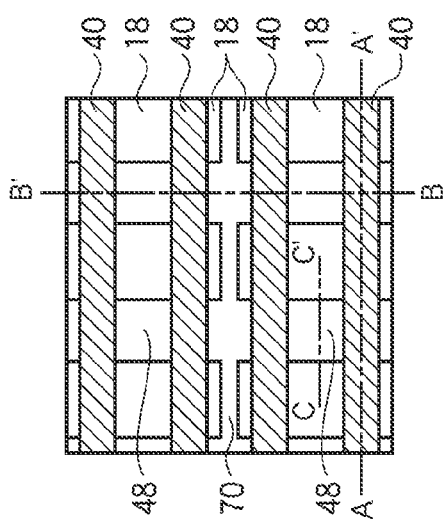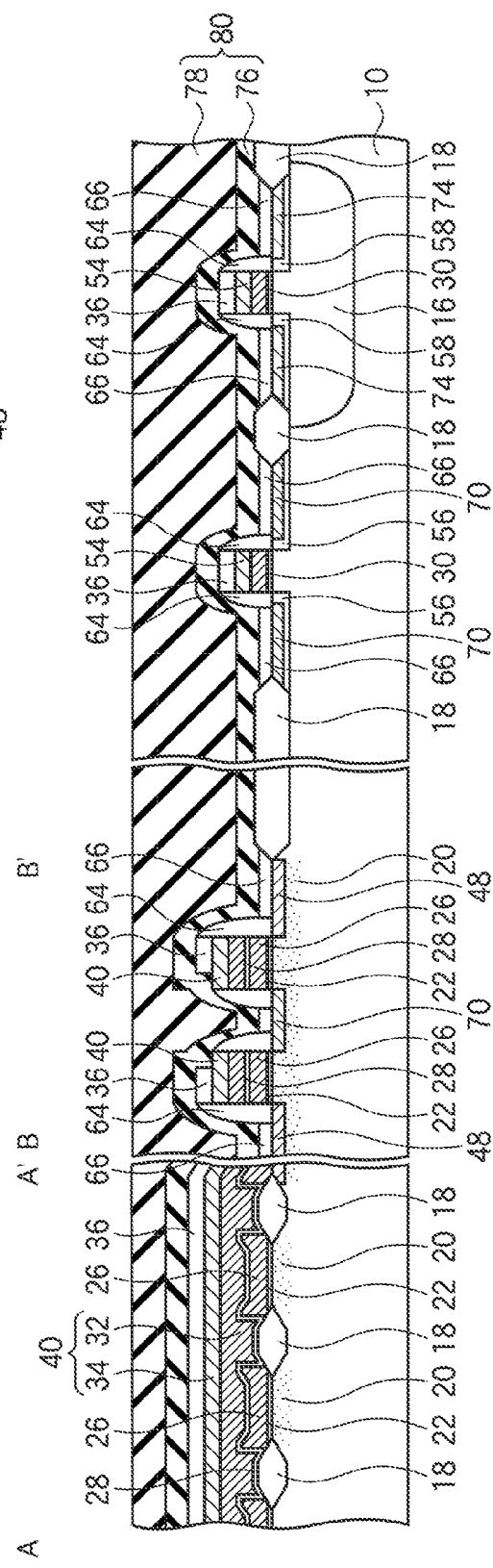

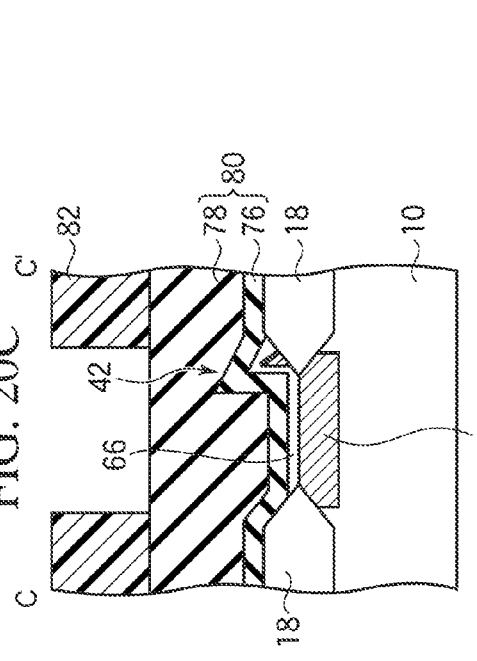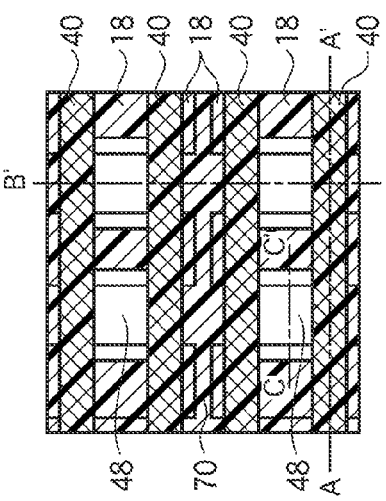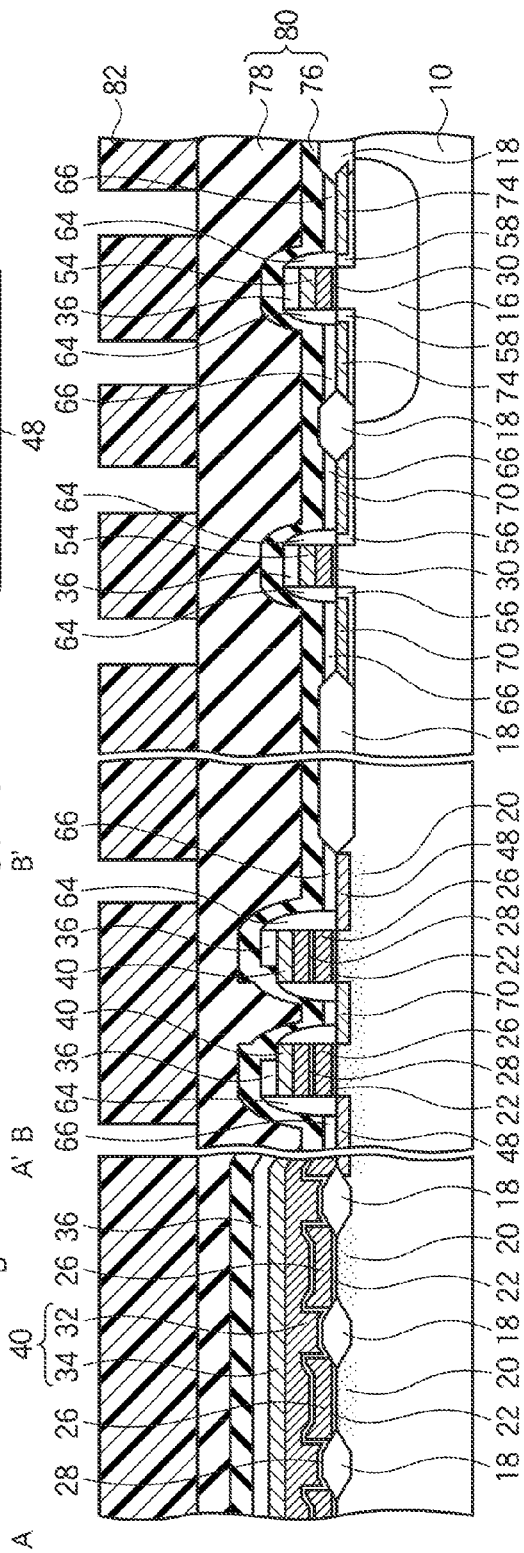

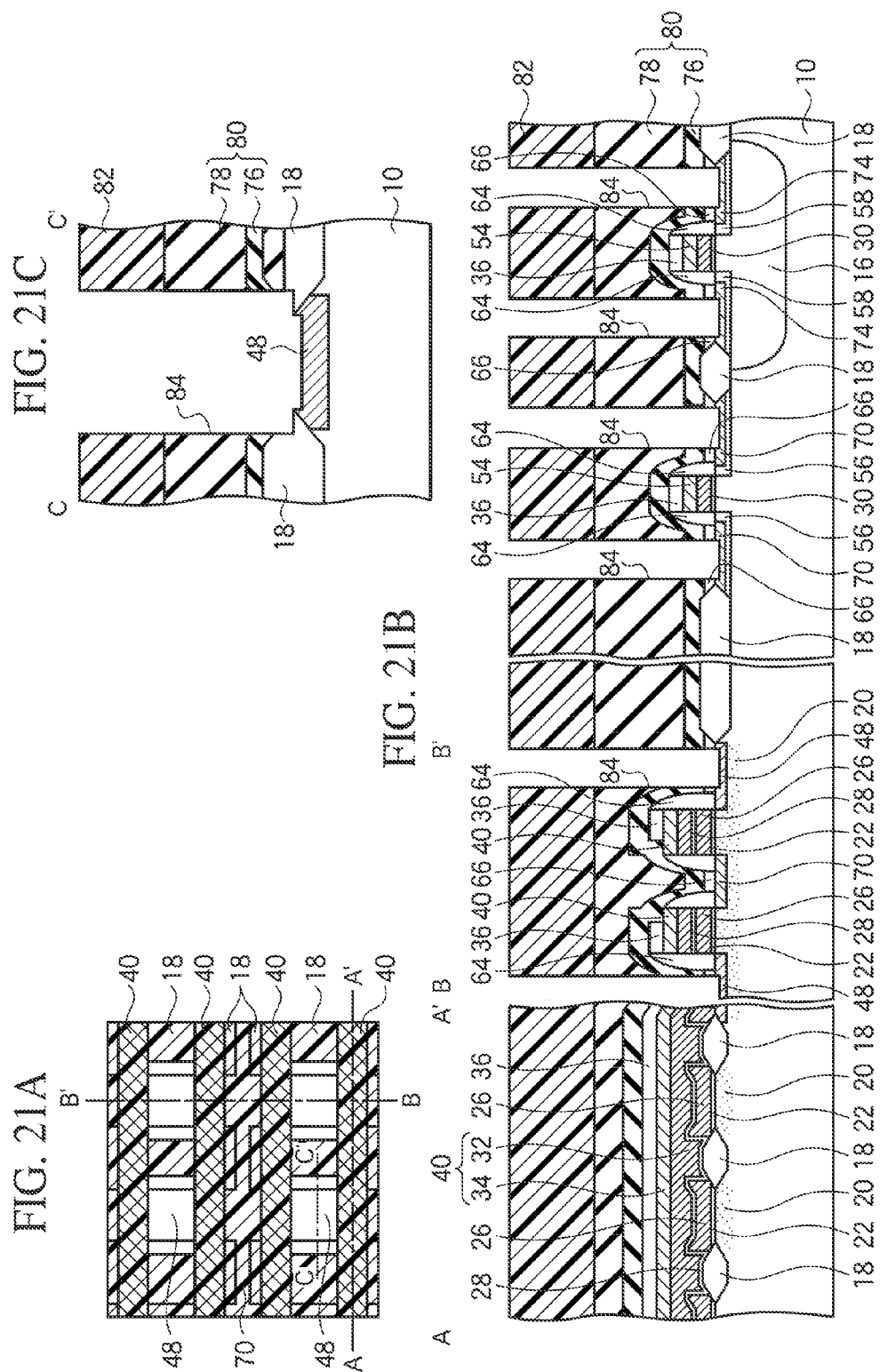

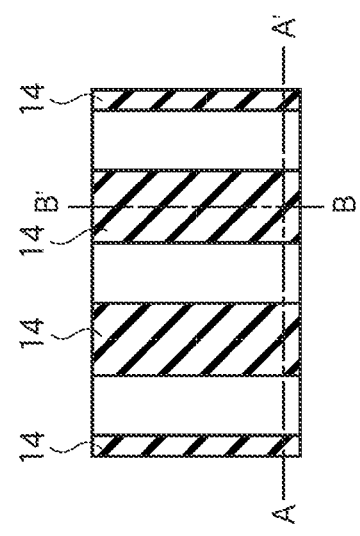
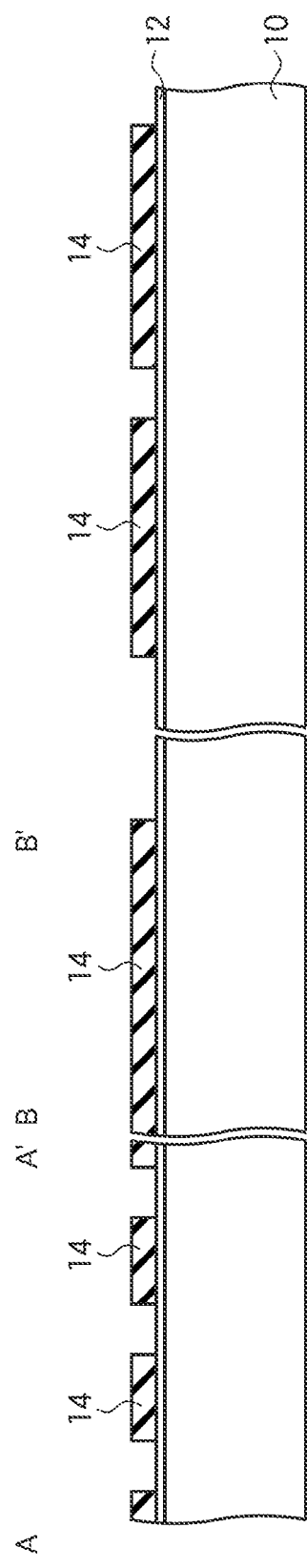

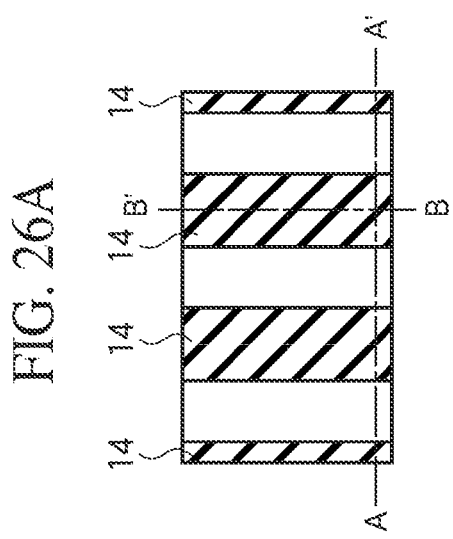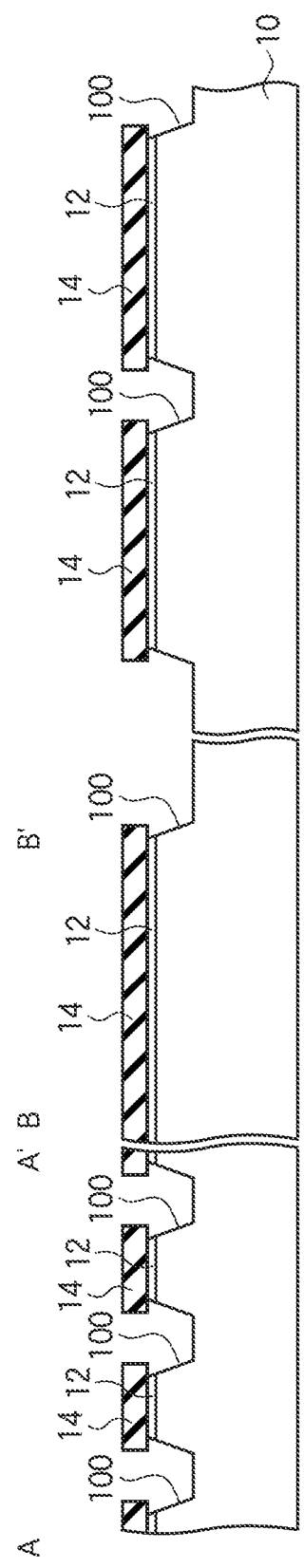

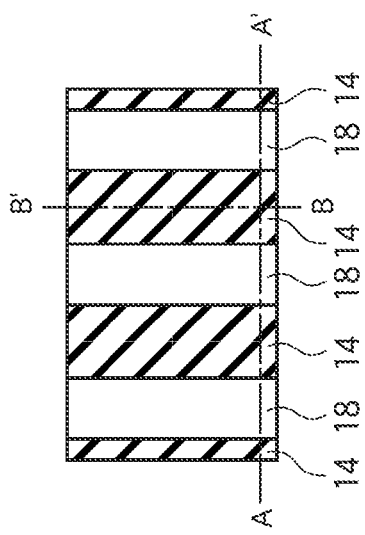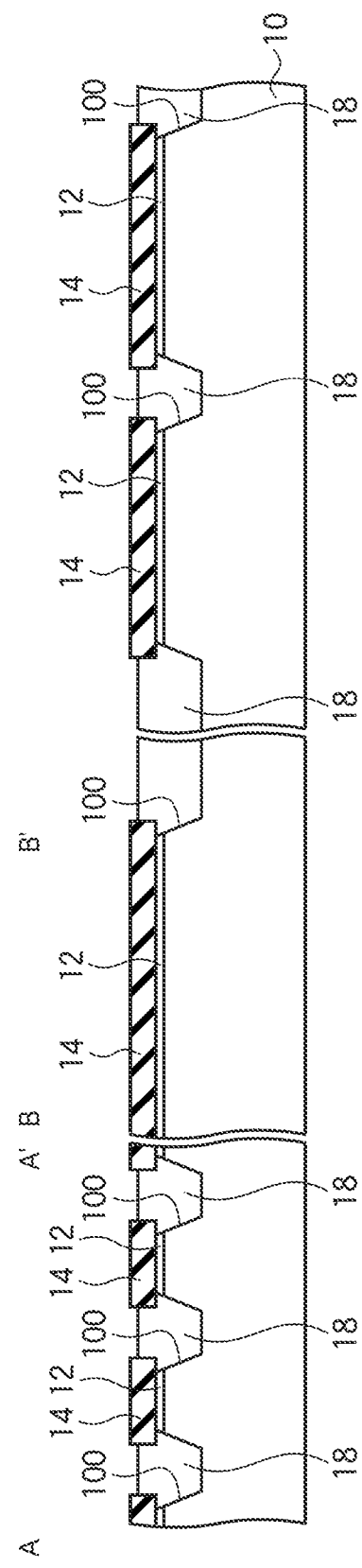

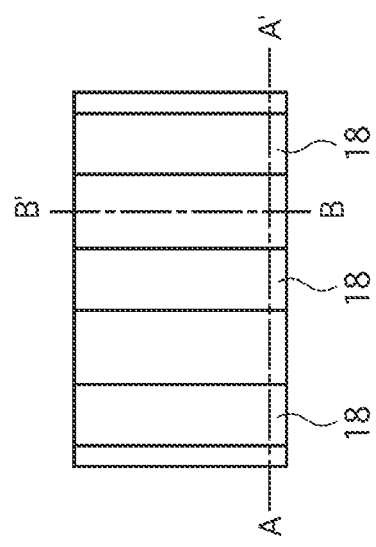
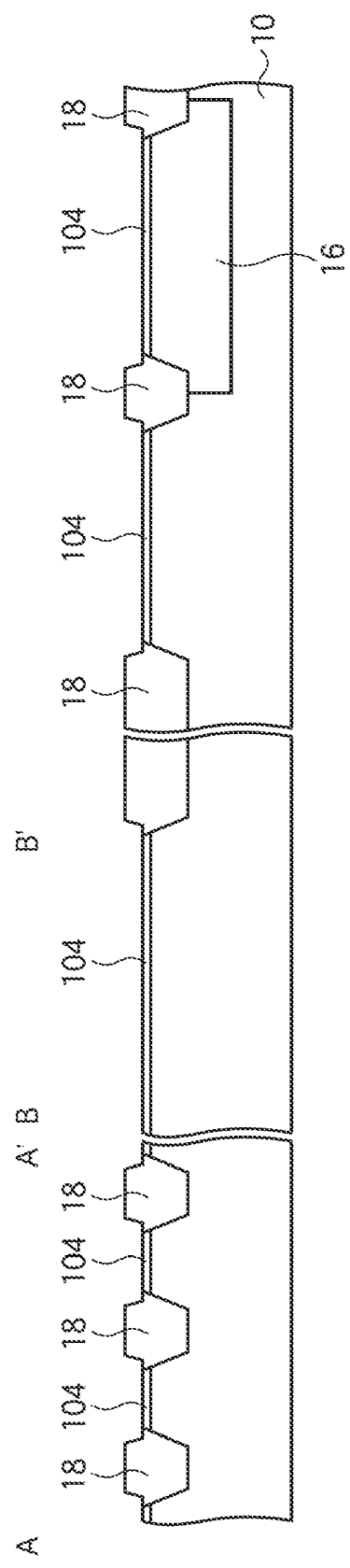
FIG. 29A
FIG. 29B

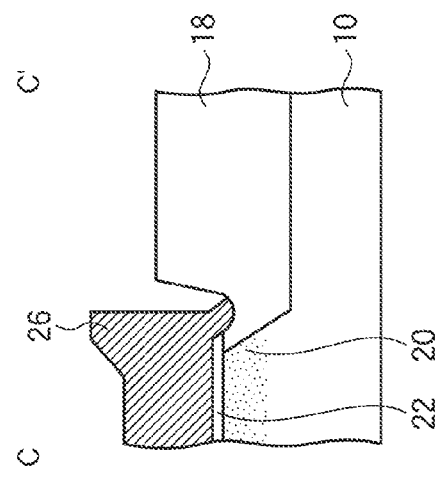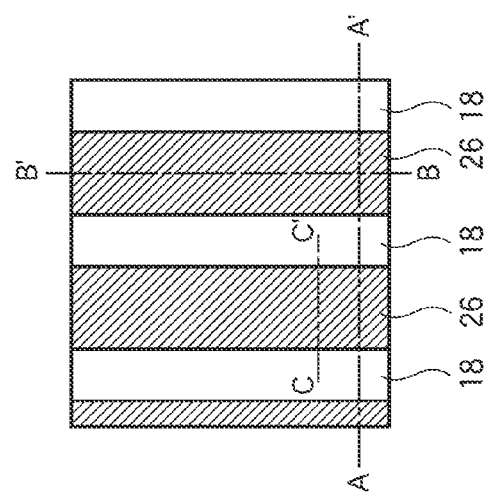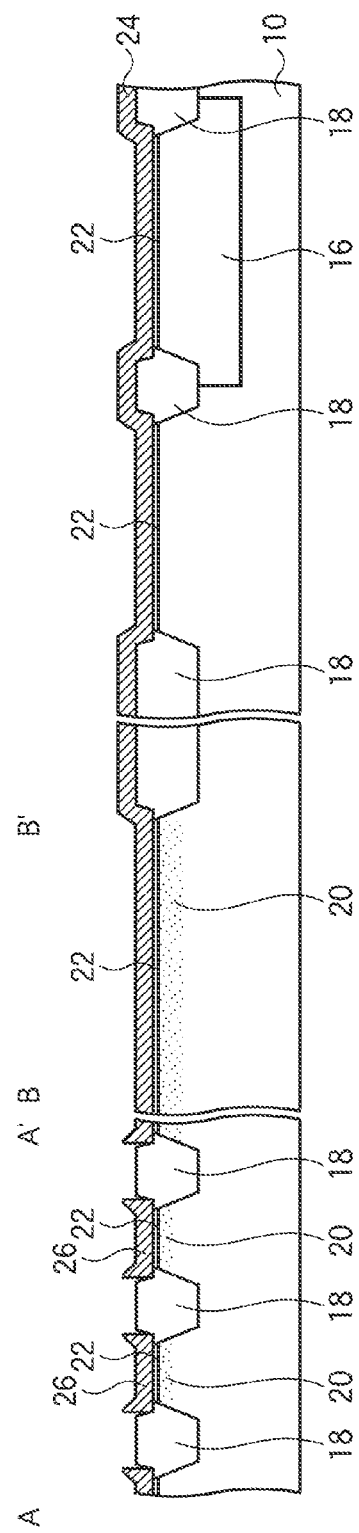

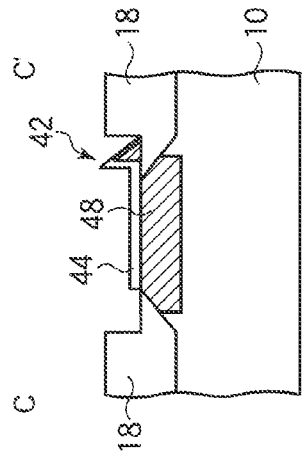
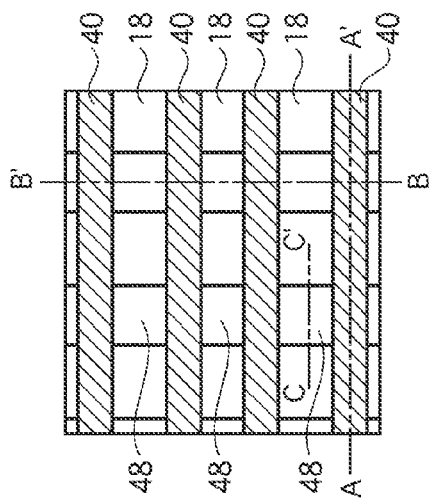
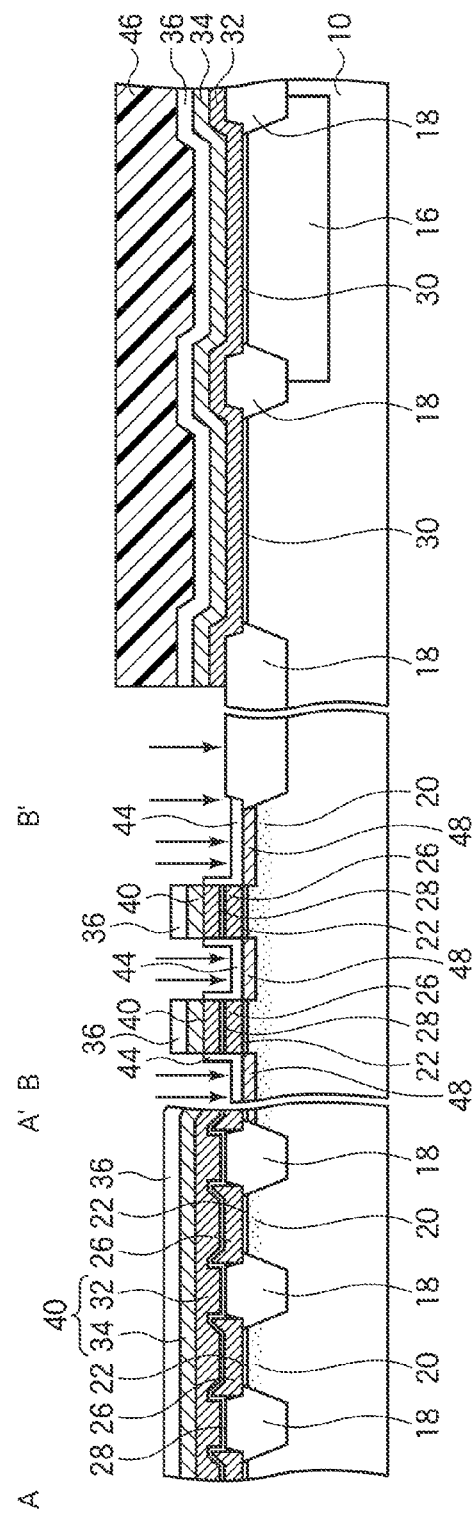

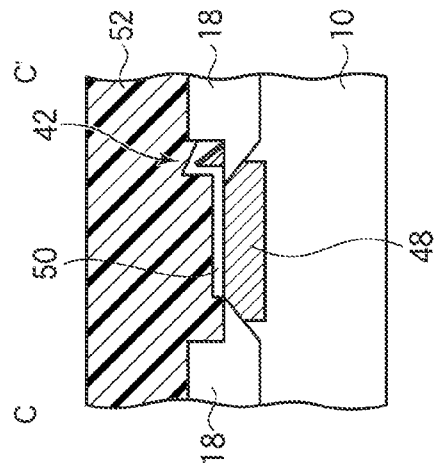
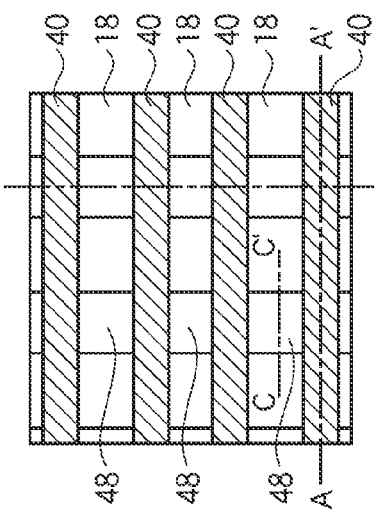
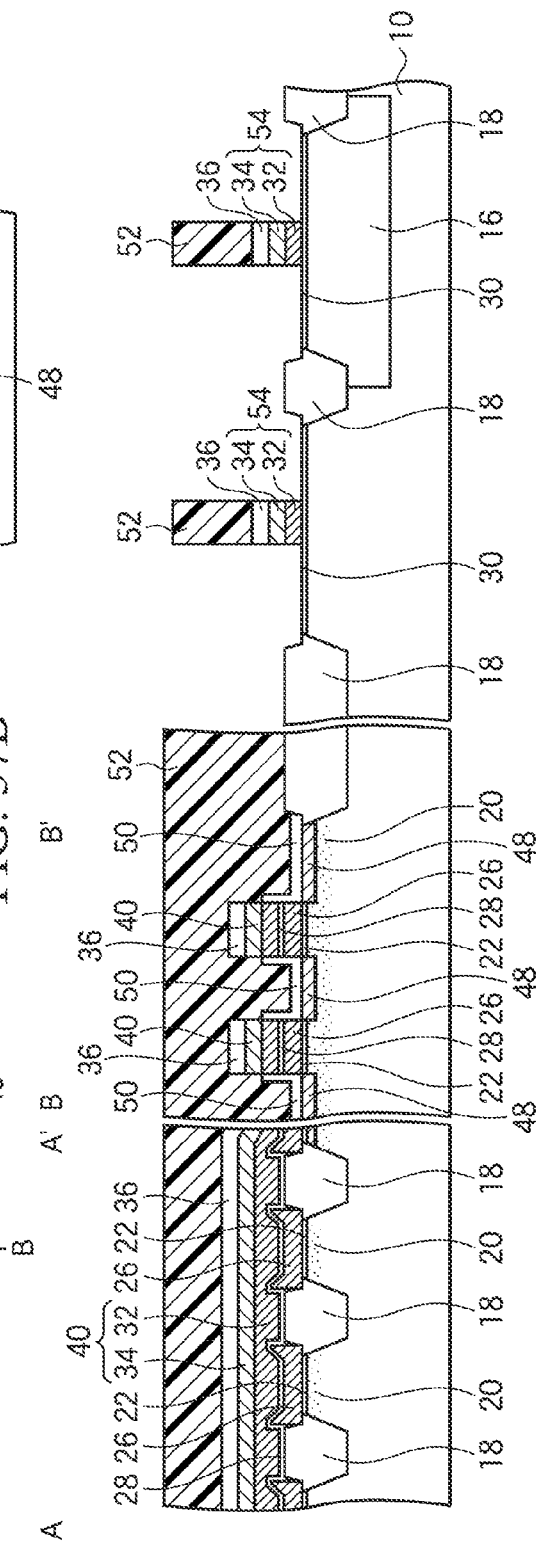
FIG. 37A
FIG. 37B
FIG. 37C

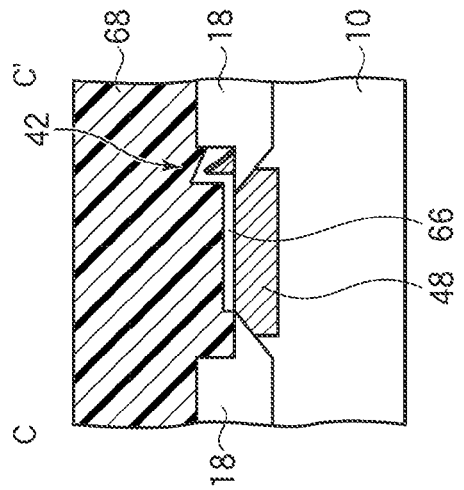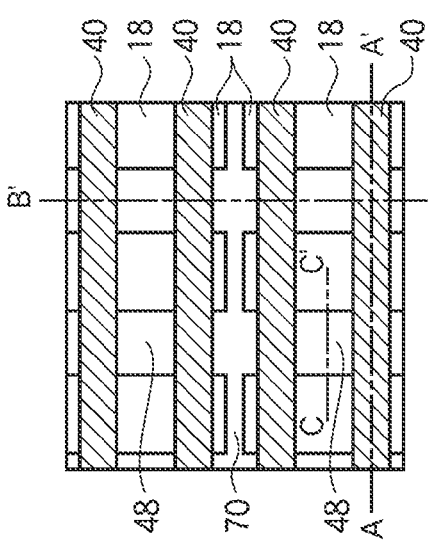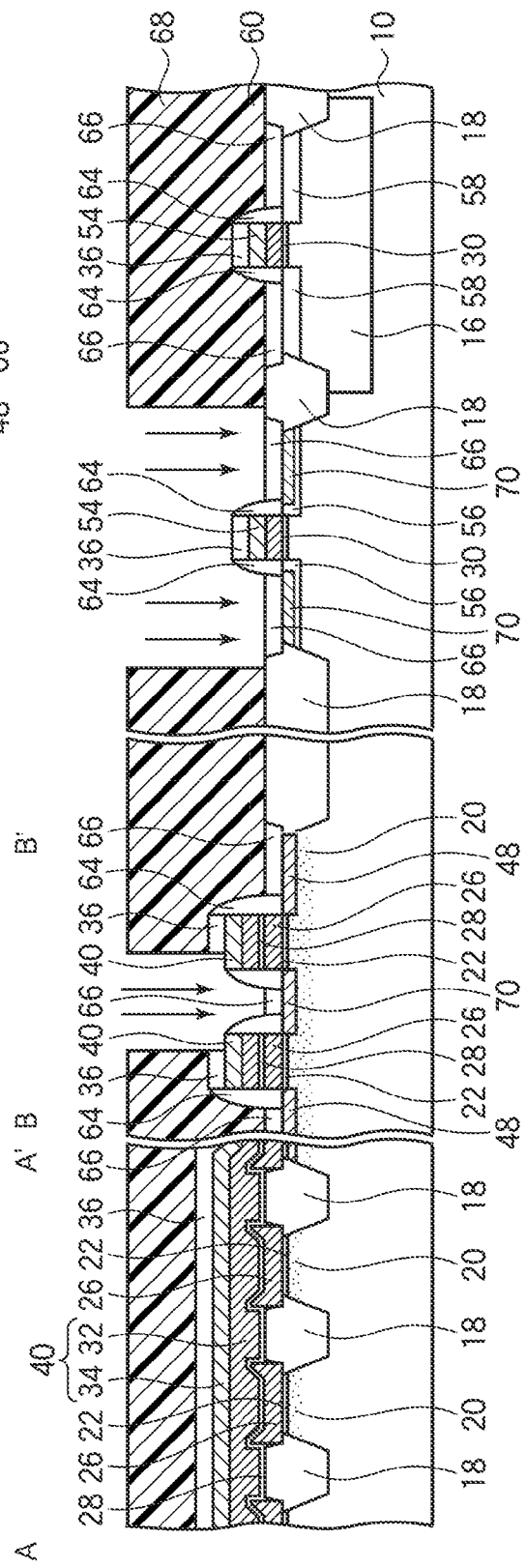

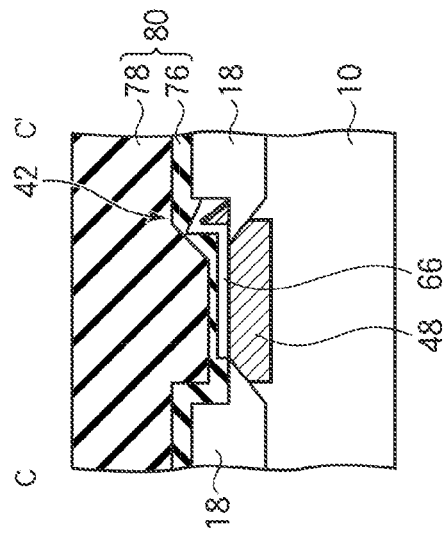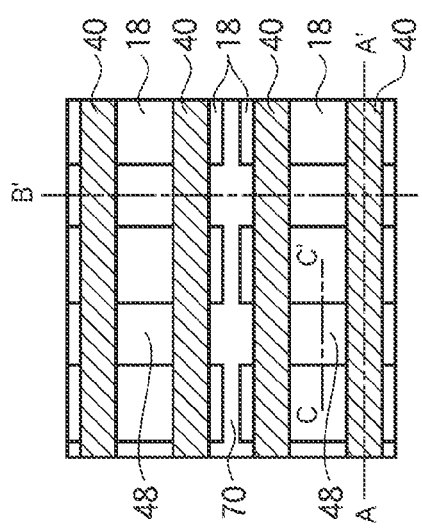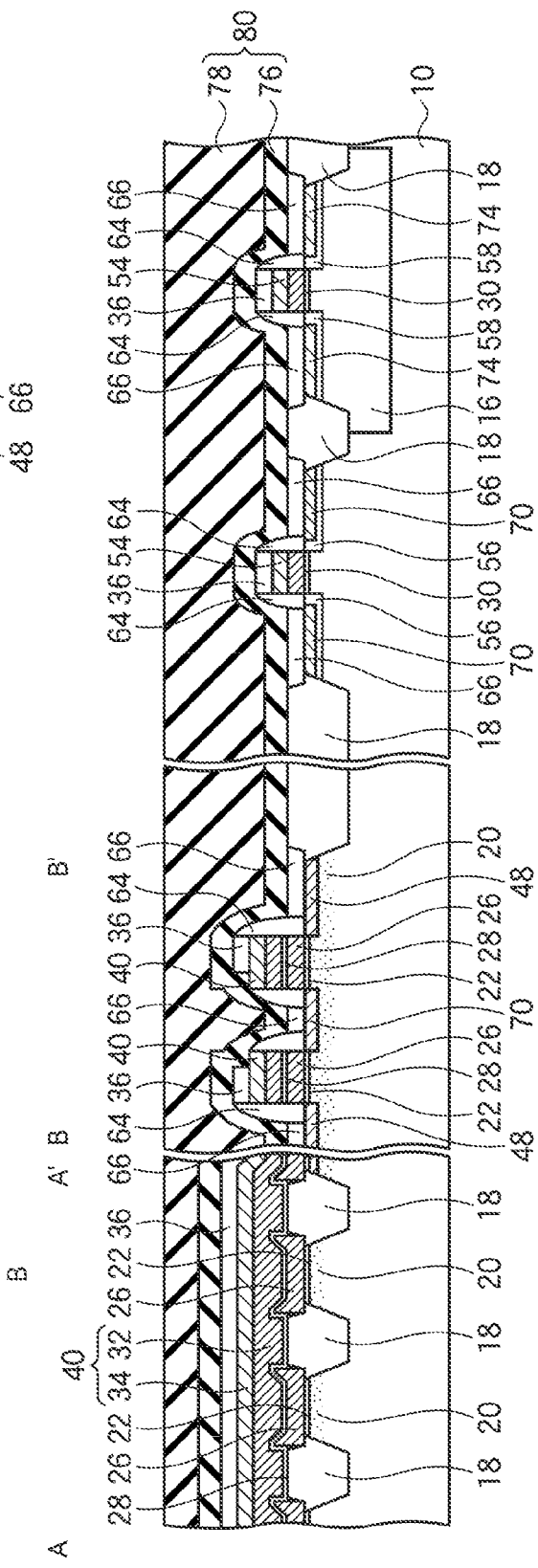

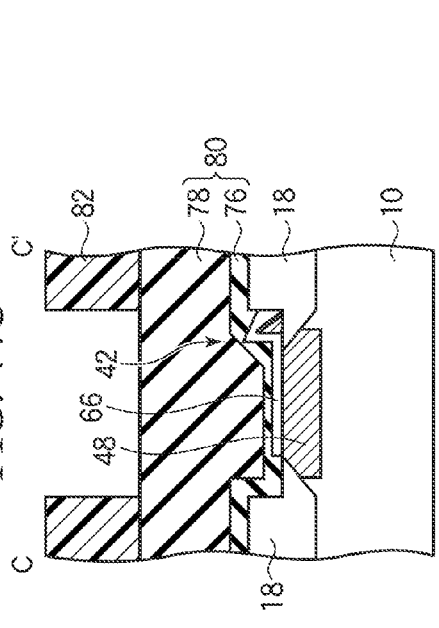
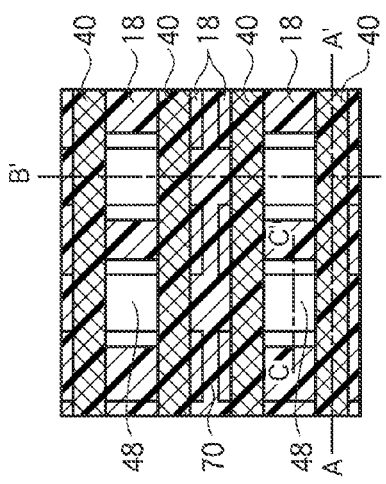
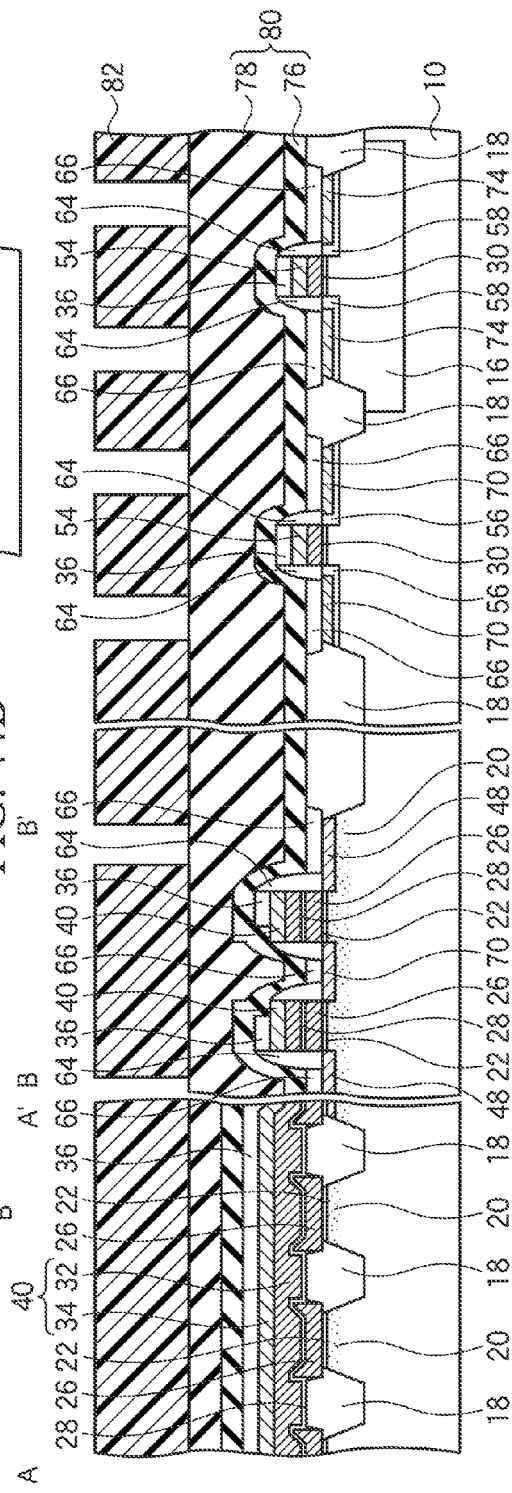

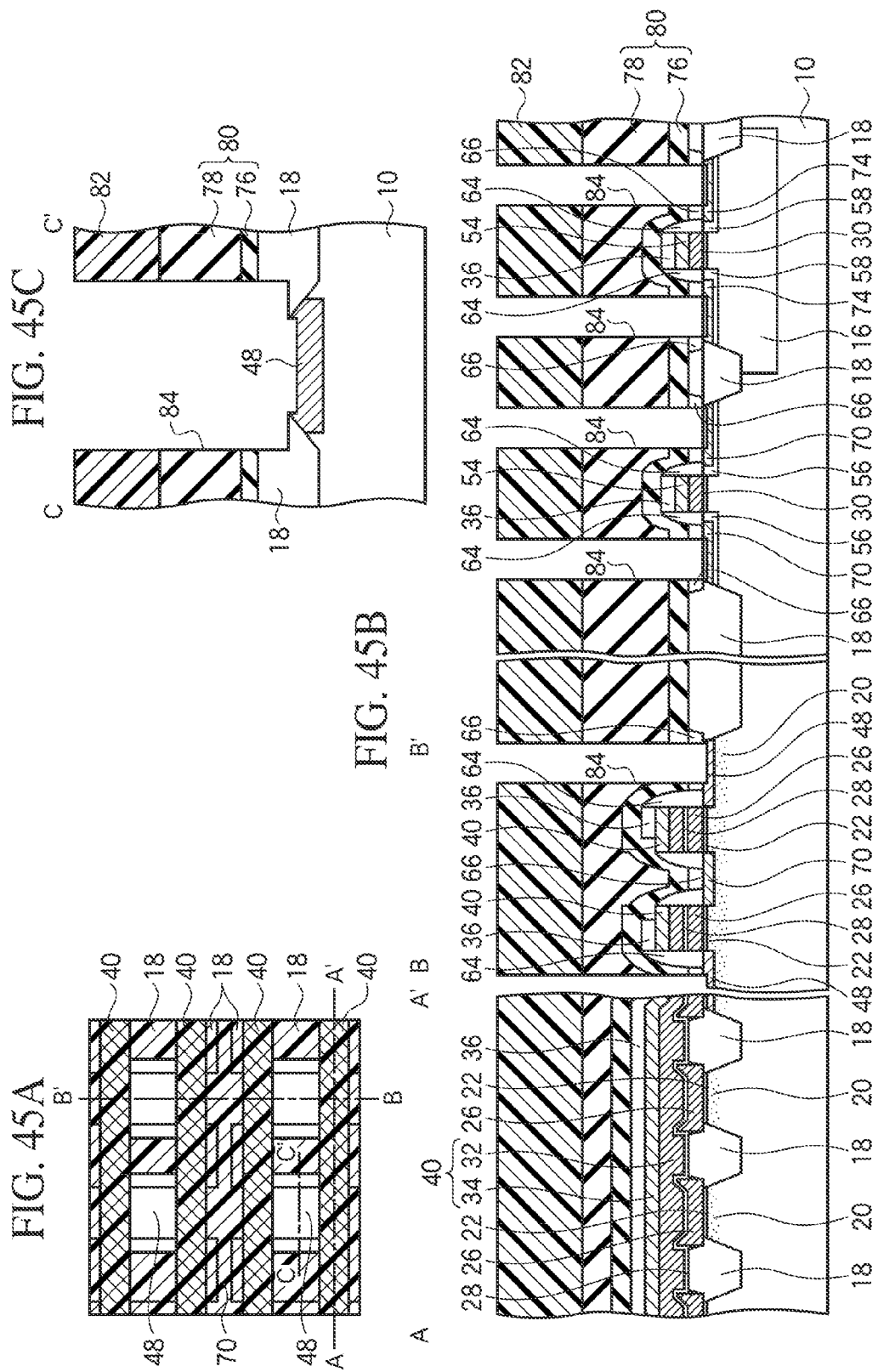

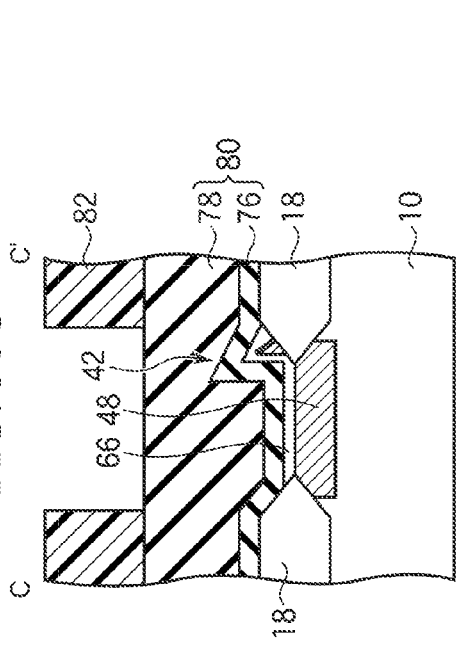
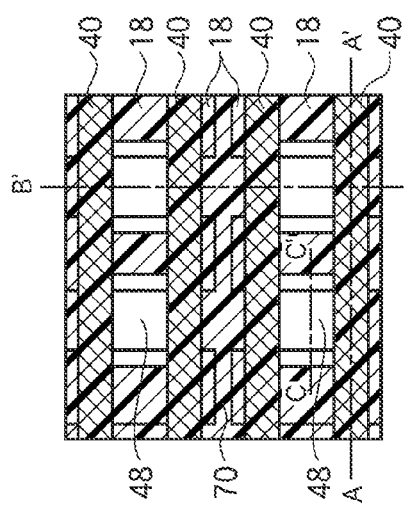
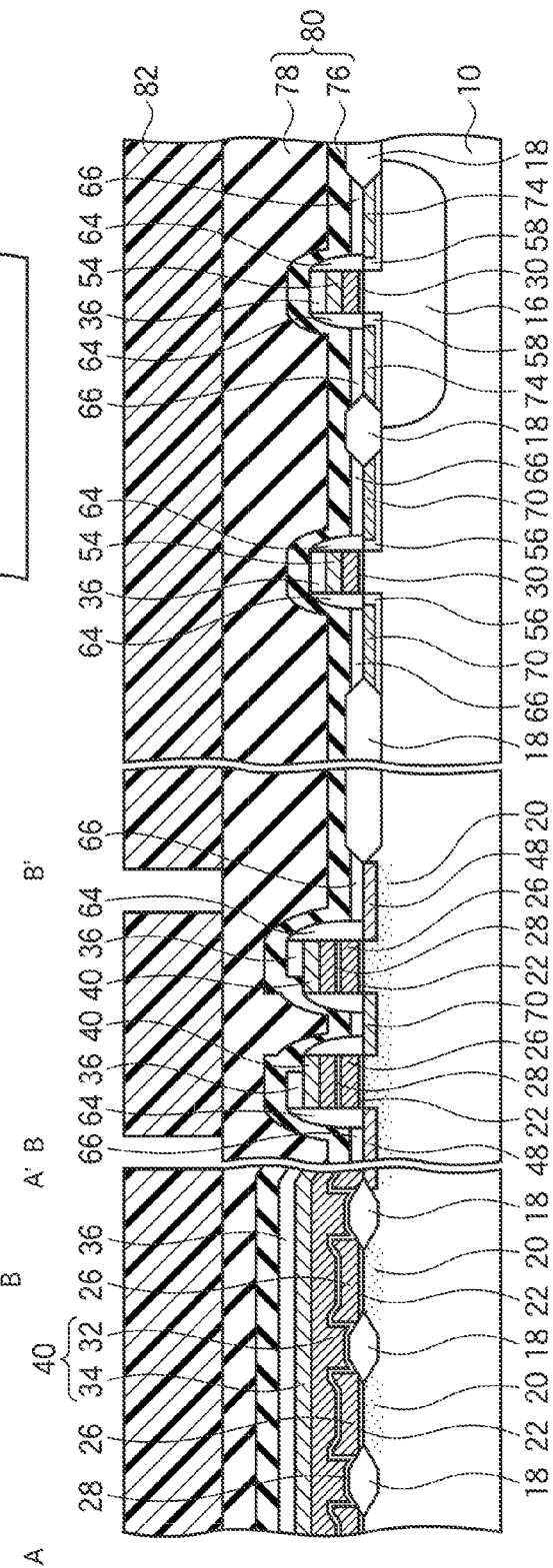

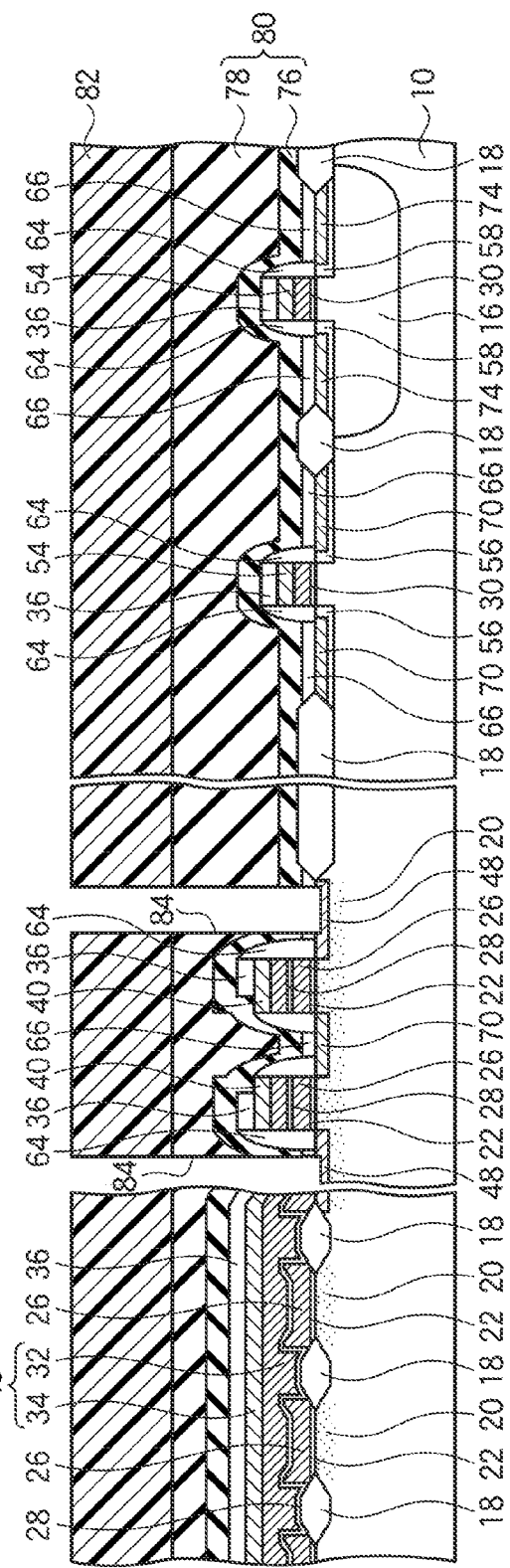

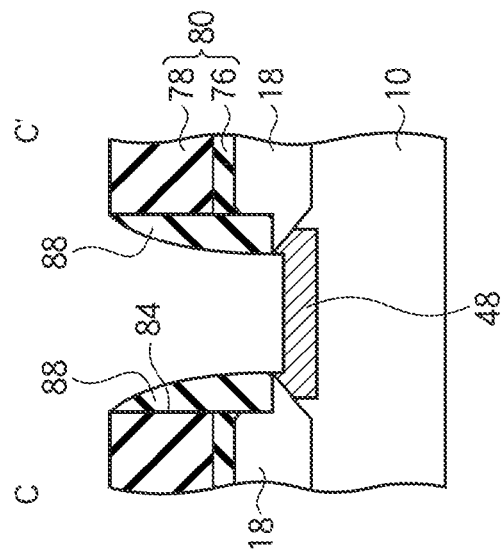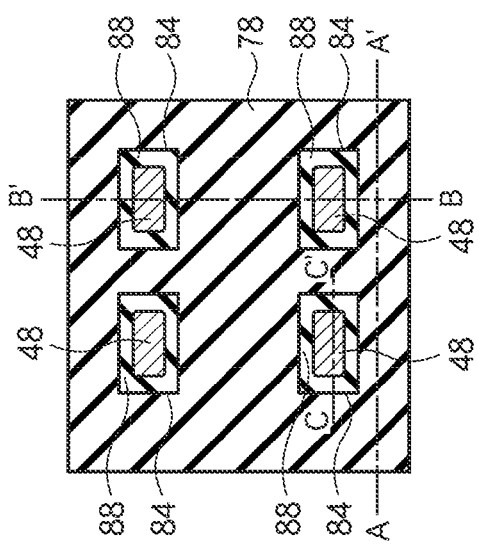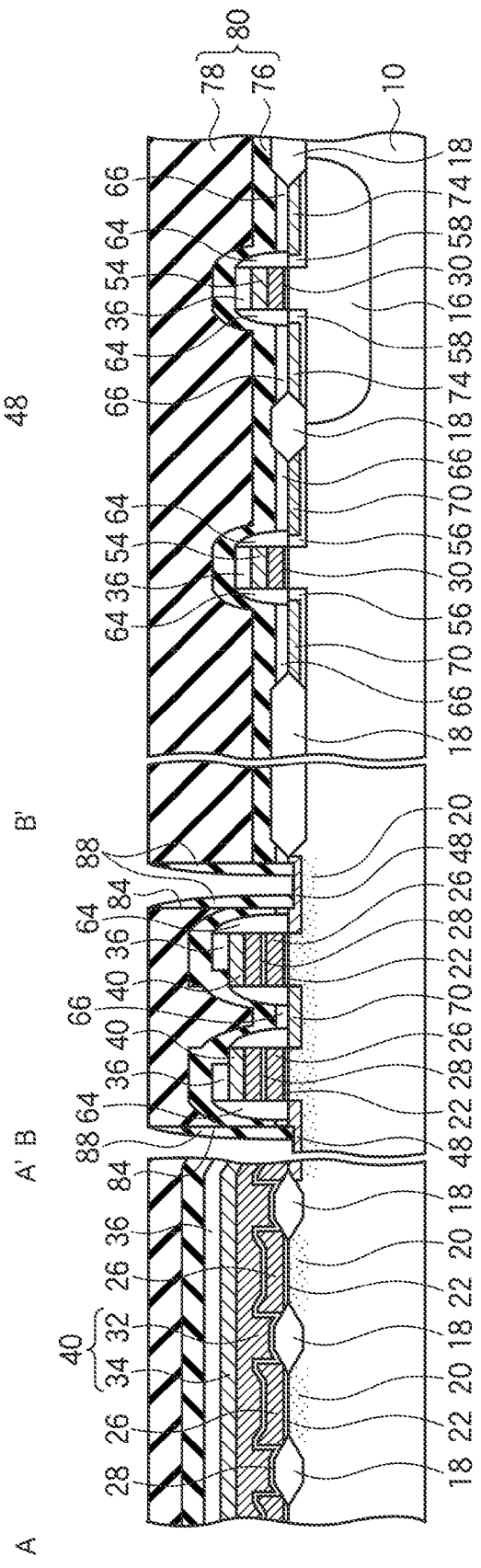

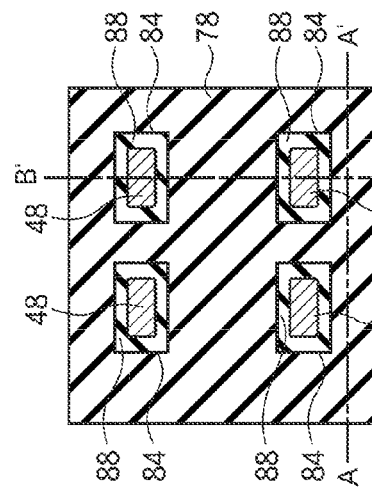
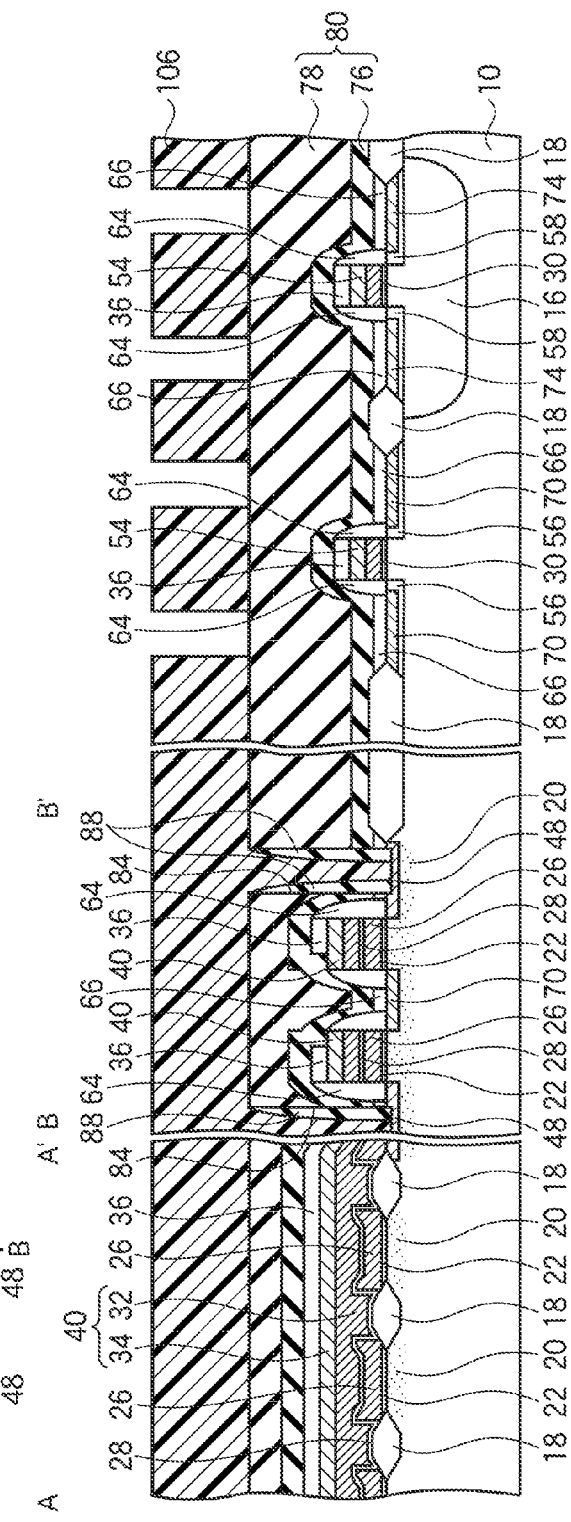
FIG. 54A
FIG. 54B

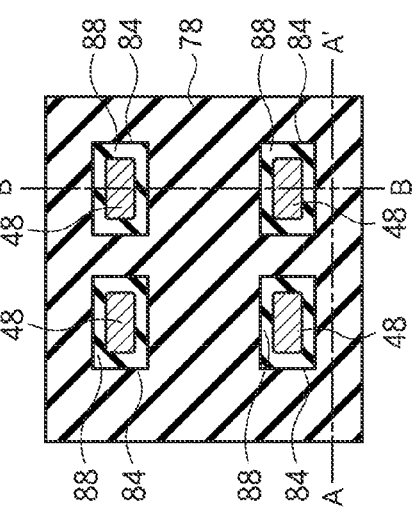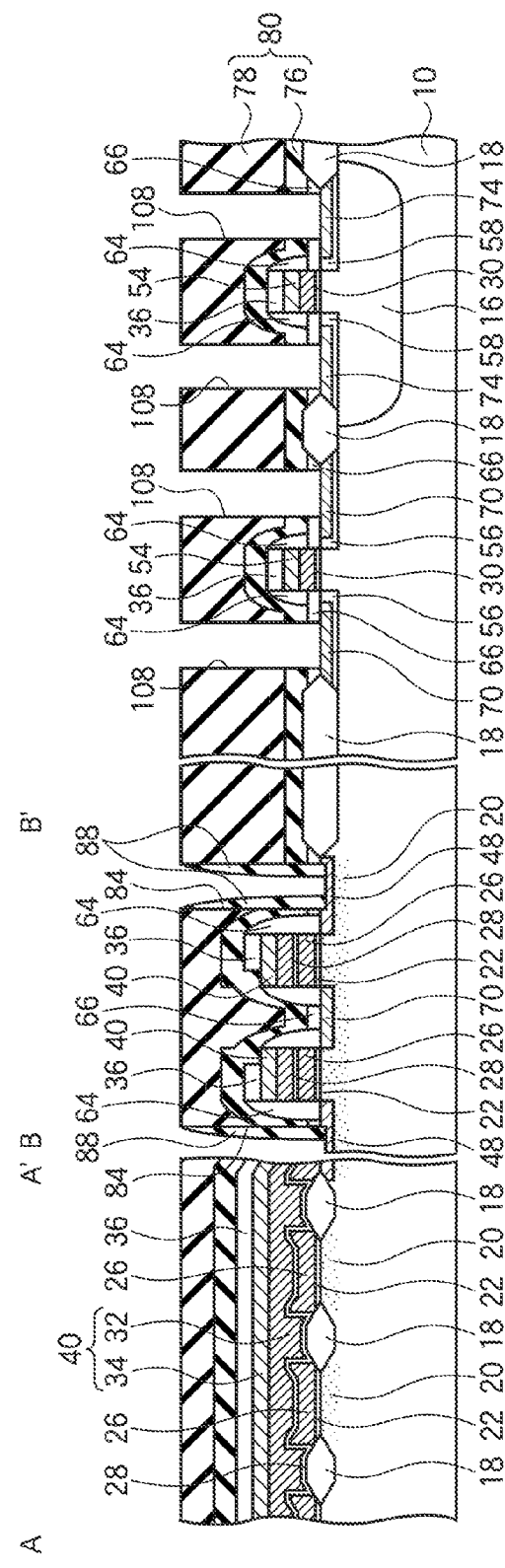

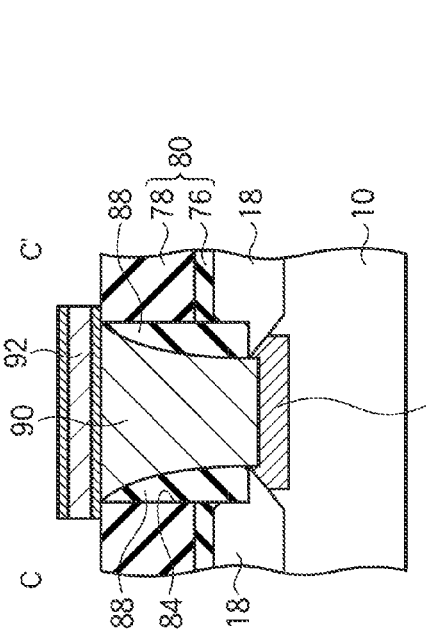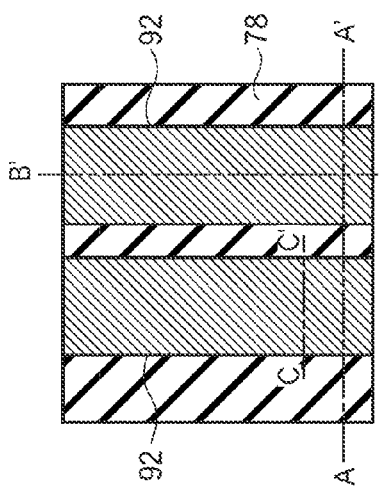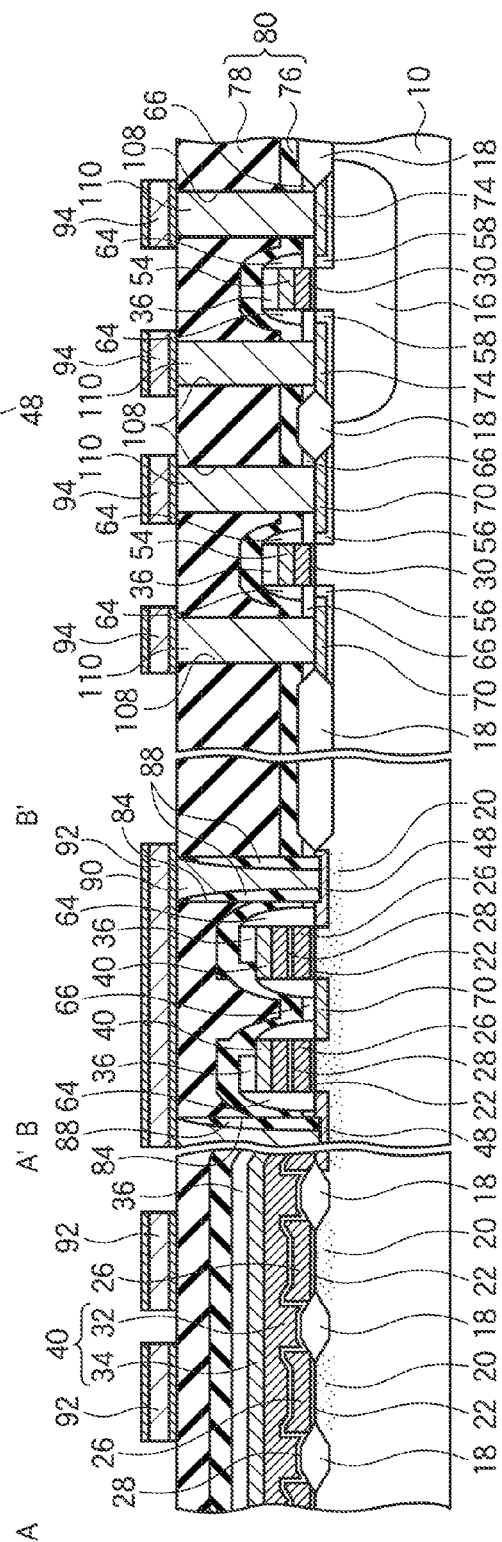

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2010-169183, filed on Jul. 28, 2010, the entire contents of which are incorporated herein by reference.

FIELD

The embodiments discussed herein are related to a semiconductor device and a method of manufacturing a semiconductor device, more specifically, a semiconductor device including a gate electrode of stacked structure of a floating gate and a control gate stacked, and a method of manufacturing the same.

BACKGROUND

As a rewritable non-volatile memory, a semiconductor memory device of the stacked gate structure, which is represented by the flash EEPROM, is known. The flash EEPROM is an important semiconductor device because of the expediency. The memory capacity increase and the development of a chip combined with a logic circuit, etc. are actively made.

The following are examples of related: Japanese Laid-open Patent Publication No. 08-288252, Japanese Laid-open Patent Publication No. 10-163456, Japanese Laid-open Patent Publication No. 2000-150678 and Japanese Laid-open Patent Publication No. 2003-168750.

However, as the devices are increasingly downsized, gaps between the memory cells are decreased. As a result, short defects between adjacent memory cells and between the memory cell and the bit line have often taken place due to fluctuations of the base structures and manufacturing conditions, etc.

SUMMARY

According to one aspect of an embodiment, there is provided a method of manufacturing a semiconductor device including forming, in a semiconductor substrate, a device isolation insulating film defining a device region, forming a first insulating film above the device region, forming, above the first insulating film, a first conductive film having a first width in a first direction, forming a second insulating film above the first conductive film, forming, above the second insulating film, a control gate extended in the first direction, etching the second insulating film and the first conductive film with the control gate as the mask to form a floating gate of the first conductive film below the control gate, forming a third insulating film above the semiconductor substrate with the control gate and the floating gate formed, forming, in the third insulating film, a first contact hole reaching the device region and having a second width in the first direction; and forming a fourth insulating film on a inside wall of the first contact hole.

According to another aspect of an embodiment, there is provided a semiconductor device including a device isolation film defining a device region formed in a semiconductor substrate, a memory cell transistor including a first insulating film formed above the device region; a floating gate formed above the first insulating film and having a first width in a first direction; a second insulating film formed above the floating gate; and a control gate formed above the floating gate with the second insulating film interposed therebetween and extended in the first direction, a third insulating film formed above the semiconductor substrate with the memory cell transistor formed, the third insulating film having a contact hole reaching down to the device region, the contact hole having a second width in the first direction, a fourth insulating film formed on a inside wall of the contact hole, a contact plug formed in the contact hole with the fourth insulating film formed and a bit line connected to the contact plug and extended in the second direction.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 5A, 6A, 7A, 8A, 9A, 10A, 11A, 12A, 13A, 14A, 15A, 16A, 17A, 18A, 19A, 20A, 21A, 22A, 23A and 24A are plan views illustrating a method of manufacturing the semiconductor device according to the first embodiment;

FIGS. 5B, 6B, 7B, 7C, 8B, 8C, 9B, 9C, 10B, 11B, 11C, 12B, 12C, 13B, 13C, 14B, 14C, 15B, 15C, 16B, 16C, 17B, 17C, 18B, 18C, 19B, 19C, 20B, 20C, 21B, 21C, 22B, 22C, 23B, 23C, 24B and 24C are sectional views illustrating the method of manufacturing the semiconductor device according to the first embodiment;

FIGS. 25A, 26A, 27A, 28A, 29A, 30A, 31A, 32A, 33A, 34A, 35A, 36A, 37A, 38A, 39A, 40A, 41A, 42A, 43A, 44A, 45A, 46A, 47A and 48A are plan views illustrating a method of manufacturing a semiconductor device according to a second embodiment;

FIGS. 25B, 26B, 27B, 28B, 29B, 30B, 31B, 31C, 32B, 32C, 33B, 33C, 34B, 35B, 35C, 36B, 36C, 37B, 37C, 38B, 38C, 39B, 39C, 40B, 40C, 41B, 41C, 42B, 42C, 43B, 43C, 44B, 44C, 45B, 45C, 46B, 46C, 47B, 47C, 48B and 48C are sectional views illustrating the method of manufacturing the semiconductor device according to the second embodiment;

FIGS. 50A, 51A, 52A, 53A, 54A, 55A and 56A are plan views illustrating a method of manufacturing a semiconductor device according to a third embodiment; and FIGS. 50B, 50C, 51B, 51C, 52B, 52C, 53B, 53C, 54B, 55B, 56B and 56C are sectional views illustrating the method of manufacturing the semiconductor device according to the third embodiment.

DESCRIPTION OF EMBODIMENTS

A First Embodiment

A semiconductor device and a method of manufacturing a semiconductor device according to a first embodiment will be described with reference to FIGS. 1 to 24C.

Figure 1:
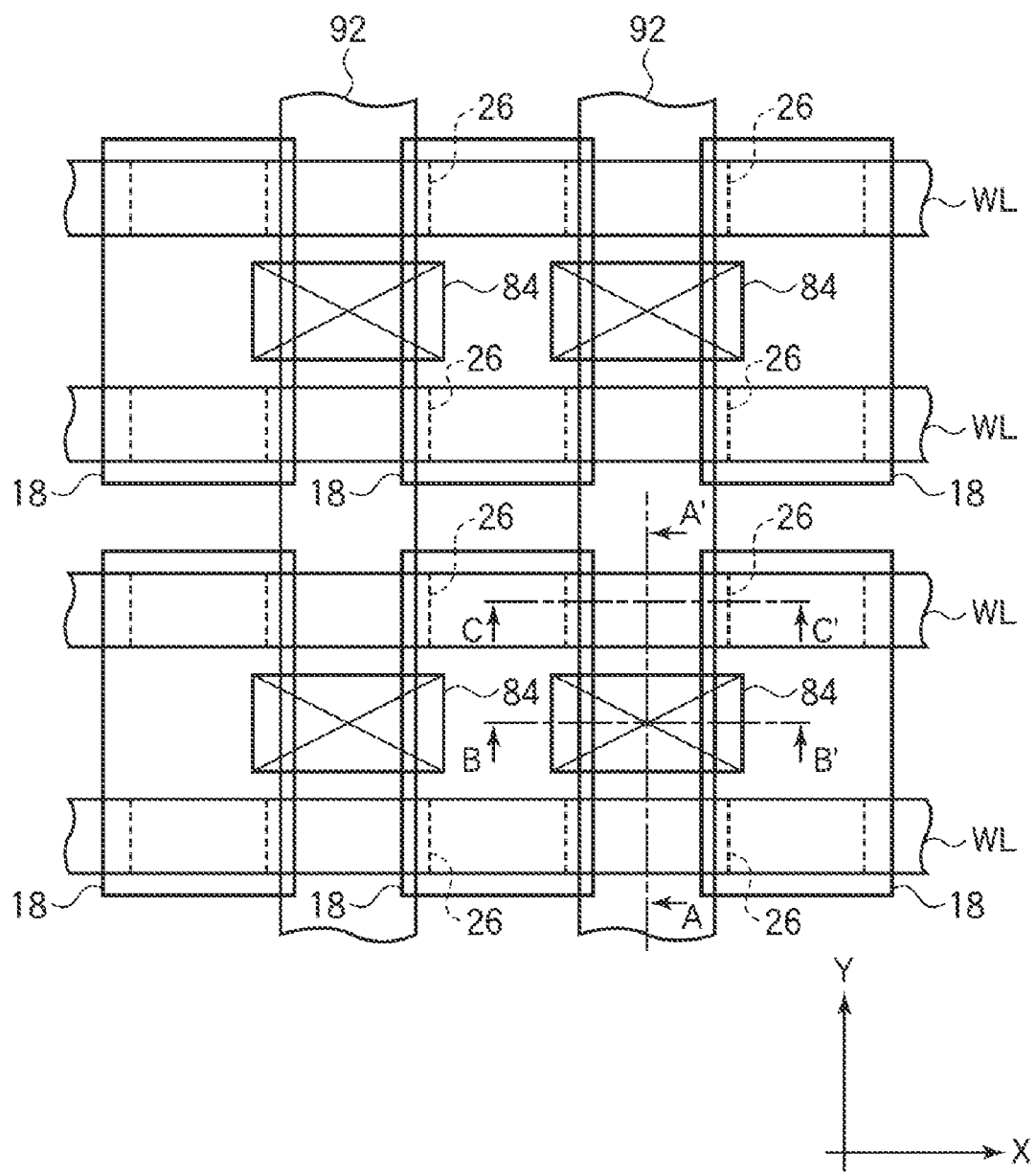
FIG. 1 is a plan view illustrating a structure of a semiconductor device according to a first embodiment.
Figure 2:
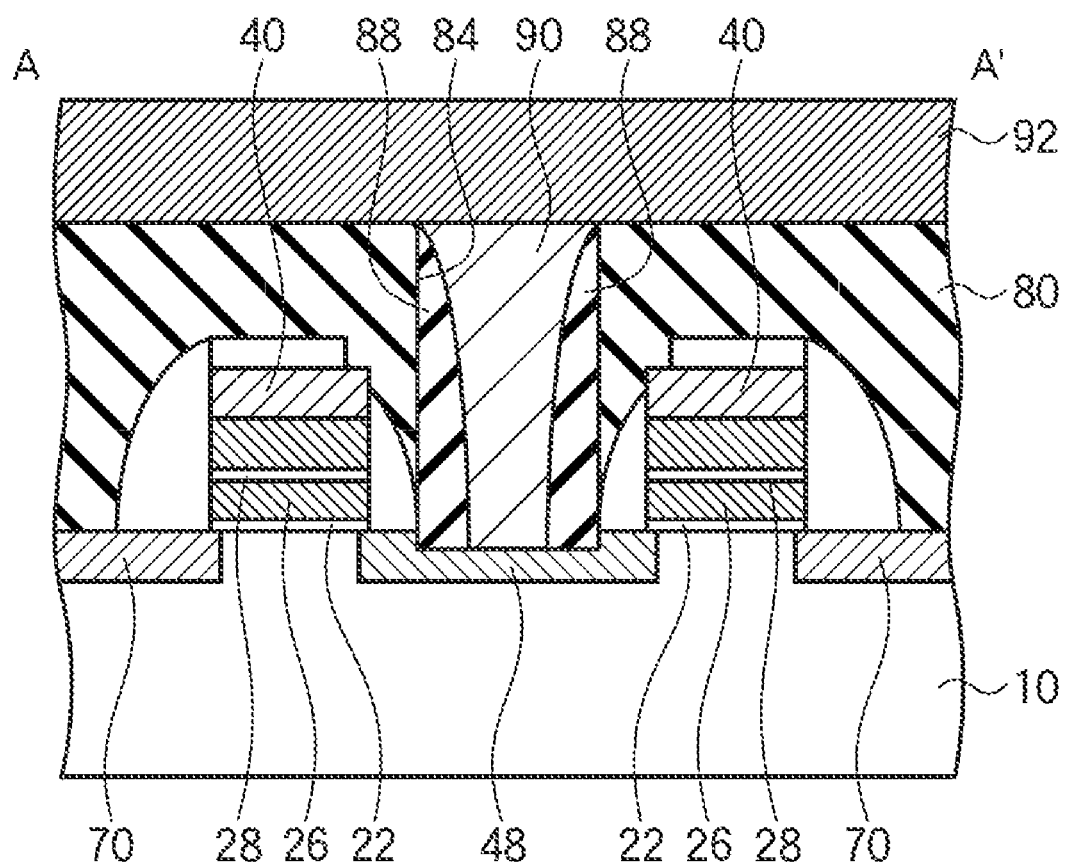
FIGS. 2, 3A and 3B are diagrammatic cross-sectional views illustrating the structure of the semiconductor device according to a first embodiment.
Figure 3A:
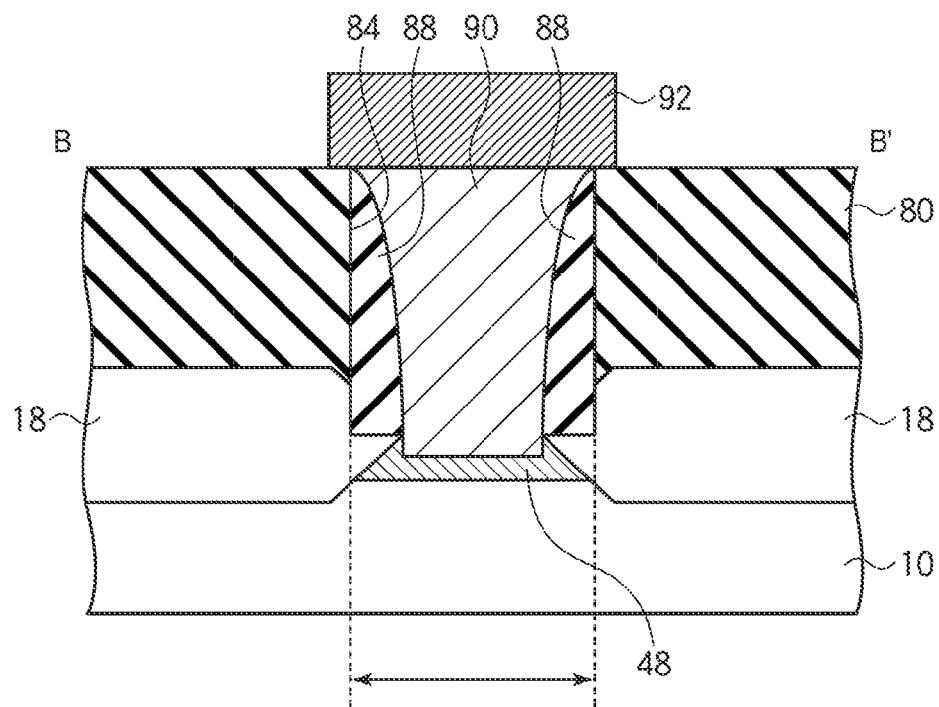
Figure 3B:
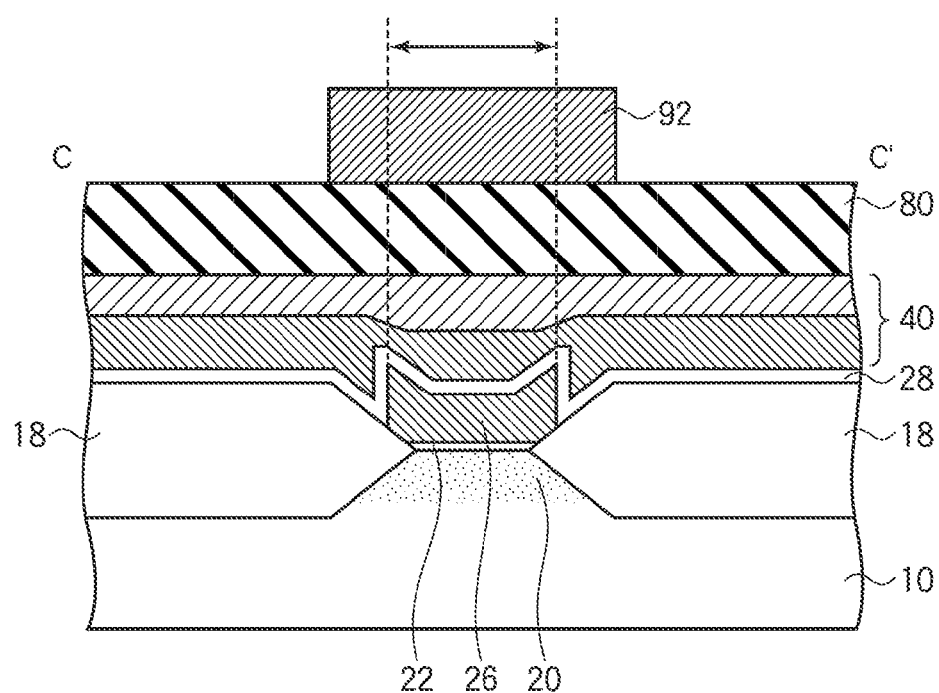
Figure 4A:
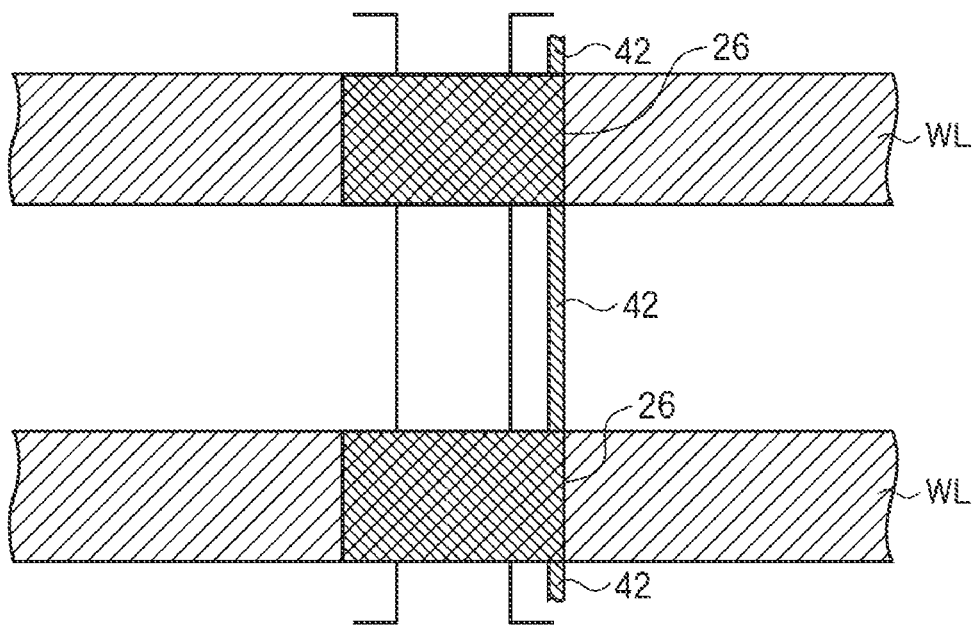
FIGS. 4A and 4B are plan views explaining the effects of the semiconductor device according to the first embodiment.
Figure 4B:
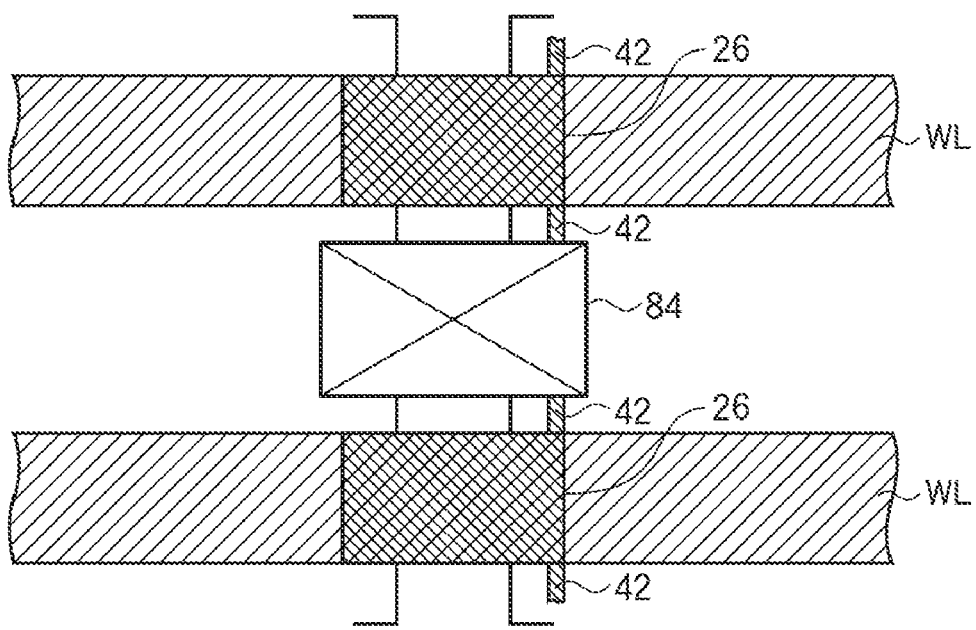

FIG. 1 is a plan view illustrating a structure of a semiconductor device according to the present embodiment. FIGS. 2, 3A and 3B are diagrammatic cross-sectional views illustrating the structure of the semiconductor device according to the present embodiment. FIGS. 4A and 4B are plan views explaining the effects of the semiconductor device according to the present embodiment. FIGS. 5 to 24 are plan views and sectional views illustrating the method of manufacturing the semiconductor device according to the present embodiment. In FIGS. 5 to 24, FIG. A is a plan view, and FIG. B and FIG. C are diagrammatic sectional views.

First, the structure of the semiconductor device according to the present embodiment will be described with reference to FIGS. 1 to 4B. FIG. 2 is the sectional view along the A-A' line in FIG. 1. FIG. 3A is the sectional view long the B-B' line in FIG. 1. FIG. 3B is the sectional view along the C-C' line in FIG. 1.

On the main surface of the silicon substrate 10, a device isolation insulating film 18 for defining a device region is formed. Over the device region, floating gate 26 is formed with a tunnel gate insulating film 22 formed therebetween. Over the floating gate 26, control gate 40 is formed with an ONO film 28 formed therebetween. In the silicon substrate 10 on both sides of the gate electrode, impurity diffused regions 70, 48 which are the source/drain regions are formed. Thus, memory cell transistor including the gate electrode of the stacked structure of the stacked floating gate 26 and control gate 40 is formed.

Over the silicon substrate with the memory cell transistor formed on, an inter-layer insulating film 80 is formed. In the inter-layer insulating film 80, a contact hole 84 down to the drain region of the memory cell transistor is formed. On the inside wall of the contact hole 84, a sidewall spacer 88 is formed. In the contact hole 84 with the sidewall spacer 88 formed on, a contact plug 90 is buried. Over the inter-layer insulating film 80 with the contact plug 90 buried in, a bit line 92 extended in the Y direction is formed.

On the silicon substrate 10, a plurality of such memory cell transistors are laid out in a matrix. The control gates 38 of the memory cell transistors adjacent to each other in the X direction are connected to each other, forming word lines WL. In the device region between the word lines WL, the source regions and the drain regions of the memory cell transistors are alternately formed. The source regions of the memory cell transistors adjacent to each other in the X direction are connected to each other by the impurity diffused regions 70 extended in the X direction. To the respective drain regions, bit lines 92 are connected via the contact plugs 90.

The contact hole 84 for burying the contact plug connecting the drain region of the memory cell transistor and the bit line 92 has a configuration whose opening width in the X direction is larger than the opening width in the Y direction (see FIG. 1). With respect to the device isolation insulating film 18, the width of the contact hole 84 in the X direction is larger than the interval between the device isolation insulating film 18 in the X direction (the width of the active region in the X direction) (see FIG. 3A). With respect to the floating gate 26, the width of the contact hole 84 in the X direction is larger than the width of the floating gate 26 in the X direction (see FIG. 3B).

The contact hole 84 have such configuration, so that an etch residue 42, which are often generated when the floating gate 26 is divided in the Y direction, are not influential.

In the step of etching to divide the floating gates 26 in the Y direction, a stringer-shaped etch residue 42 extended in the Y direction is often generated due to a configuration of the floating gates 26 overlaid on the device isolation insulating film 18 (see FIG. 4A). When such etch residue 42 is generated, the floating gates 26 adjacent to each other in the Y direction are connected to each other by the etch residue 42, which cause operational faults. The cause for generating the etch residue 42 will be described later in the manufacturing method.

In the semiconductor device according to the present embodiment, in order to prevent the influence of the etch residue 42, the width of the contact hole 84 in the X direction is larger than the width of the floating gate 26 in the X direction. This makes it possible to remove the etch residue 42 at the parts exposed in the contact hole 84 when the contact hole 84 for exposing the drain region is formed. By forming the sidewall spacer 88 in the contact hole 84, the etch residue 42 exposed on the side wall of the contact hole 84 in the Y direction can be covered by the sidewall spacer 88. Thus, even when etch residue 42 is generated, the floating gates 26 adjacent to each other in the Y direction can be isolated, and the operational faults can be prevented (see FIG. 4B).

The stringer-shaped etch residue 42 is often generated in the source regions, but the etch residue 42 in the source regions is removed together with the device isolation insulating film 18 in the step of removing the device isolation insulating film 18 for connecting the source regions to each other in the X direction and cause no problem.

Next, the method of manufacturing the semiconductor device according to the present embodiment will be described with reference to FIGS. 5A to 24C. In each of the drawings, FIG. A is a plan view, FIG. B and FIG. C are diagrammatic sectional views. In FIG. B, the region on the left side of the drawing represents the memory cell region, and the region on the right side of the drawing represents the peripheral circuit region. The left side of the memory cell region is the sectional view in the X direction (along the word line), and the right side of the memory cell region is the sectional view in the Y direction (along the bit line). The left side of the peripheral circuit region is the peripheral n-channel transistor region, and the right side of the peripheral circuit region is the peripheral p-channel transistor region.

First, on the silicon substrate 10, a silicon oxide film 12 of, e.g., an about 3 nm-thickness is formed by, e.g., thermal oxidation method.

Then, on the silicon oxide film 12, a silicon nitride film 14 of, e.g., an about 120 nm-thickness is formed by, e.g., CVD method.

Next, the silicon nitride film 14 is patterned by photolithography and dry etching to leave the silicon nitride film 14 selectively in the region to be the device regions. In the memory cell region, the silicon nitride film 14 is patterned into stripes extended in the Y direction with an etched width of, e.g., a 0.55 μm-width and a left width of, e.g., a 0.55 μm-width (see FIG. 5A).

Next, by photolithography, a photoresist film (not illustrated) exposing the p-channel transistor region of the peripheral circuit is formed. The peripheral circuit includes drive circuit for the memory cell transistors, a logic circuit, etc.

Next, n-type impurity ions are implanted with the photoresist film as the mask to form an n-well 16 in the p-channel transistor region of the peripheral circuit (FIG. 5B). Strictly, the n-well 16 is formed by activating the n-type impurity in a later thermal processing, but for the convenience of the description, the impurity diffused region immediately after the ion implantation is called the n-well 16 here.

Then, the silicon substrate 10 is thermally oxidized by thermal processing in an oxidizing atmosphere to form the device isolation insulating film (LOCOS (LOCal Oxidation of Silicon)) 18 of, e.g., a 300 nm-thickness. At this time, the device isolation insulating film 18 is grown only in the device isolation region because the device regions covered by the silicon nitride film 14 are not oxidized. However, the parts covered by the silicon nitride film 14 are a little oxidized at the outer peripheral parts, and extensions of the device isolation insulating film 18 of a little less than 0.1 μm on one side take place into bird's-beaks. At the parts where the extensions have taken place, steps of the device isolation insulating film 18 are formed. In the series of the thermal processing for forming the device isolation insulating film 18, the n-type impurity forming the n-well 16 is electrically activated while being diffused deep into the substrate (see FIG. 6B).

Then, boil is made with phosphoric acid or others to selectively remove the silicon nitride film 14.

Next, thermal processing is made in an oxidizing atmosphere to form a protection oxide film (not illustrated) of a silicon oxide film of, e.g., an about 15 nm-thickness in the device regions. The protection oxide film is for protecting the surface of the silicon substrate 10 when the impurity diffused regions 20 are formed in a later step.

Next, by photolithography, a photoresist film (not illustrated) covering the peripheral circuit region and exposing the memory cell region is formed.

Next, with this photoresist film as the mask, p-type impurity ions are implanted to form the impurity diffused regions 20 in the memory cell region. The impurity diffused regions 20 are for adjusting the impurity concentration of the surface of the memory cell region, e.g., controlling the threshold voltage of the memory cell transistors.

Then, the protection oxide film is removed by, e.g., wet etching using hydrofluoric acid aqueous solution.

Next, thermal processing is made in an oxidizing atmosphere to thermally oxidize the silicon substrate 10 to form the tunnel gate insulating film 22 of a silicon oxide film of, e.g., an about 10 nm-thickness in the device regions.

Figure 6A:
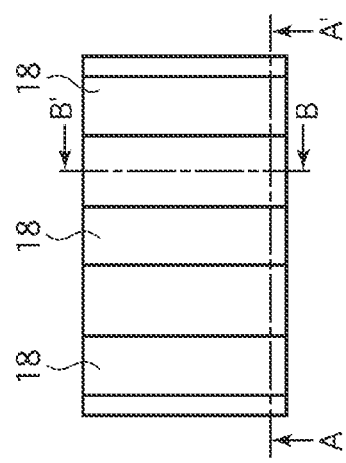
Figure 6B:
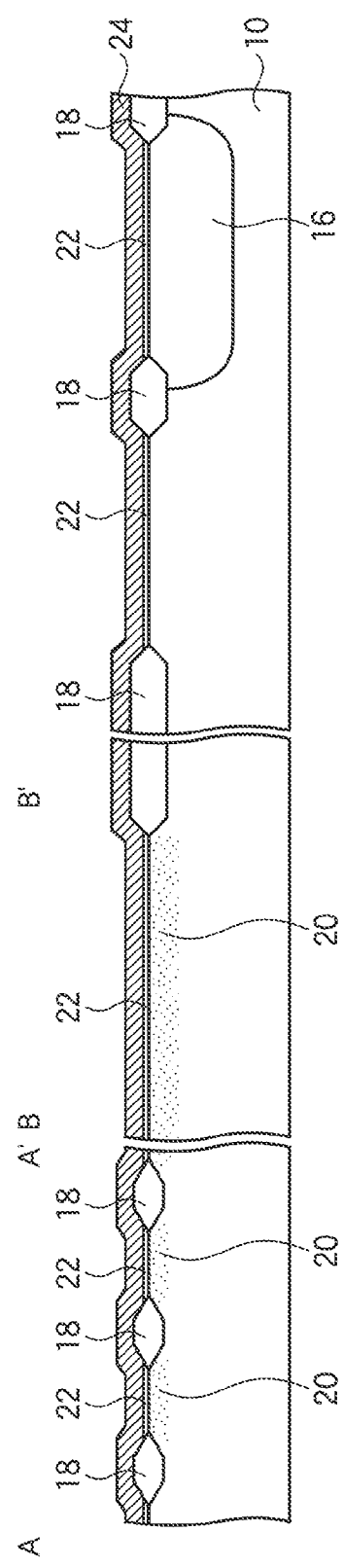

Next, over the entire surface, an amorphous silicon film 24 of, e.g., 90 nm-thickness and doped with phosphorus in, e.g., a $5 \times 10^{19}$ cm$^{-3}$ concentration is grown by, e.g., CVD method (FIGS. 6A and 6B). The amorphous silicon film 24 is to be the floating gates of the memory cell transistors.

Figure 7A:
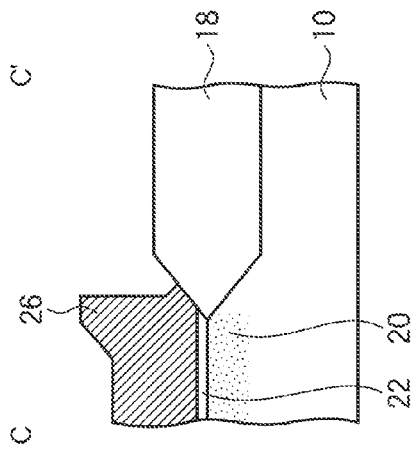
Figure 7C:
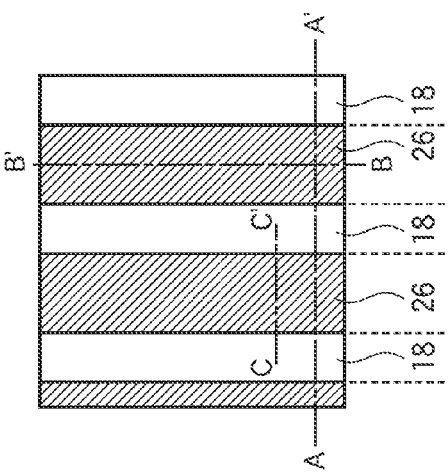
Figure 7B:
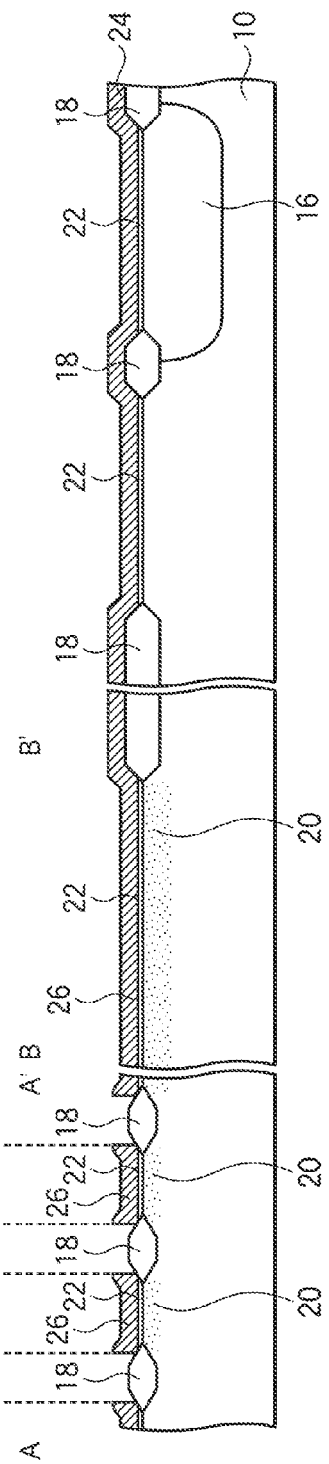

Next, by photolithography and dry etching, the amorphous silicon film 24 is patterned into stripes extended in the Y direction to form the floating gates 26 divided in the X direction (FIGS. 7A and 7B). This patterning is for dividing the floating gates 26 for the respective cells in the X direction before the control gates 40 are formed.

At this time, when the edges of the floating gates 26 are positioned on the steps of the device isolation insulating film 18 due to positioning error, processing fluctuation, etc., side walls of the floating gates 26 are often a little wide-based depending on configurations of the steps (see FIG. 7C). In later steps, these configurations are covered by the ONO film 28, and finally, when the control gates and the floating gates are etched in the Y direction, causes the etch residue, and causes the fault of the stringer-shaped etch residue.

Figure 8A:
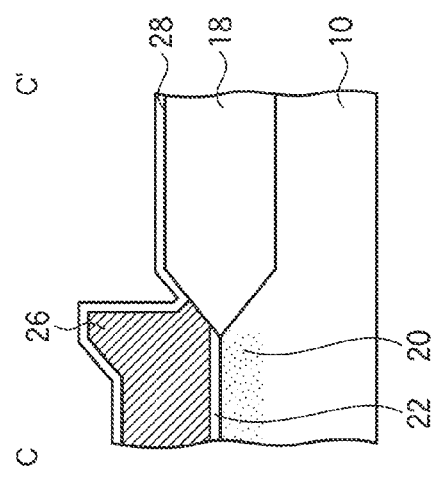
Figure 8C:
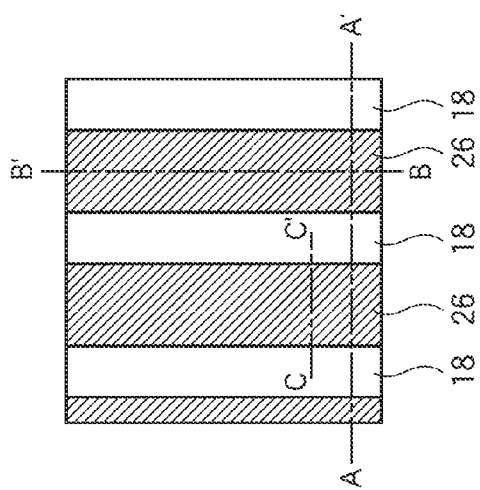
Figure 8B:
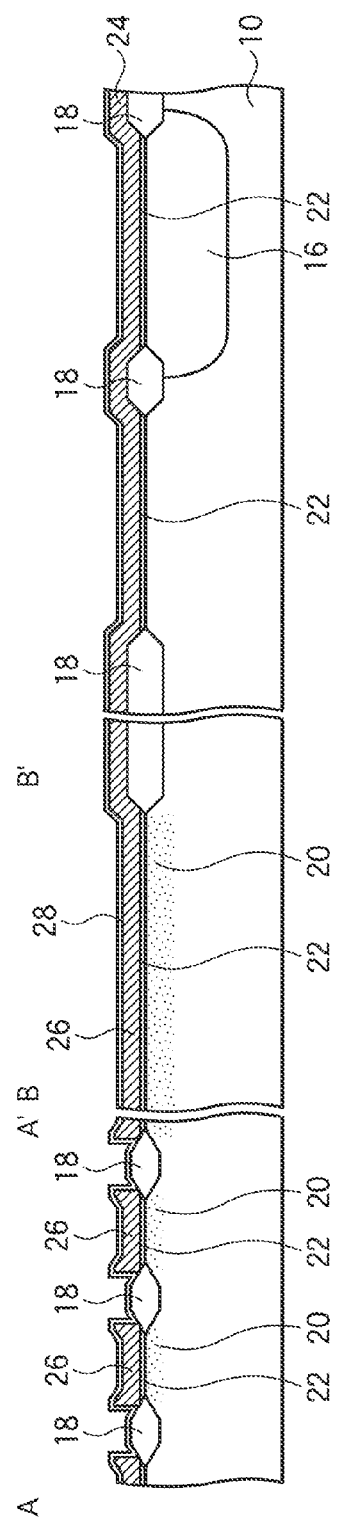

Then, over the entire surface, sequentially, an 8 nm-thickness silicon oxide film is formed by, e.g., CVD method, a 10 nm-thickness silicon nitride film is formed by, e.g., CVD method, and a 3 nm-thickness silicon oxide film is formed by, e.g., thermal oxidation method to form the ONO film 28 of the stacked structure of the silicon oxide film/the silicon nitride film/the silicon oxide film (FIGS. 8A, 8B and 8C).

Next, a photoresist film (not illustrated) covering the memory cell region and exposing the peripheral circuit region is formed.

Next, with this photoresist film as the mask, the ONO film 28, the amorphous silicon film 26 and the tunnel gate insulating film 22 in the peripheral circuit region are selectively removed by etching (FIGS. 9A, 9B and 9C).

Then, in the peripheral circuit region, the gate insulating film 30 of the peripheral circuit transistors is formed. For example, as the gate insulating film of the peripheral circuit unit of the flash memory, which requires high-voltage operation, the silicon oxide film of a 17 nm-thickness is formed, and as the gate insulating film of the logic circuit unit, the silicon oxide film of a 7 nm-thickness is formed. The gate insulating films of different film thicknesses can be formed by making once or repeating plural times the process of forming a thermally oxidized film, removing the thermally oxidized film in partial regions and again making thermal oxidation.

Next, over the entire surface, an amorphous silicon film 32 of, e.g., a 120 nm-thickness and doped with phosphorus in a $3 \times 10^{20}$ cm$^{-3}$ concentration is grown by, e.g., CVD method.

Then, on the amorphous silicon film 32, a tungsten silicide film 34 of, e.g., a 150 nm-thickness is formed by, e.g., CVD method.

The amorphous silicon film 32 and the tungsten silicide film 34 are to be the control gates 40 of the memory cell transistors and the gate electrodes 54 of the peripheral circuit transistors.

Next, on the tungsten silicide film 34, a silicon oxide film 36 of, e.g., a 100 nm-thickness is formed by, e.g., CVD method (FIGS. 10A and 10B). The silicon oxide film 36 is for covering the tungsten silicide film 34.

Next, by photolithography, a photoresist film 38 covering the peripheral circuit region and having a pattern of the control gates 40 in the memory cell region is formed on the silicon oxide film 36.

Then, with the photoresist film 38 as the mask, the silicon oxide film 36, the tungsten silicide film 34 and the amorphous silicon film 32 in the memory cell region are etched, whereby in the memory cell region, the control gates 40 of the tungsten polycide structure having the upper surfaces covered by the silicon oxide film 36 are formed. The gate length of the control gates 40 is set at, e.g., 0.45 μm.

Next, with the photoresist film 38 as the mask, the ONO film 28 and the floating gates 26 are further etched to divide the floating gates 26 in the Y direction (FIGS. 11A and 11B).

At this time, the wide-based side walls of the floating gates 26 formed when the floating gates 26 were divided in the X direction are behind the ONO film 28 which have not been etched off in the etching of the ONO film 28 cannot be often sufficiently etched. In such case, the stringer-shaped etch residue 42 extended in the Y direction is generated at the edge of the device isolation insulating film 18 (FIG. 11C and FIG. 4A).

It is difficult that the etch residue 42, which come behind the ONO film 28, are remedied by the etching for forming the gate electrodes of the memory cell transistors. The etch residue 42 is a factor for the data retention defect of the flash memory, and it is preferable to remove the etch residue 42 so as to provide a non-volatile semiconductor memory of high reliability with high yields and at low costs.

Next, the photoresist film 38 is removed by, e.g., asking method.

Next, annealing is made in an oxidation atmosphere at, e.g., 900° C. to form a silicon oxide film 44 of, e.g., a 7.5 nm-thickness on the device regions of the memory cell region and the side walls of the gate electrodes 40, 26.

Next, by photolithography, a photoresist film 46 covering the peripheral circuit region and exposing the memory cell region is formed.

Then, with the photoresist film 46 and the gate electrodes 40, 26 as the mask, a high concentration of n-type impurity ions are implanted to form the impurity diffused regions 48 to be the source/drain regions in the silicon substrate 10 on both sides of the gate electrodes 40, 26 (FIGS. 12A, 12B and 12C).

Next, annealing is made in an oxidation atmosphere at, e.g., 900° C. to form a silicon oxide film 50 of, e.g., a 5 nm-thickness on the device regions of the memory cell region and on the side walls of the gate electrodes 40, 26.

Then, by photolithography, a photoresist film 52 covering the memory cell region and having a pattern of the gate electrodes 54 in the peripheral circuit region is formed.

Figure 13A:
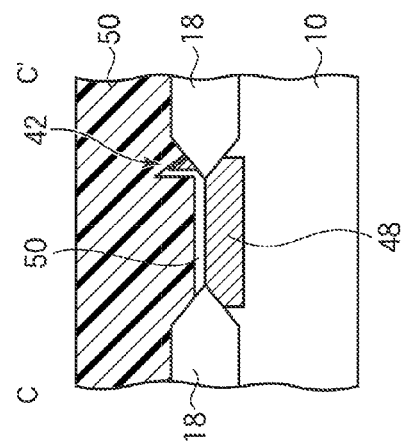
Figure 13C:
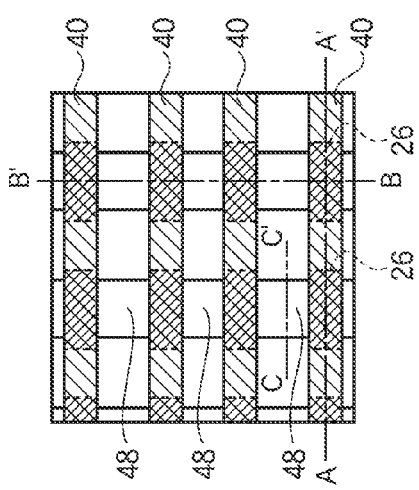
Figure 13B:
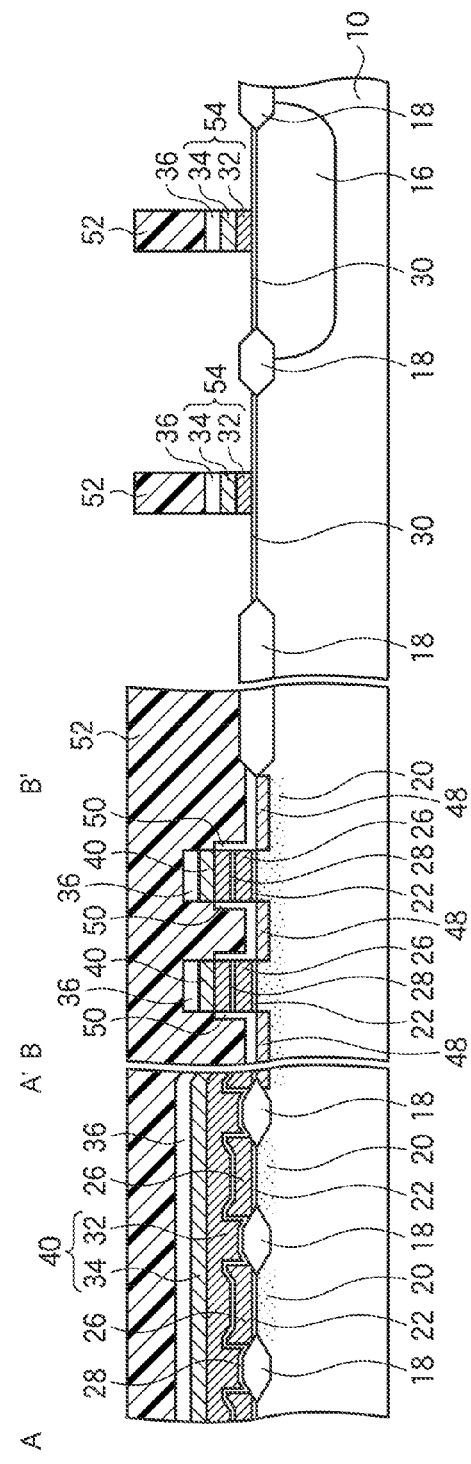

Then, with the photoresist film 52 as the mask, the silicon oxide film 36, the tungsten silicide film 34 and the amorphous silicon film 32 in the peripheral circuit region is etched to form the gate electrodes 54 of tungsten polycide structure having the upper surfaces covered by the silicon oxide film 36 in the peripheral circuit region (FIGS. 13A, 13B and 13C). The gate length of the gate electrodes 54 of the peripheral circuit transistors is set at, e.g., 0.35 µm.

Next, the photoresist film 52 is removed by, e.g., asking method.

Figure 14A:
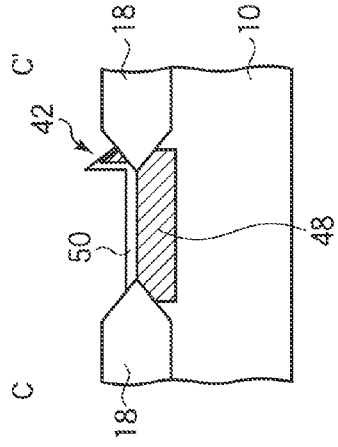
Figure 14C:
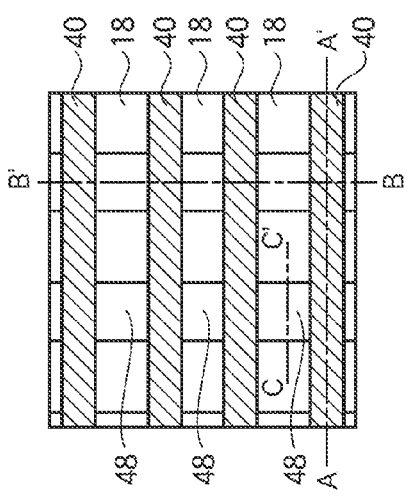
Figure 14B:
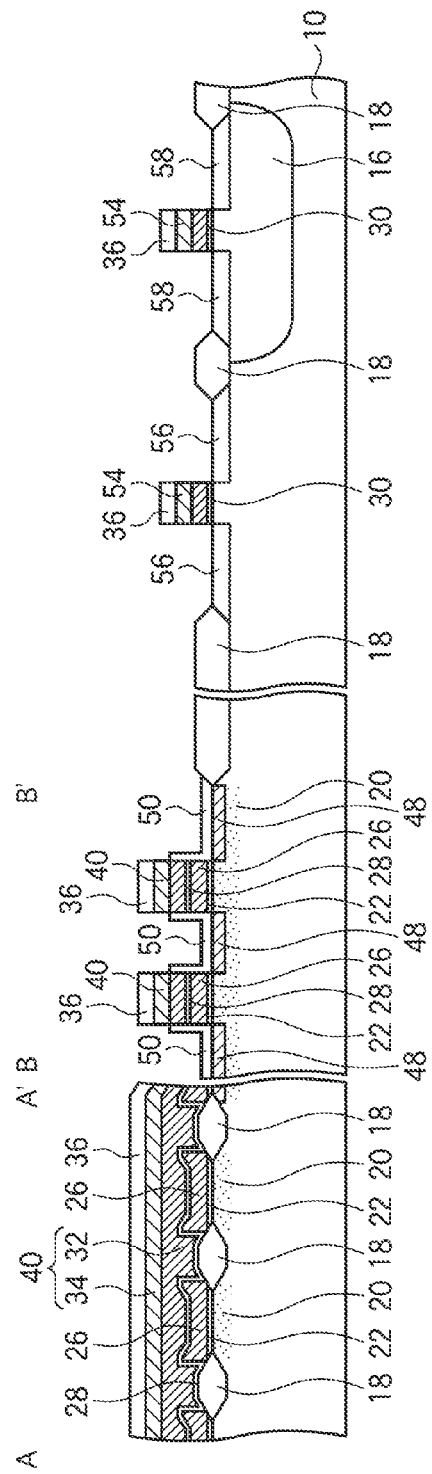

Then, by photolithography and ion implantation, the impurity diffused regions 56, 58 are formed in the silicon substrate 10 respectively on both sides of the gate electrodes 54 of the peripheral circuit region. The impurity diffused regions 56, 58 are diffused regions to be the lightly doped diffused layers or the extension diffused layers of the source/drain regions of the peripheral circuit transistors (FIGS. 14A, 14B and 14C).

For example, the lightly doped diffused layers (impurity diffused regions 56) of the n-channel transistor of the logic circuit can be formed by implanting, for example, phosphorus ions ($P^+$) under the conditions of a 20 keV acceleration energy and a $4.0 \times 10^{13}$ cm$^{-2}$. The lightly doped diffused layers (impurity diffused regions 58) of the p-channel transistor of the logic circuit can be formed by implanting, for example, boron difluoride ions ($BF_2^+$) under the conditions of a 20 keV acceleration energy and an $8.0 \times 10^{12}$ cm$^{-2}$ dose.

Next, a silicon oxide film 60 of, e.g., a 100 nm-thickness is formed over the entire surface by, e.g., CVD method.

Next, by photolithography, a photoresist film 62 covering the peripheral circuit region and alternately exposing the regions between the word lines in the memory cell region, i.e., the regions to be the source lines interconnecting the source regions s of the memory cell transistors is formed.

Figure 15A:
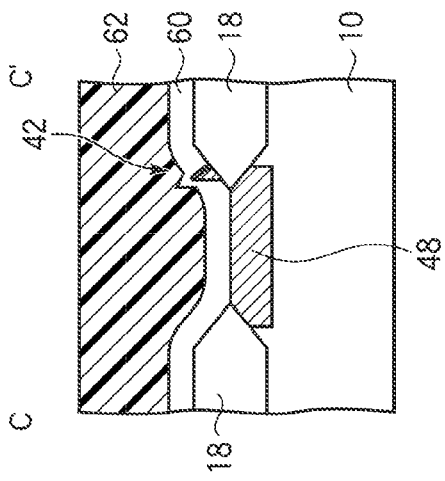
Figure 15C:
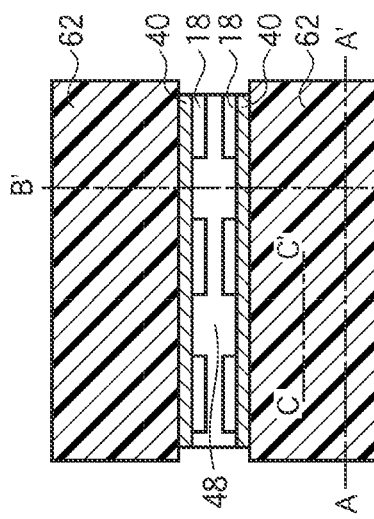
Figure 15B:
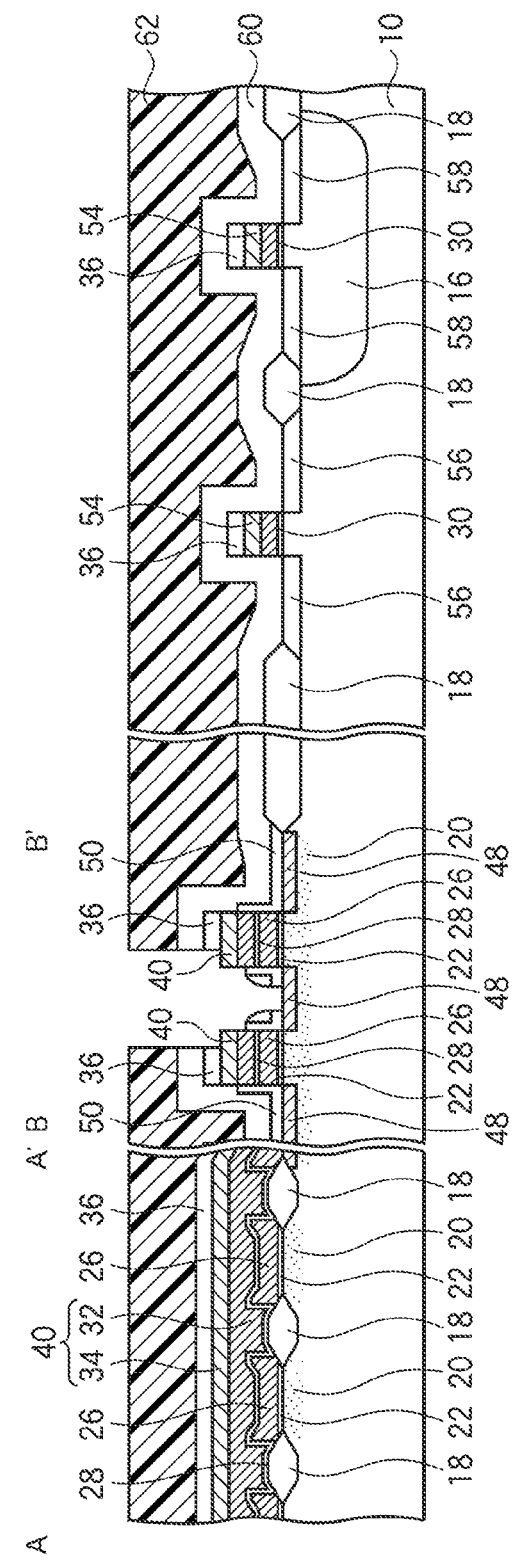
Figure 18A:
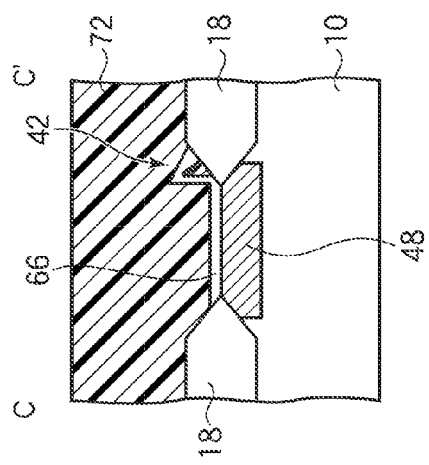
Figure 18C:
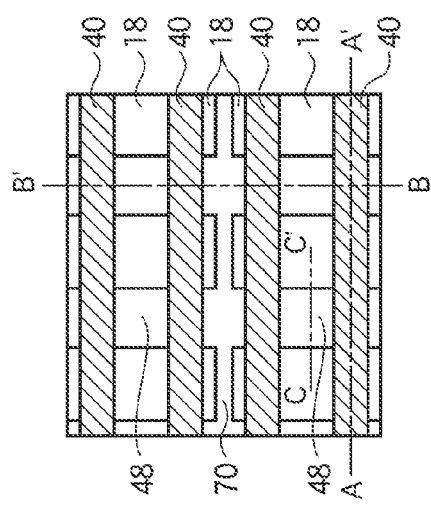
Figure 18B:
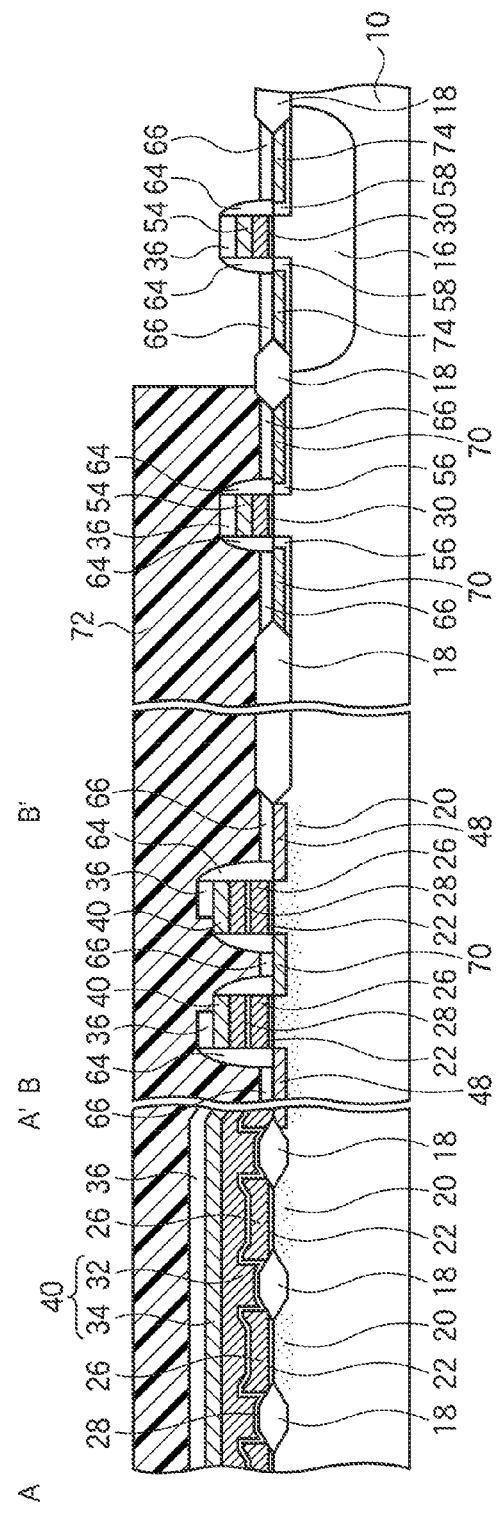

Next, with the photoresist film 62 and the control gates 40, which are the word lines, as the mask the silicon oxide films 60, 50 and the device isolation insulating film 18 in the source line forming regions are etched (FIGS. 15A, 15B and 15C).

Next, the photoresist film 62 is removed by, e.g., ashing method.

Next, a silicon oxide film of, e.g., a 70 nm-thickness is formed over the entire surface by, e.g., CVD method.

Next, this silicon oxide film and the silicon oxide films 50, 60 are etched back to form the sidewall spaces 64 on the side walls of the gate electrodes 40, 54.

Next, thermal oxidation is made in a dry oxidation atmosphere of, e.g., 800° C. for 50 minutes to form the protection oxide film 66 of silicon oxide film on the device regions (FIGS. 16A, 16B and 16C).

Next, by photolithography, a photoresist film 68 exposing the source line forming regions of the memory cell region and the n-channel transistor forming region of the peripheral circuit region and covering the rest region is formed.

Next, with the photoresist film 68 and the gate electrodes 40, 54 as the mask, n-type impurity ions are implanted to form the impurity diffused regions 70 in the source line forming regions of the memory cell region and in the silicon substrate 10 on both sides of the gate electrodes 54 (FIGS. 17A, 17B and 17C). For example, arsenic ions (As$^+$) are implanted under the conditions of a 60 keV acceleration energy and a $3.0 \times 10^{15}$ cm$^{-2}$ to form the impurity diffused regions 70.

Then, the photoresist film 68 is removed by, e.g., ashing method.

Then, by photolithography, a photoresist film 72 exposing the p-channel transistor forming region and covering the reset region is formed.

Next, with the photoresist film 72 and the gate electrodes 54 as the mask, p-type impurity ions are implanted to form the impurity diffused regions 74 in the silicon substrate 10 on both sides of the gate electrodes 54.

Next, the photoresist film 72 is removed by, e.g., asking method.

Next, a silicon oxide film 76 of, e.g., a 100 nm-thickness, and a silicon oxide film 78 containing phosphorus and boron of, e.g., a 1600 nm-thickness are grown over the entire surface by, e.g., CVD method to form the inter-layer insulating film 80 of the layer structure of the silicon oxide films 76, 78. In place of the silicon oxide film 76, a silicon nitride film may be formed.

Next, to activate the impurity diffused regions and stabilize the film quality of the inter-layer insulating film 80, thermal processing is made in nitride atmosphere, at, e.g., 850° C. for 30 minutes.

Next, by, e.g., CMP (Chemical Mechanical Polishing) method, the surface of the inter-layer insulating film 80 is etched back to, e.g., a 950 nm-thickness to planarize the surface of the inter-layer insulating film 80 (FIGS. 19A, 19B and 19C).

Then, by photolithography, a photoresist film 82 having openings in the contact hole forming regions is formed (FIGS. 20A, 20B and 20C).

At this time, the openings for the contact holes for connecting the bit lines to the drain regions of the memory cell transistors have a shape elongated in the X direction containing the steps of the device isolation insulating film 18 so that the etch reside 42 are positioned in the openings (see FIGS. 1, 4B and 20C).

For example, the openings of a 0.65 µm-width in the X direction and a 0.6 µm-width in the Y direction are formed. In this case, with the left width of the silicon nitride film 14 defining the width of the active region of the memory cell region being 0.55 µm and the intrusions of the bird's beaks being 0.1 µm, the openings are overlaid on the device isolation insulating film 18 by 0.15 µm on one side.

The mask shape of the contact holes transferred onto the wafer is not always rectangular due to the influence of the resolution of the lithography, etc. The mask shape often has the corners rounded into, e.g., a substantial ellipse. The shape of the openings is not specifically limited as long as the shape is an elongated shape in the X direction containing the region where the etch residue 42 is formed. The shape of the openings except the openings for the bit line contact holes can have an arbitrary shape, such as square, or others, selected as required.

Next, with the photoresist film 82 as the mask, the inter-layer insulating film 80 is anisotropically etched to form the contact holes 84 down to the silicon substrate 10 (FIGS. 21A, 21B and 21C). At this time, in the bit line contact regions, the etch residues formed on the device isolation insulating film 18 are concurrently removed (FIG. 21C). Specifically, the fence of the ONO film is etched in etching the inter-layer insulating film 80 to expose the residues of the floating gates 26.

This etching is mainly for forming the contact holes 84, and the major conditions are for etching the silicon oxide film. To remove the etching residue 42 more efficiently, the etching conditions may have the etching gas condition and the pressure varied so as to efficiently remove the silicon.

For example, the inter-layer insulating film 80 and the ONO film 28 are etched under the silicon oxide etching conditions of a gas flow rate of $CHF_3/CF_4/Ar=30/30/500$ sccm, a 500 mT pressure and a 1300 W power. The etch residue 42 of the floating gates 26 is etched under the silicon etching conditions of CF4/Ar=200/400 sccm, a 1200 mT pressure and a 400 W power. When the etch residue 42 slight, the etching may be made under the etching conditions of a gas flow rate of $CF_4/O_2=214/210$ sccm, a 1500 mT pressure and a 200 W power.

When the silicon nitride film is used in place of the silicon oxide film 76, the fence of the ONO film can be removed when the silicon nitride film is etched.

The etch residue 42 can be removed concurrently with forming the contact holes 84, which makes it unnecessary to add a mask step, which largely influence the manufacturing cost. The step of removing the etch residue 42 is made with the memory cell transistors covered by the thick inter-layer insulating film 80, whereby the protection oxide film on the side walls for protecting the gates of the memory cell transistors, the ONO film, tunnel gate insulating film, etc. are never damaged. The gate electrodes themselves of the memory cell transistors are never etched when the etch residue 42 is removed.

Figure 22A:
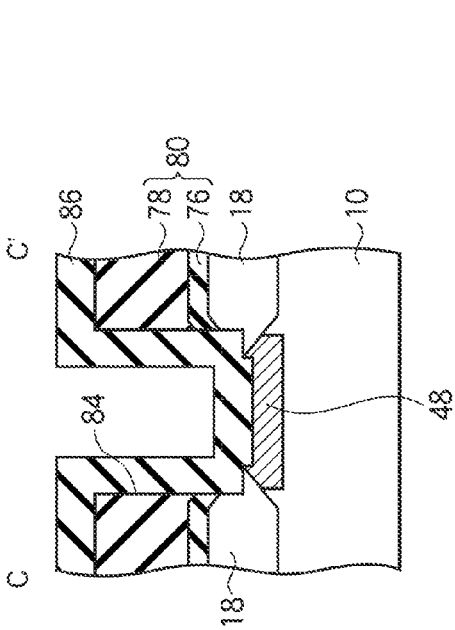
Figure 22C:
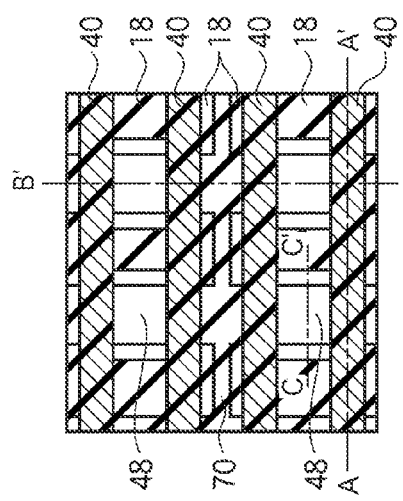
Figure 22B:
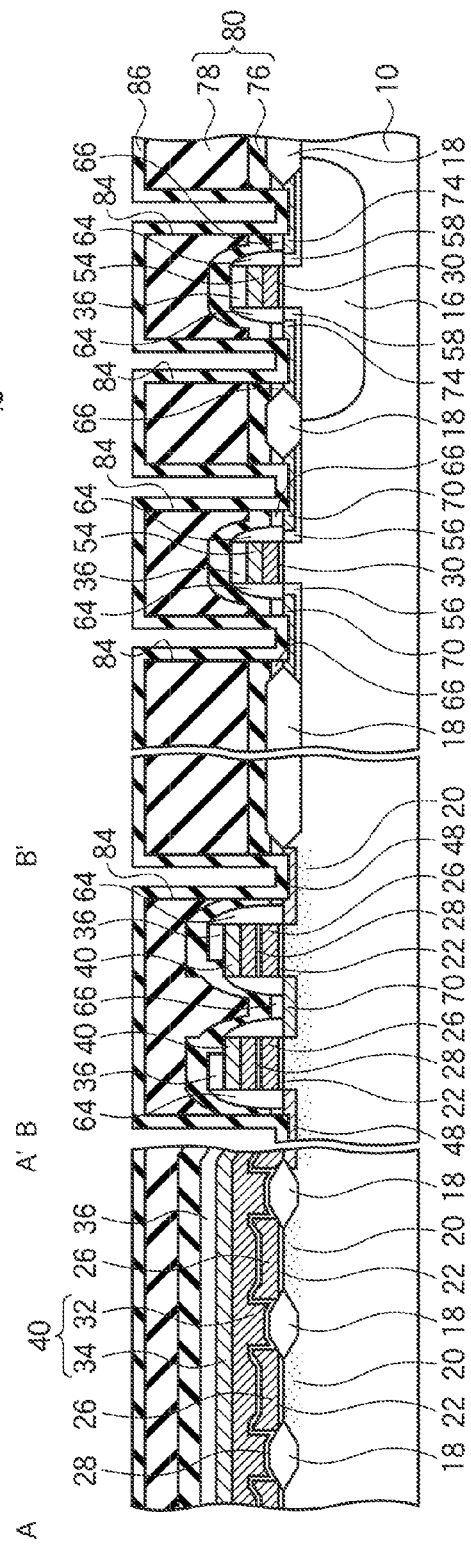

Next, a silicon oxide film 86 of, e.g., a 150 nm-thickness is formed over the entire surface by, e.g., CVD method (FIGS. 22A, 22B and 22C).

Figure 23A:
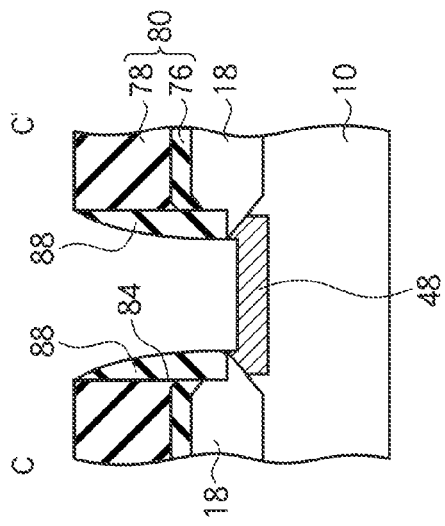
Figure 23C:
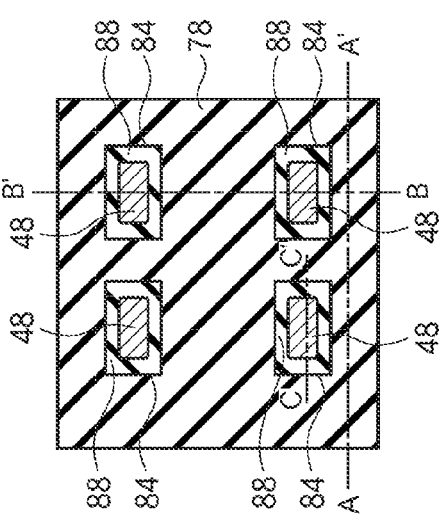
Figure 23B:
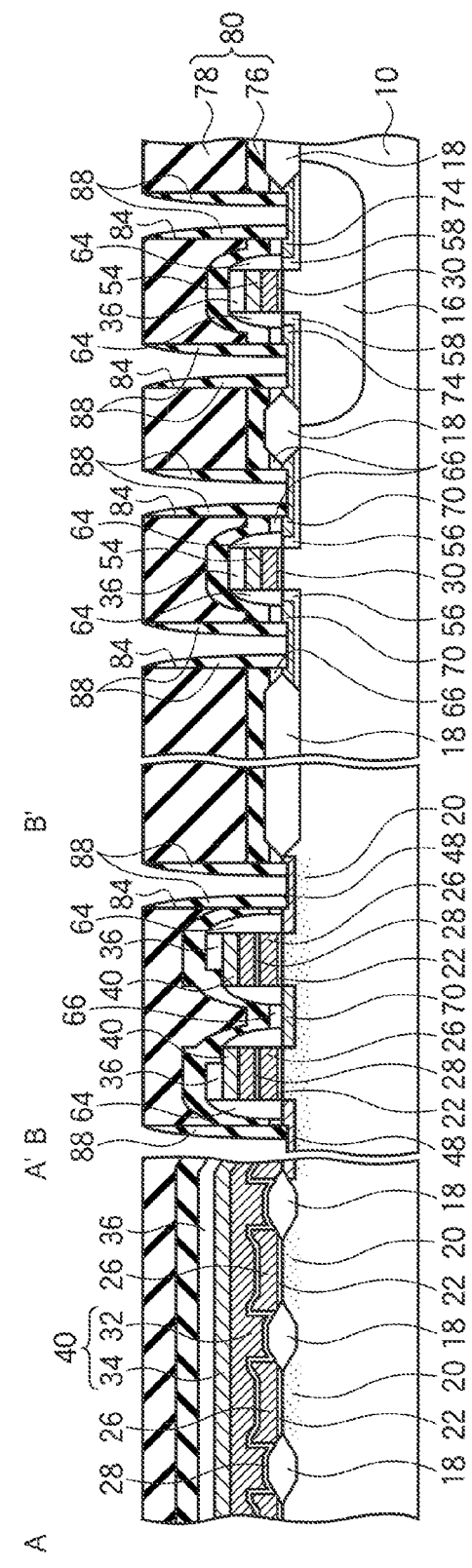

Then, the silicon oxide film 86 is anisotropically etched to form the sidewall spacers 88 of the silicon oxide film 86 on the inside walls of the contact holes 84 (FIGS. 23A, 23B and 23C). The silicon oxide film 86 can be etched under the conditions, e.g., of a gas flow rate of $CHF_3/CF_4/Ar=35/45/800$ sccm, a 1600 mT pressure and a 450 W power.

By forming the sidewall spacers 88, the etch residue 42 which has happened to be exposed in the Y-directional sections of the contact holes 84 can be covered by the sidewall spacers 88. Thus, the insulation between the contact plugs to be formed later and the etch residue 42 can be ensured.

Figure 24A:
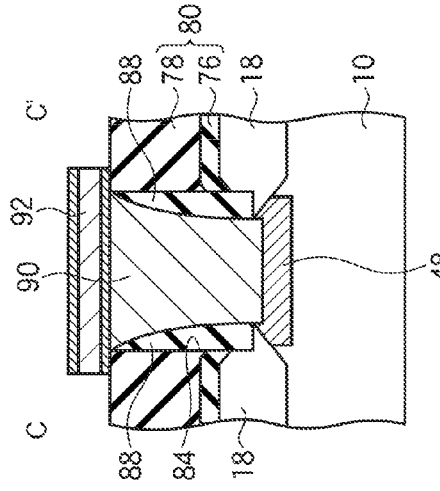
Figure 24C:
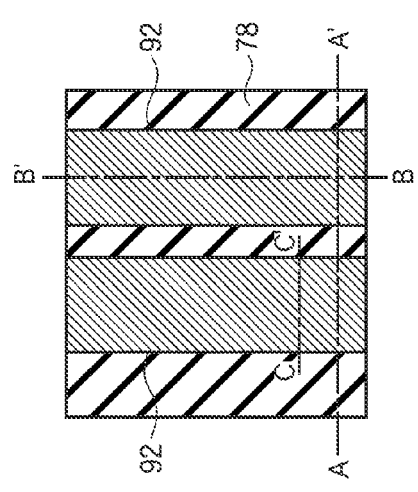
Figure 24B:
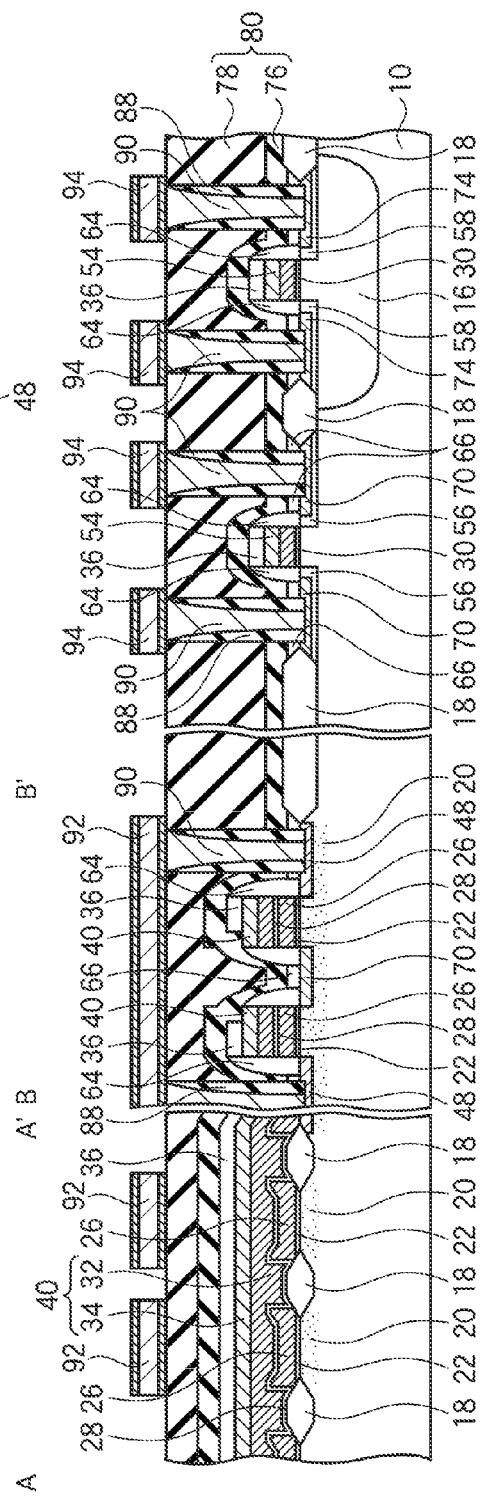

Next, required interconnection process is made to form the contact plugs 90 buried in the contact holes 84, the bit lines 92 connected to the memory cell transistors via the contact plugs 90, the interconnection layers 94 connected to the peripheral circuit transistors via the contact plugs 90, etc., and the semiconductor device according to the present embodiment is completed (FIGS. 24A, 24B and 24C).

As described above, according to the present embodiment, the width of the bit line contact hole in the X direction (extending direction of the word line) is larger than the width of the floating gate in the X direction, whereby etch residue which happens to be generated when the floating gate is divided in the Y direction can be removed in the process of forming the contact hole. Thus, the floating gates of the memory cell transistors adjacent to each other are prevented from being shorted by the etch residue. The sidewall spacer is formed in the contact hole, whereby the short between the floating gate and the bit line via the etch residue can be prevented. Thus, a semiconductor device of high reliability having no short defect and data retention defect can be manufactured.

A Second Embodiment

A semiconductor device and a method of manufacturing a semiconductor device according to a second embodiment will be described with reference to FIGS. 25A to 48C. The same members of the present embodiment as those of the semiconductor device and the method of manufacturing the same according to the first embodiment illustrated in FIGS. 1 to 24C are represented by the same reference numbers not to repeat or to simplify their description.

FIGS. 25-48 are plan views and sectional views illustrating the structure of the semiconductor device according to the present embodiment. In each drawing, FIG. A is a plan view, and FIG. B and FIG. C are diagrammatic sectional views. In FIG. B, the region on the left side of the drawing is the memory cell region, and the region on the right side of the drawing is the peripheral circuit region. The left side of the memory cell region is the sectional view in the X direction (along the word line), and the right side of the memory cell region is the sectional view in the Y direction (along the bit line). The left side of the peripheral circuit region is the n-channel transistor region, and the right side of the peripheral circuit region is the p-channel transistor region.

In the present embodiment, the device isolation insulating film 18 is formed by STI (Shallow Trench Isolation) method.

The structural characteristics of the semiconductor device according to the present embodiment are the basically the same as those of the semiconductor device according to the first embodiment illustrated in FIGS. 1 to 4B.

First, the silicon oxide film 12 of, e.g., an about 15 nm-thickness is formed on the silicon substrate 10 by, e.g., thermal oxidation method.

Next, on the silicon oxide film 12, the silicon nitride film 14 of, e.g., an about 120 nm-thickness is formed by, e.g., CVD method.

Then, the silicon nitride film 14 is patterned by photolithography and dry etching to leave the silicon nitride film 14 selectively in the region to be the device regions. In the memory cell region, the silicon nitride film 14 is patterned into stripes extended in the Y direction with an etched width of, e.g., 0.55 µm-width and a left width of, e.g., 0.55 µm-width (FIGS. 25A and 25B).

Next, the silicon substrate 10 is etched with the silicon nitride film 14 as the mask to form trenches 100 of, e.g., a 350 nm-depth in the device isolation regions of the silicon substrate 10 (FIGS. 26A and 26B).

Figure 27A:
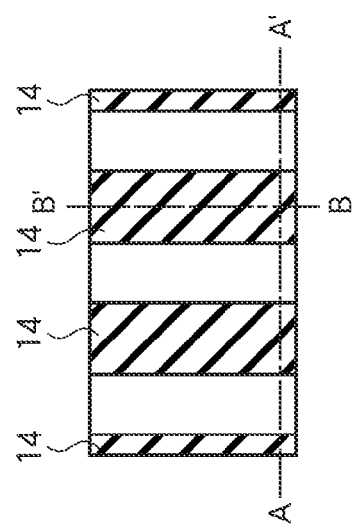
Figure 27B:
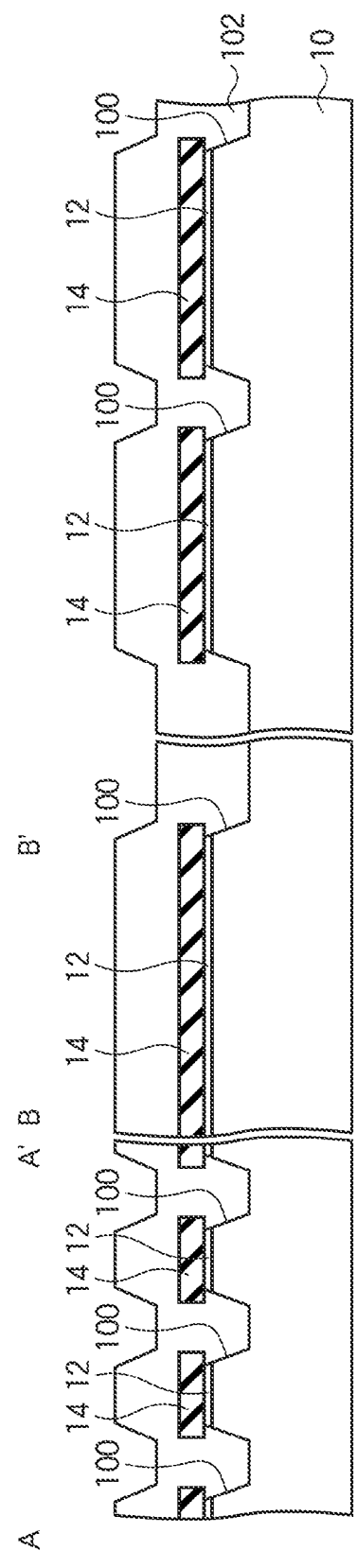

Next, over the entire surface, a silicon oxide film 102 of, e.g., a 700 nm-thickness is deposited to bury the trenches 100 by the silicon oxide film 102 (FIGS. 27A and 27B).

Then, the silicon oxide film 102 is polished by CMP method until the silicon nitride film 14 is exposed to remove the excessive silicon oxide film 102. Thus, the device isolation insulating film (STI) 18 is formed by the silicon oxide film 102 buried in the trenches 100 (FIGS. 28A and 28B).

Next, the silicon nitride film 14 and the silicon oxide film 12 are removed by, e.g., wet etching.

Next, thermal processing is made in an oxidation atmosphere to form a protection oxide film 104 of a silicon oxide film of, e.g., an about 10 nm-thickness in the device regions. The protection oxide film 104 is for protecting the surface of the silicon substrate 10 when the n-well 16 and the impurity diffused regions 20 are formed in later steps.

Then, by photolithography, a photoresist film (not illustrated) exposing the p-channel transistor region of the peripheral circuit is formed.

Next, n-type impurity ions are implanted with the photoresist film as the mask to form the n-well 16 in the p-channel transistor region of the peripheral circuit (FIGS. 29A and 29B).

Then, by photolithography, a photoresist film (not illustrated) covering the peripheral circuit region and exposing the memory cell region is formed.

Next, p-type impurity ions are implanted with the photoresist film as the mask to form the impurity diffused regions 20 in the memory cell region.

Next, the protection oxide film 104 is removed by, e.g., wet etching using hydrofluoric acid aqueous solution.

Then, thermal processing is made in an oxidation atmosphere to thermally oxidize the silicon substrate 10 and form the tunnel gate insulating film 22 of a silicon oxide film of, e.g., an about 10 nm-thickness in the device regions.

Figure 30A:
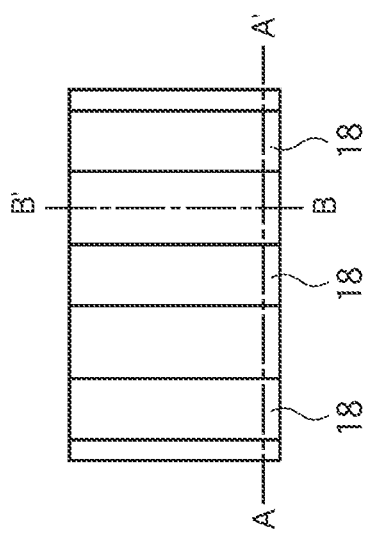
Figure 30B:
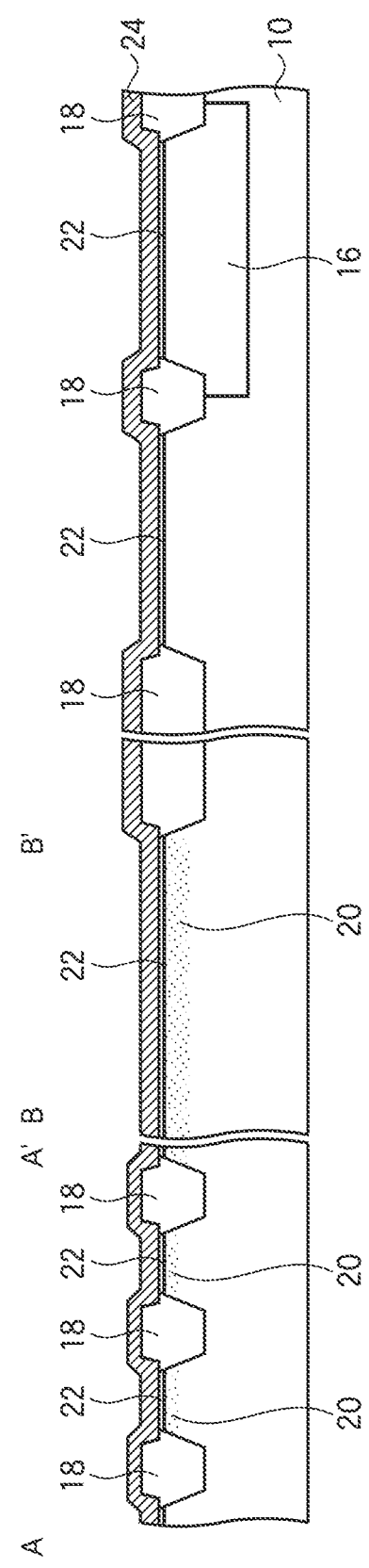

Then, over the entire surface, the amorphous silicon film 24 of, e.g., a 90 nm-thickness and doped with phosphorus in a $5 \times 10^{19}$ cm$^{-3}$ concentration is grown by, e.g., CVD method (FIGS. 30A and 30B).

Next, by photolithography and dry etching, the amorphous silicon film 24 in the memory cell region is patterned into stripes extended in the Y direction to form the floating gates 26 divided in the X direction (FIGS. 31A and 31B).

At this time, in the process of removing the silicon nitride film 14 when the device isolation insulating film 18 is formed and the process of removing the protection oxide film 104, cavities are often formed in the peripheral edges of the device isolation insulating film 18. When the edges of the floating gates 26 are positioned in the cavities due to alignment error, processing fluctuations, etc., the side walls of the floating gates 26 are often a little wide-based depending on configurations of cavities, etc. in the etching processing (see FIG. 31C). In later steps, these configurations are covered by the ONO film 28, and finally, when the control gates and the floating gates are etched in the Y direction, causes the etch residue, and causes the fault of the stringer-shaped etch residue.

Figure 32A:
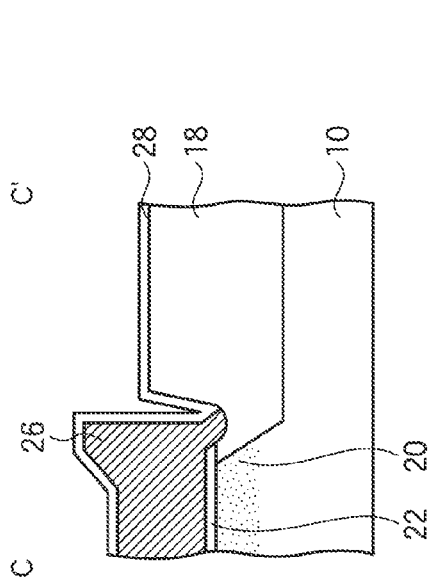
Figure 32C:
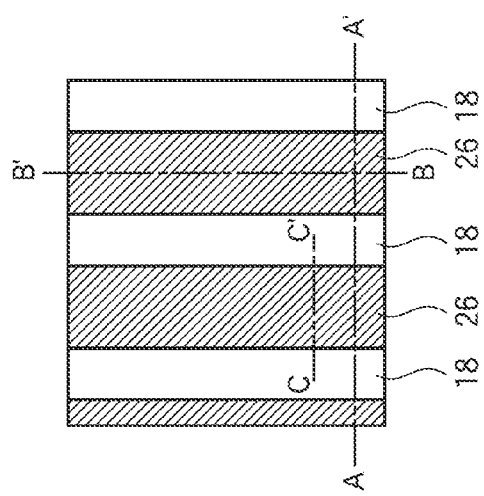
Figure 32B:
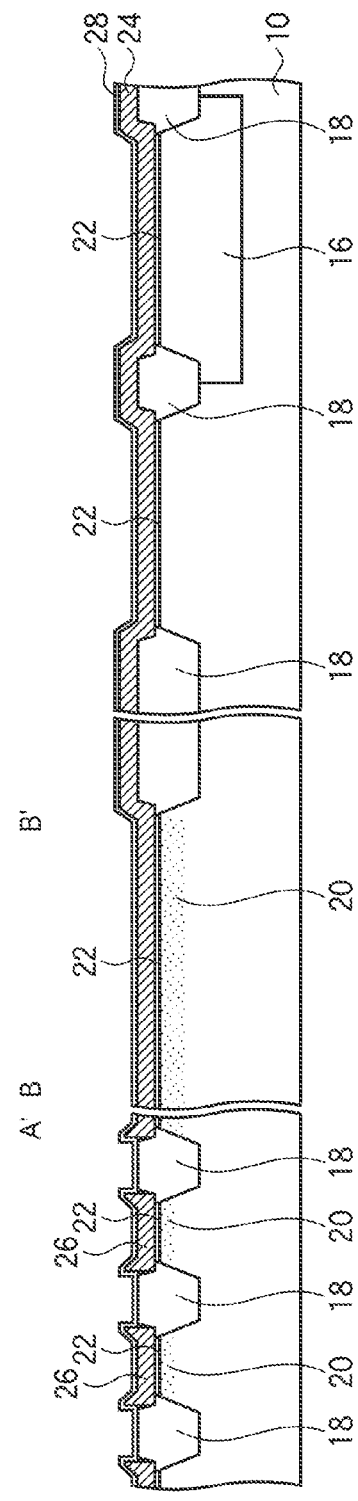

Then, over the entire surface, sequentially an 8 nm-thickness silicon oxide film is formed by, e.g., CVD method, a 10 nm-thickness silicon nitride film is formed on, e.g., CVD method and a 3 nm-thickness silicon oxide film is formed by, e.g., thermal oxidation method to thereby form the ONO film 28 of the silicon oxide film/the silicon nitride film/the silicon oxide film structure (FIGS. 32A, 32B and 32C).

Next, a photoresist film (not illustrated) covering the memory cell region and exposing the peripheral circuit region is formed.

Next, with the photoresist film as the mask, the ONO film 28, the amorphous silicon film 26 and the tunnel gate insulating film 22 in the peripheral circuit region are selectively removed by etching.

Figure 33A:
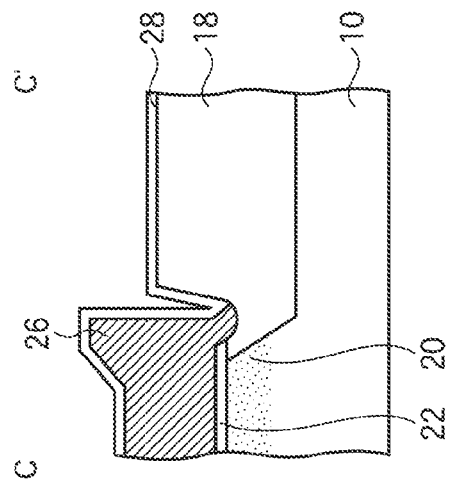
Figure 33C:
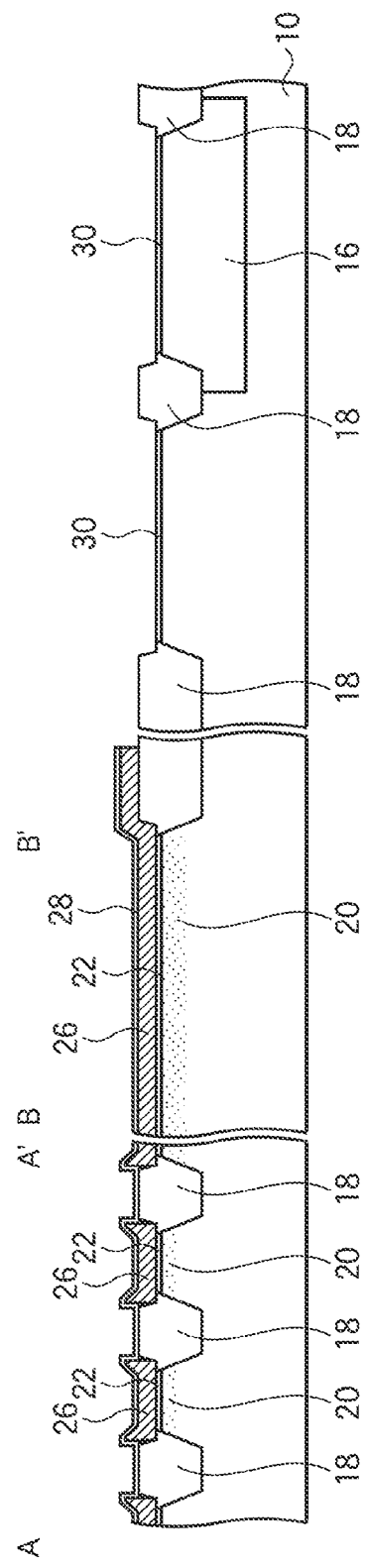
Figure 33B:
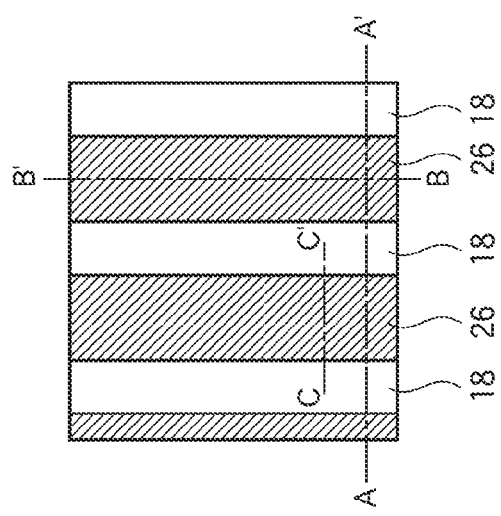

Next, in the peripheral circuit region, the gate insulating film 30 of the peripheral circuit transistors is formed. For example, as the gate insulating film of the peripheral circuit unit of the flash memory, which requires high-voltage operation, the silicon oxide film of a 17 nm-thickness is formed, and as the gate insulating film of the logic circuit unit, the silicon oxide film of a 7 nm-thickness is formed (FIGS. 33A, 33B and 33C).

Next, over the entire surface, the amorphous silicon film 32 of, e.g., a 120 nm-thickness doped with phosphorus of a $3 \times 10^{20}$ cm$^{-3}$ is grown by, e.g., CVD method.

Then, on the amorphous silicon film 32, the tungsten silicide film 34 of, e.g., a 150 nm-thickness is formed by, e.g., CVD method.

Figure 34A:
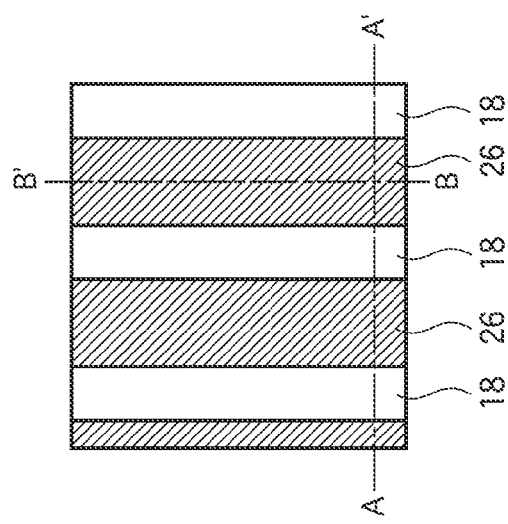
Figure 34B:
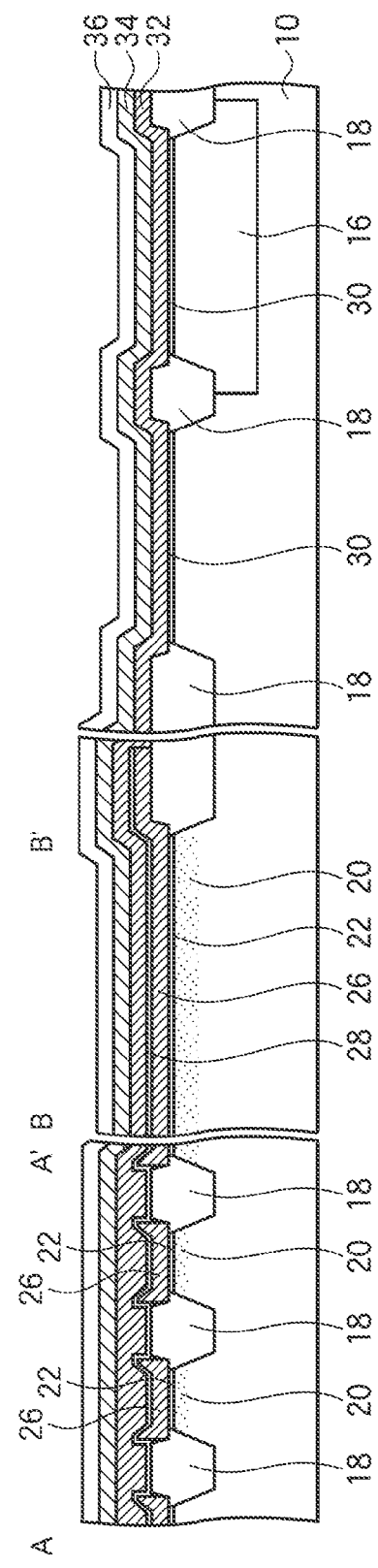

Next, on the tungsten silicide film 34, the silicon oxide film 36 of, e.g. a 100 nm-thickness is formed by, e.g., CVD method (FIGS. 34A and 34B).

Next, by photolithography, a photoresist film 38 covering the peripheral circuit region and having a pattern of the control gates 40 in the memory cell region is formed on the silicon oxide film 36.

Then, with the photoresist film 38 as the mask, the silicon oxide film 36, the tungsten silicide film 34 and the amorphous silicon film 32 in the memory cell region are etched. Thus, in the memory cell region, the control gates 40 of the tungsten polycide structure having the upper surface covered by the silicon oxide film 36 are formed. The gate length of the control gates 40 is set at, e.g., 0.45 μm.

Figure 35C:
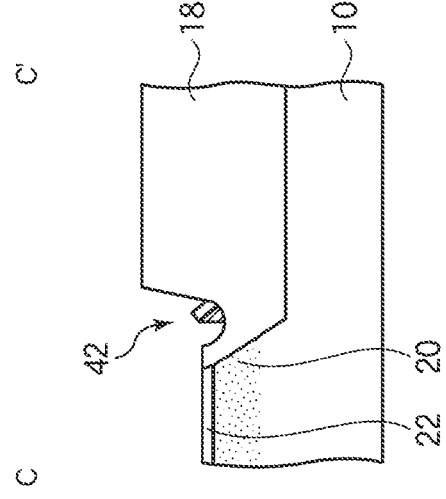
Figure 35A:
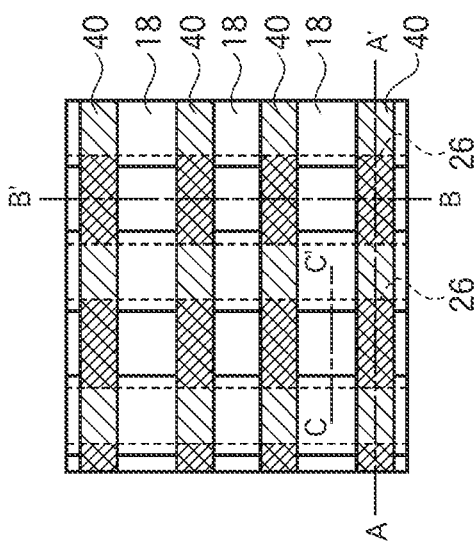
Figure 35B:
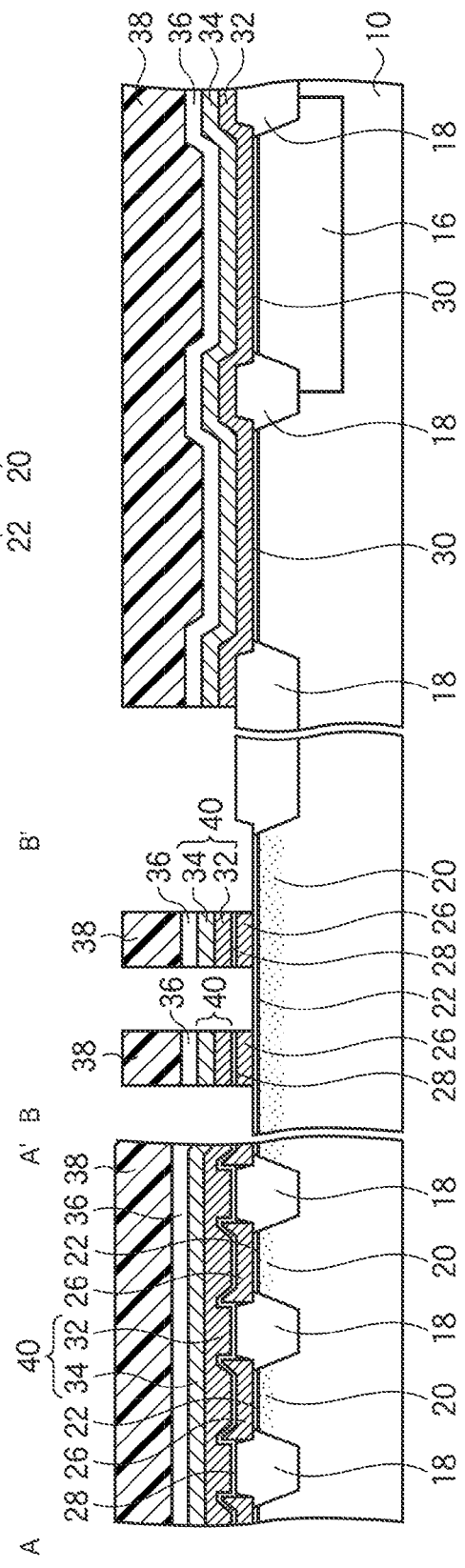

Next, with the photoresist film 38 as the mask, the ONO film 28 and the floating gates 26 are further etched to divide the floating gates 26 in the Y direction (FIGS. 35A and 35B).

At this time, the wide-based side walls of the floating gates 26 formed when the floating gates 26 were divided in the X direction are behind the ONO film 28 which have not been etched off in the etching of the ONO film 28 cannot be often sufficiently etched. In such case, the stringer-shaped etch residue 42 extended in the Y direction is generated at the edge of the device isolation insulating film 18 (FIG. 35C and FIG. 4A).

Next, the photoresist film 38 is removed by, e.g., asking method.

Next, annealing is made in an oxidation atmosphere at, e.g., 900° C. to form the silicon oxide film 44 of, e.g., a 7.5 nm-thickness on the device regions of the memory cell region and on the side walls of the gate electrodes 40, 26.

Next, by photolithography, a photoresist film 46 covering the peripheral circuit region and exposing the memory cell region is formed.

Then, n-type impurity ions of high concentration are implanted with the photoresist film 46 and the gate electrodes 40, 26 as the mask to form the impurity diffused regions 48 to be the source/drain regions in the silicon substrate 10 on both sides of the gate electrodes 40, 26 (FIGS. 36A, 36B and 36C).

Then, oxidation anneal is made at, e.g., 900° C. to form the silicon oxide film 50 of, e.g., a 5 nm-film thickness on the device regions of the memory cell region and on the side walls of the gate electrodes 40, 26.

Next, by photolithography, a photoresist film 52 covering the memory cell region and having a pattern of the gate electrodes 54 in the peripheral circuit region is formed.

Then, with the photoresist film 52 as the mask, the silicon oxide film 36, the tungsten silicide film 34 and the amorphous silicon film 32 in the peripheral circuit region are etched to form the gate electrodes 54 of the tungsten polycide structure having the upper surface covered by the silicon oxide film 36 in the peripheral circuit region (FIGS. 37A, 37B and 37C). The gate length of the gate electrodes 54 of the peripheral circuit transistors is set at, e.g., 0.35 μm.

Then, the photoresist film 52 is removed by, e.g., asking method.

Figure 38A:
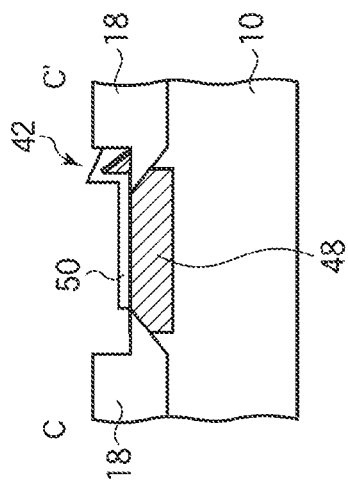
Figure 38C:
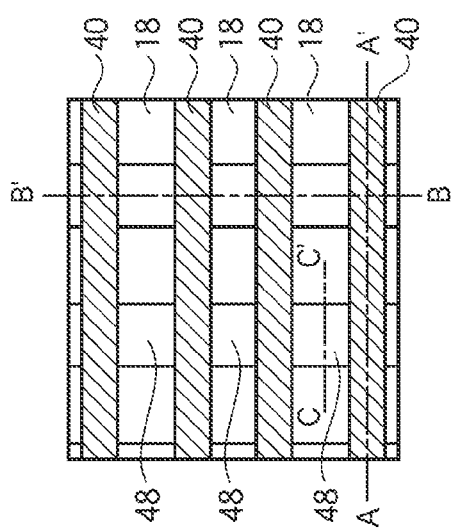
Figure 38B:
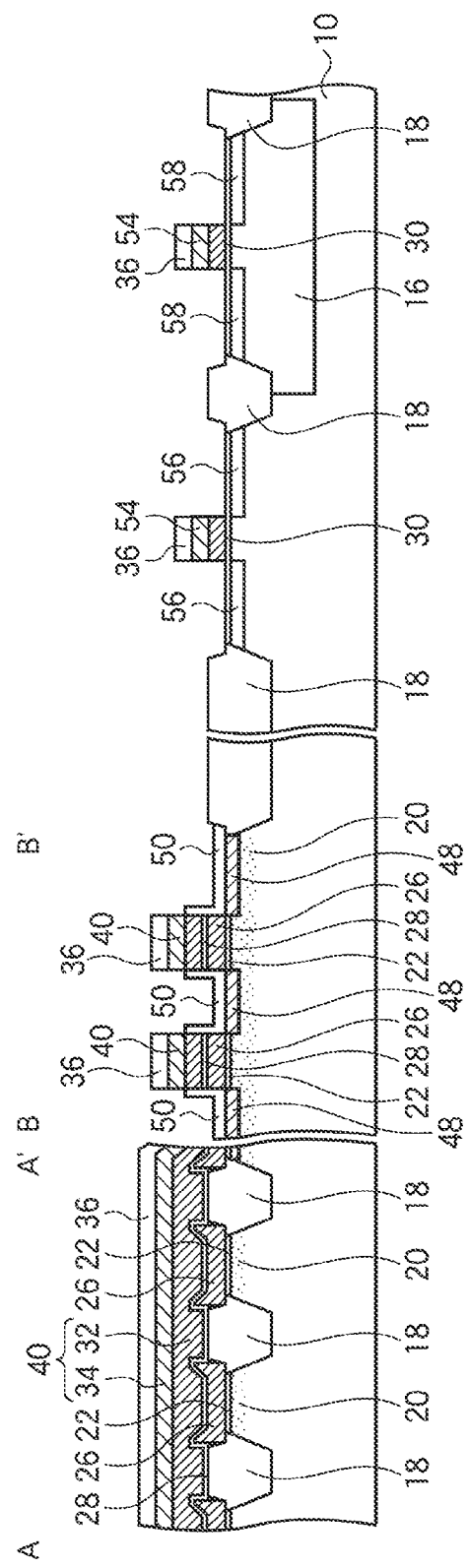

Next, by photolithography and ion implantation, the impurity diffused regions 56, 58 are formed in the silicon substrate respectively on both sides of the gate electrodes 54 of the peripheral circuit region. The impurity diffused regions 56, 58 are the diffused regions to be the lightly doped diffused layers or the extension diffused layers of the source/drain regions of the peripheral circuit transistors (FIGS. 38A, 38B and 38C).

For example, the lightly doped diffused layers (impurity diffused regions 56) of the n-channel transistor of the logic circuit can be formed, e.g., by implanting phosphorus ions (P$^+$) under the conditions of a 20 keV acceleration energy and a $4.0 \times 10^{13}$ cm$^{-2}$ dose. The lightly doped diffused layers (impurity diffused regions 58) of the p-channel transistor of the logic circuit can be formed, e.g., by implanting boron difluoride ions (BF$_2^+$) under the conditions of a 20 keV acceleration energy and an $8.0 \times 10^{12}$ cm$^{-2}$ dose.

Next, the silicon oxide film 60 of, e.g., a 100 nm-thickness is formed over the entire surface by, e.g., CVD method.

Next, a photoresist film 62 covering the peripheral circuit region and alternately exposing the regions between the word lines of the memory cell region, i.e., exposing the regions to be the source lines interconnecting the source regions of the memory cell transistors is formed by photolithography.

Figure 39A:
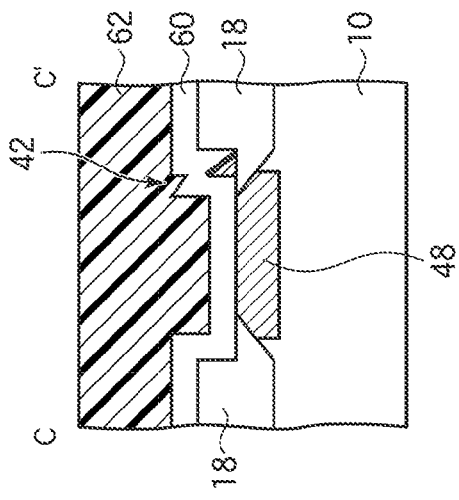
Figure 39C:
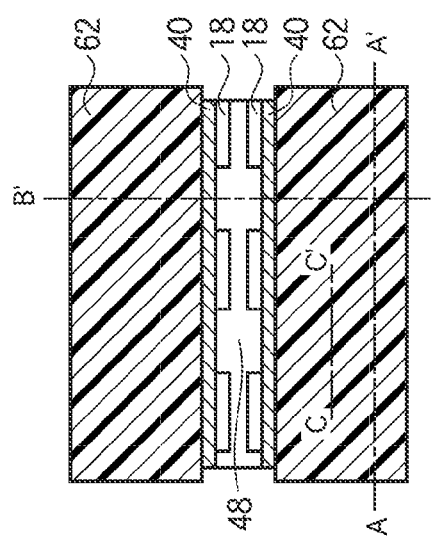
Figure 39B:
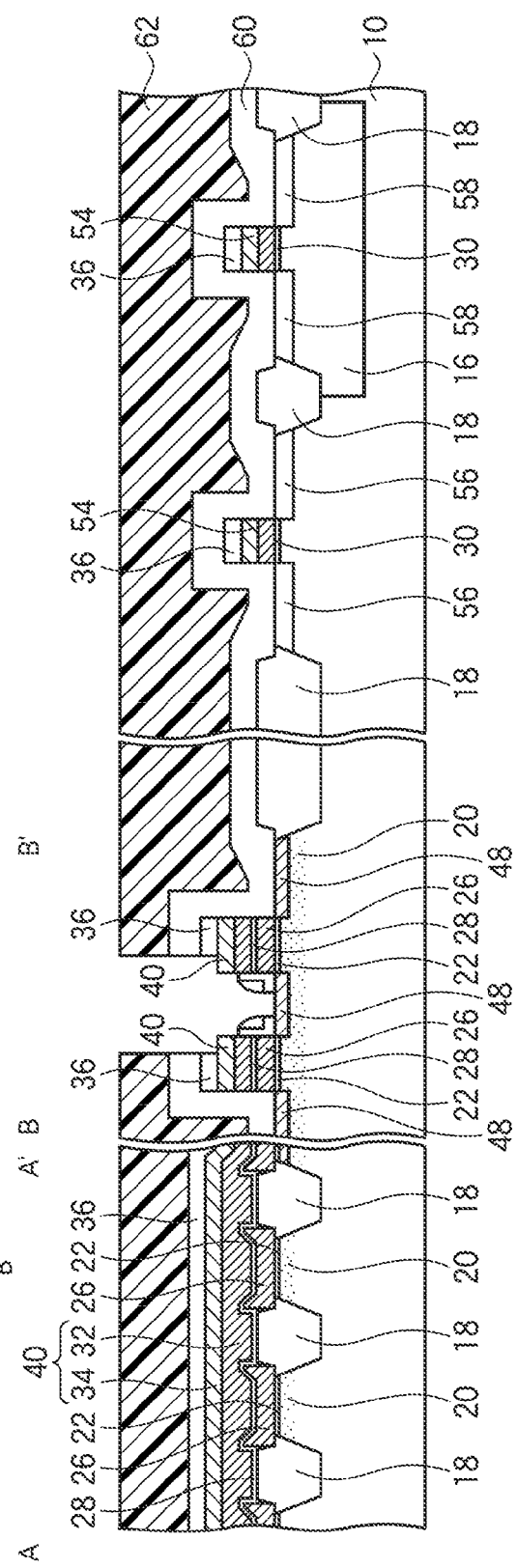

Next, with the photoresist film 62, the control gates 40, which are the word lines as the mask, the silicon oxide films 60, 50 and the device isolation insulating film 18 in the source line forming regions are etched (FIGS. 39A, 39B and 39C).

Next, the photoresist film 62 is removed by, e.g., asking method.

Next, a silicon oxide film of, e.g., a 70 nm-thickness is formed over the entire surface by, e.g., CVD method.

Next, this silicon oxide film and the silicon oxide films 50, 60 are etched back to form the sidewall spacers 64 on the side walls of the gate electrodes 40, 54.

Figure 40A:
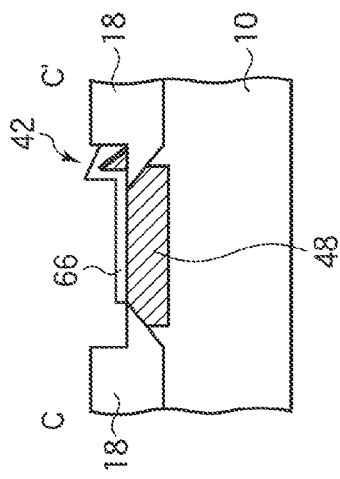
Figure 40C:
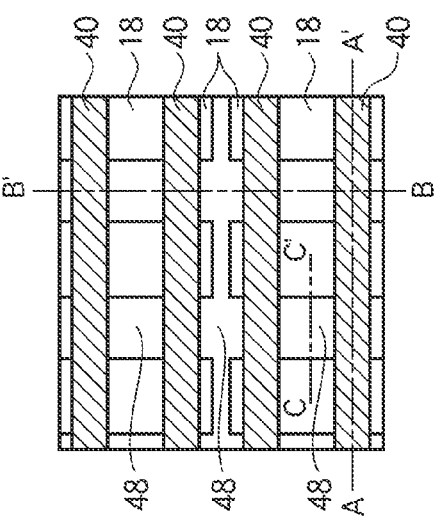
Figure 40B:
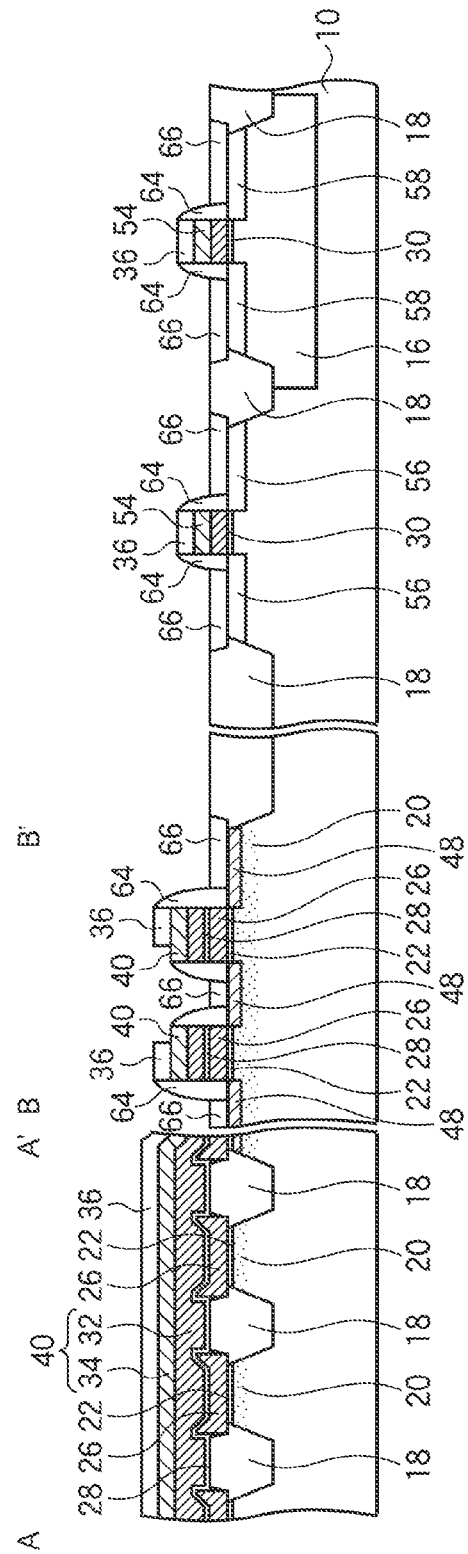

Next, thermal oxidation is made in a dry oxidation atmosphere at, e.g., 800° C. for 50 minutes to form the protection oxide film 66 of the silicon oxide film on the device regions (FIGS. 40A, 40B and 40C).

Next, a photoresist film 68 exposing the source line forming region of the memory cell region and the n-channel transistor region of the peripheral circuit region and covering the reset region is formed by photolithography.

Next, with the photoresist film 68 and the gate electrodes 40, 54 as the mask, n-type impurity ions are implanted to form the impurity diffused regions 70 in the source line forming regions of the memory cell region and in the silicon substrate on both sides of the gate electrodes 54 (FIGS. 41A, 41B and 41C). The impurity diffused regions 70 are formed, e.g., by implanting arsenic ions (As$^+$) under the conditions of a 60 keV acceleration energy and a $3.0 \times 10^{15}$ cm$^{-2}$ dose.

Next, the photoresist film 68 is removed by, e.g., ashing method.

Next, a photoresist film 72 exposing the p-channel transistor region of the peripheral circuit region and covering the rest region is formed by photolithography.

Figure 42A:
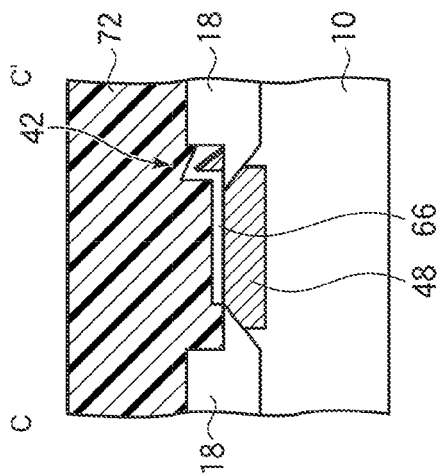
Figure 42C:
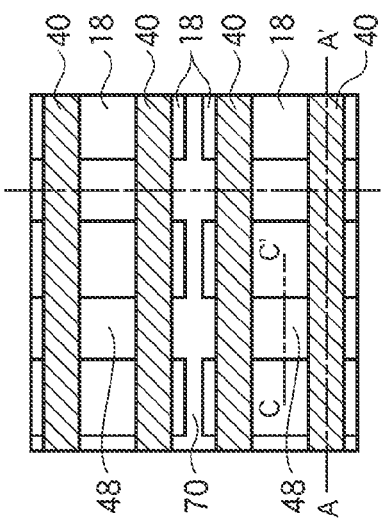
Figure 42B:
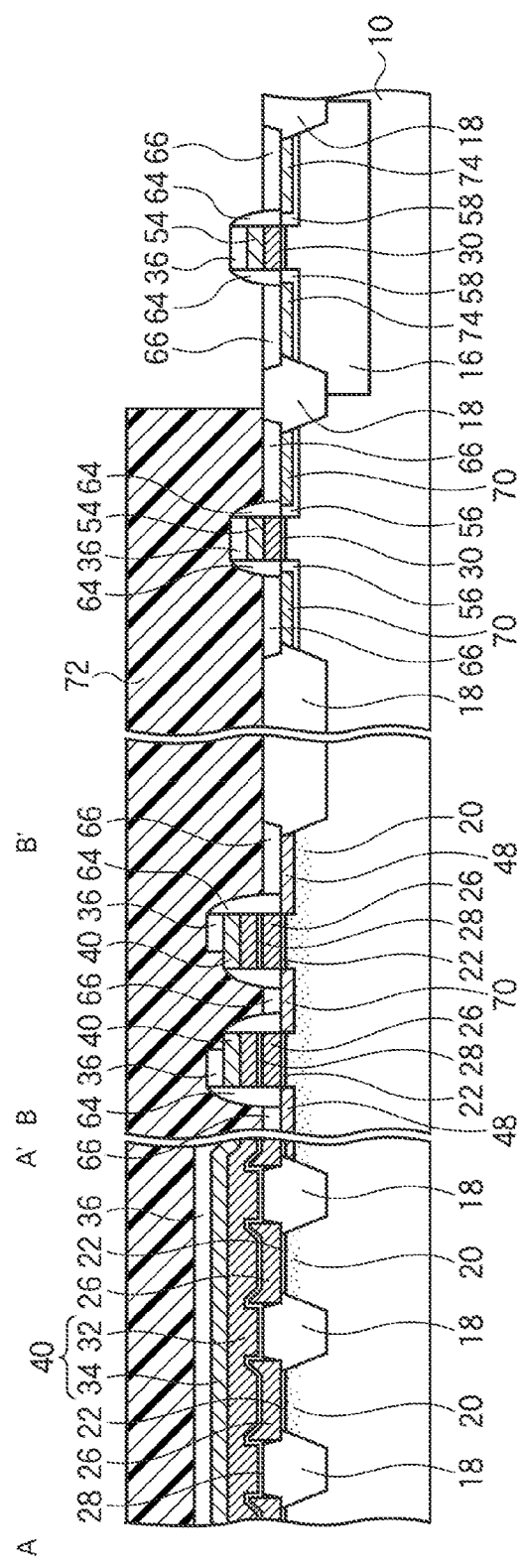

Next, with the photoresist film 72 and the gate electrodes 54 as the mask, p-type impurity ions are implanted to form the impurity diffused regions 74 in the silicon substrate 10 on both sides of the gate electrodes (FIGS. 42A, 42B and 42C). The impurity diffused regions 74 are formed, e.g., by implanting BF$_2^+$ ions under the conditions of a 40 keV acceleration energy and a $4.0 \times 10^{15}$ cm$^{-2}$ dose.

Next, the photoresist film 72 is removed by, e.g., ashing method.

Next, a silicon oxide film 76 of, e.g., a 100 nm-thickness, and a silicon oxide film 78 containing phosphorus and boron of, e.g., a 1600 nm-thickness are grown over the entire surface by, e.g., CVD method to form the inter-layer insulating film 80 of the layer structure of the silicon oxide films 76, 78. In place of the silicon oxide film 76, a silicon nitride film may be formed.

Next, to activate the impurity diffused regions and stabilize the film quality of the inter-layer insulating film 80, thermal processing is made in nitride atmosphere, at, e.g., 850° C. for 30 minutes.

Next, by, e.g., CMP (Chemical Mechanical Polishing) method, the surface of the inter-layer insulating film 80 is etched back to, e.g., a 950 nm-thickness to planarize the surface of the inter-layer insulating film 80 (FIGS. 43A, 43B and 43C).

Then, by photolithography, a photoresist film 82 having openings in the contact hole forming regions is formed (FIGS. 44A, 44B and 44C).

At this time, the openings for the contact holes for connecting the bit lines to the drain regions of the memory cell transistors have a shape elongated in the X direction containing the cavities of the device isolation insulating film 18 so that the etch reside 42 is positioned in the openings (see FIGS. 1, 4B and 44C).

For example, the openings of a 0.65 μm-width in the X direction and a 0.6 μm-width in the Y direction are formed.

Next, with the photoresist film 82 as the mask, the inter-layer insulating film 80 is anisotropically etched to form the contact holes 84 down to the silicon substrate 10 (FIGS. 45A, 45B and 45C). At this time, in the bit line contact regions, the etch residues formed on the device isolation insulating film 18 are concurrently removed (FIG. 45C). Specifically, the fence of the ONO film is etched in etching the inter-layer insulating film 80 to expose the residues of the floating gates 26.

This etching is mainly for forming the contact holes 84, and the major conditions are for etching the silicon oxide film. To remove the etching residue 42 more efficiently, the etching conditions may have the etching gas condition and the pressure varied so as to efficiently remove the silicon.

For example, the inter-layer insulating film 80 and the ONO film 28 are etched under the silicon oxide etching conditions of a gas flow rate of CHF$_3$/CF$_4$/Ar=30/30/500 sccm, a 500 mT pressure and a 1300 W power. The etch residue 42 of the floating gates 26 is etched under the silicon etching conditions of CF4/Ar=200/400 sccm, a 1200 mT pressure and a 400 W power. When the etch residue 42 slight, the etching may be made under the etching conditions of a gas flow rate of CF$_4$/O$_2$=214/210 sccm, a 1500 mT pressure and a 200 W power.

When the silicon nitride film is used in place of the silicon oxide film 76, the fence of the ONO film can be removed when the silicon nitride film is etched.

Figure 46A:
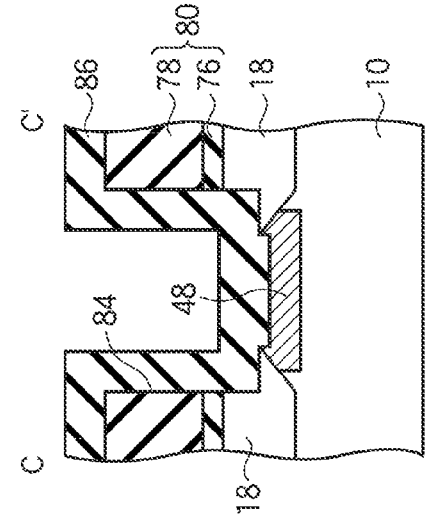
Figure 46C:
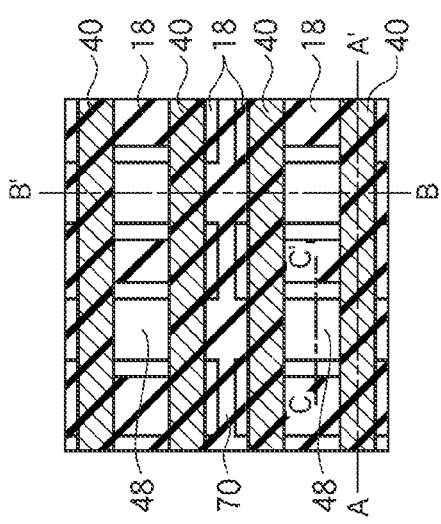
Figure 46B:
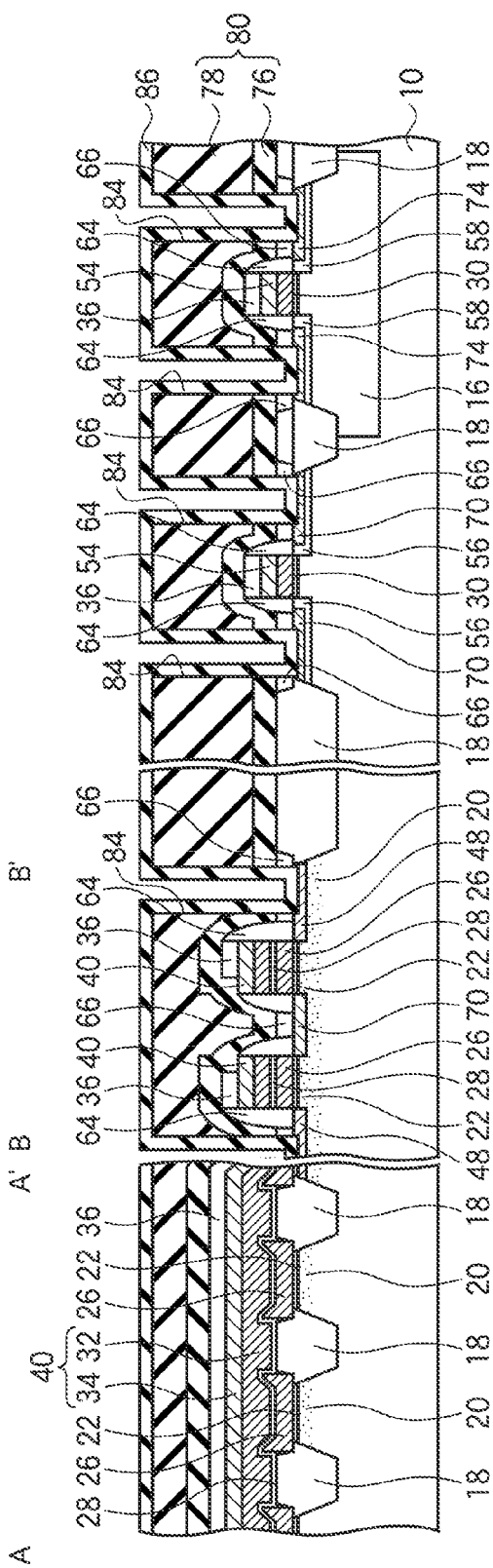

Next, a silicon oxide film 86 of, e.g., a 150 nm-thickness is formed over the entire surface by, e.g., CVD method (FIGS. 46A, 46B and 46C).

Figure 47C:
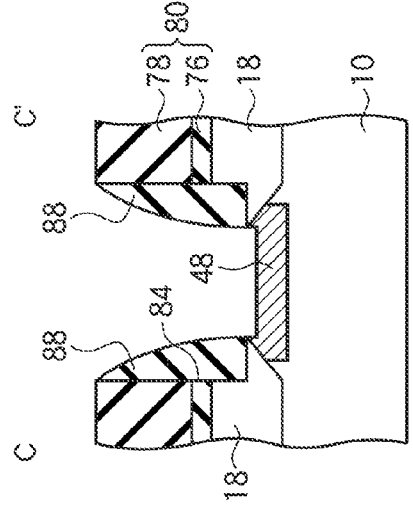
Figure 47A:
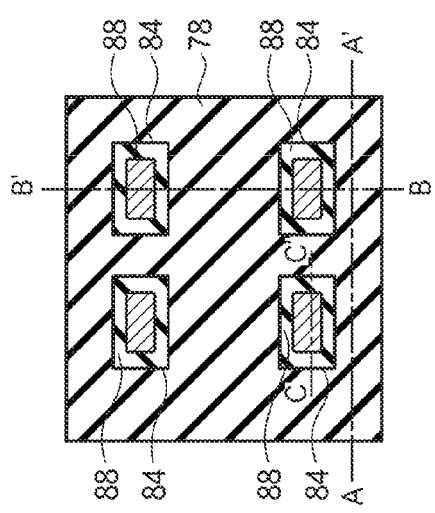
Figure 47B:
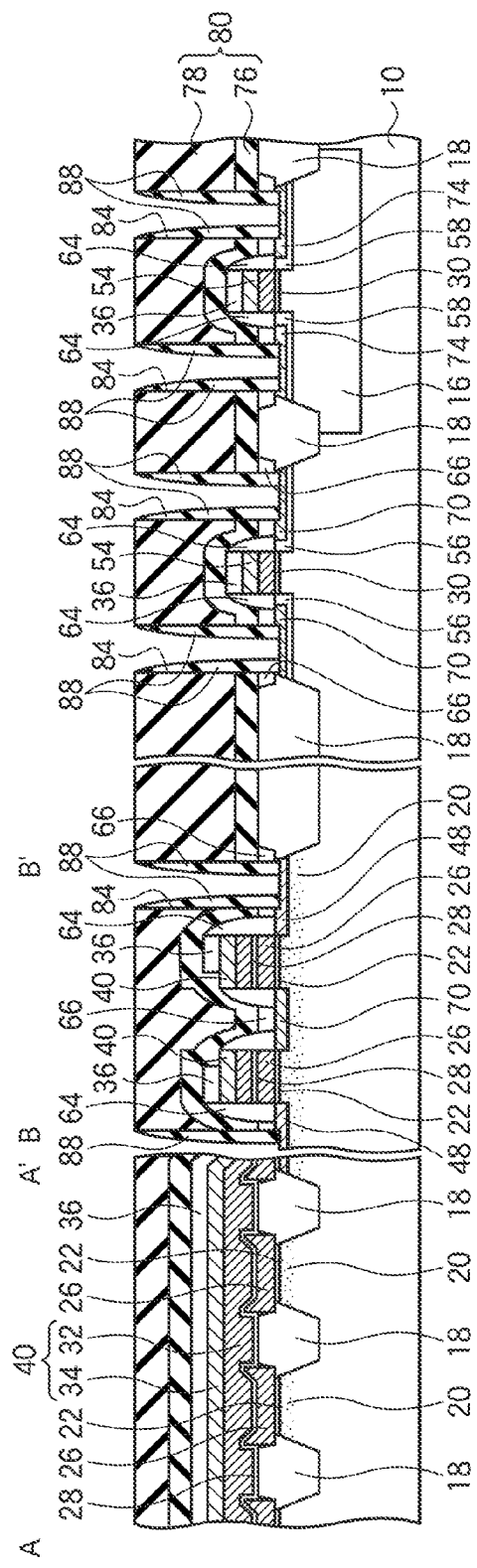

Then, the silicon oxide film 86 is anisotropically etched to form the sidewall spacers 88 of the silicon oxide film 86 on the inside walls of the contact holes 84 (FIGS. 47A, 47B and 47C). The silicon oxide film 86 can be etched under the conditions, e.g., of a gas flow rate of CHF$_3$/CF$_4$/Ar=35/45/800 sccm, a 1600 mT pressure and a 450 W power.

By forming the sidewall spacers 88, the etch residue 42 which has happened to be exposed in the Y-directional sections of the contact holes 84 can be covered by the sidewall spacers 88. Thus, the insulation between the contact plugs to be formed later and the etch residue 42 can be ensured.

Figure 48C:
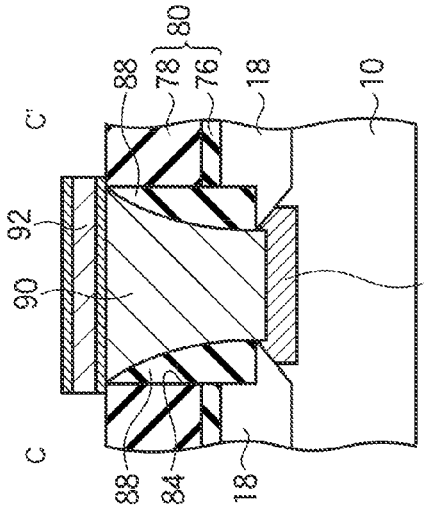
Figure 48A:
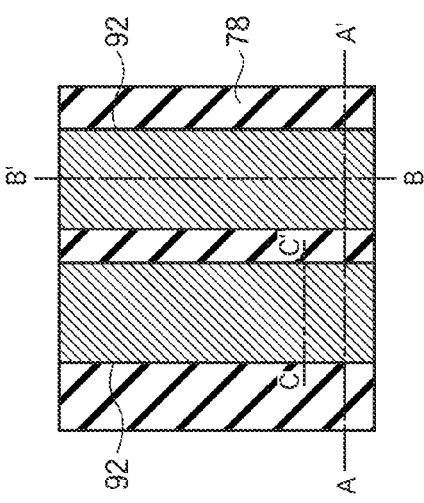
Figure 48B:
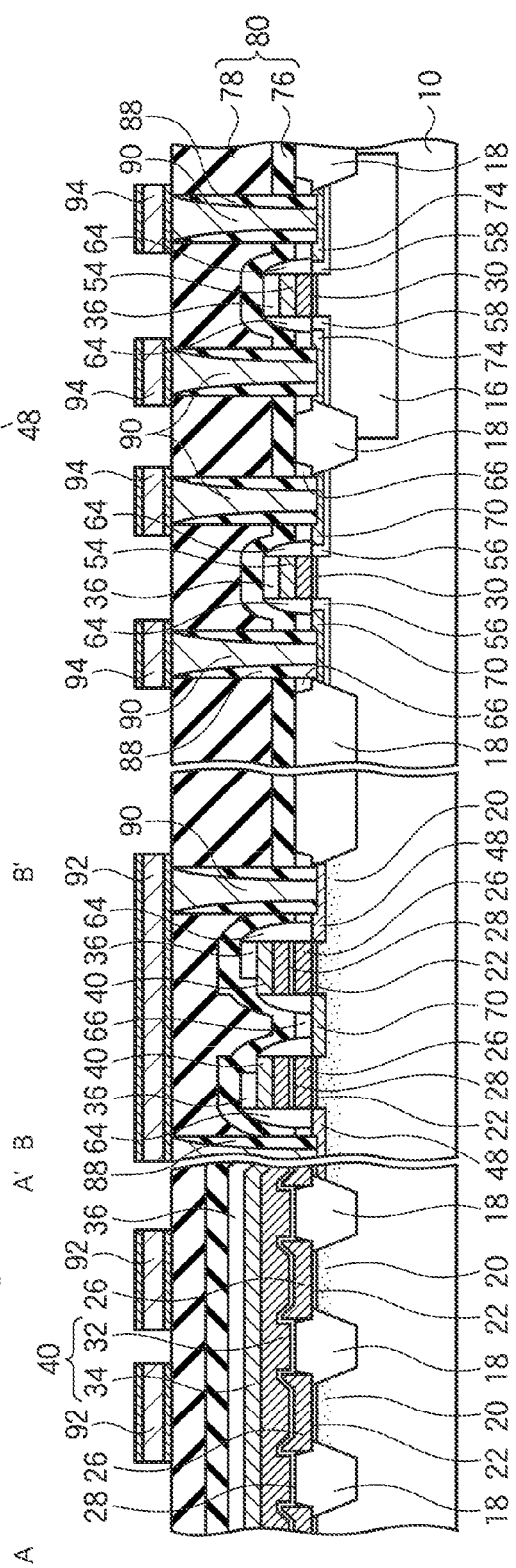

Next, required interconnection process is made to form the contact plugs 90 buried in the contact holes 84, the bit lines 92 connected to the memory cell transistors via the contact plugs 90, the interconnection layers 94 connected to the peripheral circuit transistors via the contact plugs 90, etc., and the semiconductor device according to the present embodiment is completed (FIGS. 48A, 48B and 48C).

As described above, according to the present embodiment, the width of the bit line contact hole in the X direction (extending direction of the word line) is larger than the width of the floating gate in the X direction, whereby etch residue which happens to be generated when the floating gate is divided in the Y direction can be removed in the process of forming the contact hole. Thus, the floating gates of the memory cell transistors adjacent to each other are prevented from being shorted by the etch residue. The sidewall spacer is formed in the contact hole, whereby the short between the floating gate and the bit line via the etch residue can be prevented. Thus, a semiconductor device of high reliability having no short defect and data retention defect can be manufactured.

A Third Embodiment

A semiconductor device and a method of manufacturing a semiconductor device according to a third embodiment will be described with reference to FIGS. 49 to 56C. The same members of the present embodiment as those of the semiconductor device and the method of manufacturing the same according to the first and the second embodiments illustrated in FIGS. 1 to 48C are represented by the same reference numbers not to repeat or to simplify their description.

Figure 49:
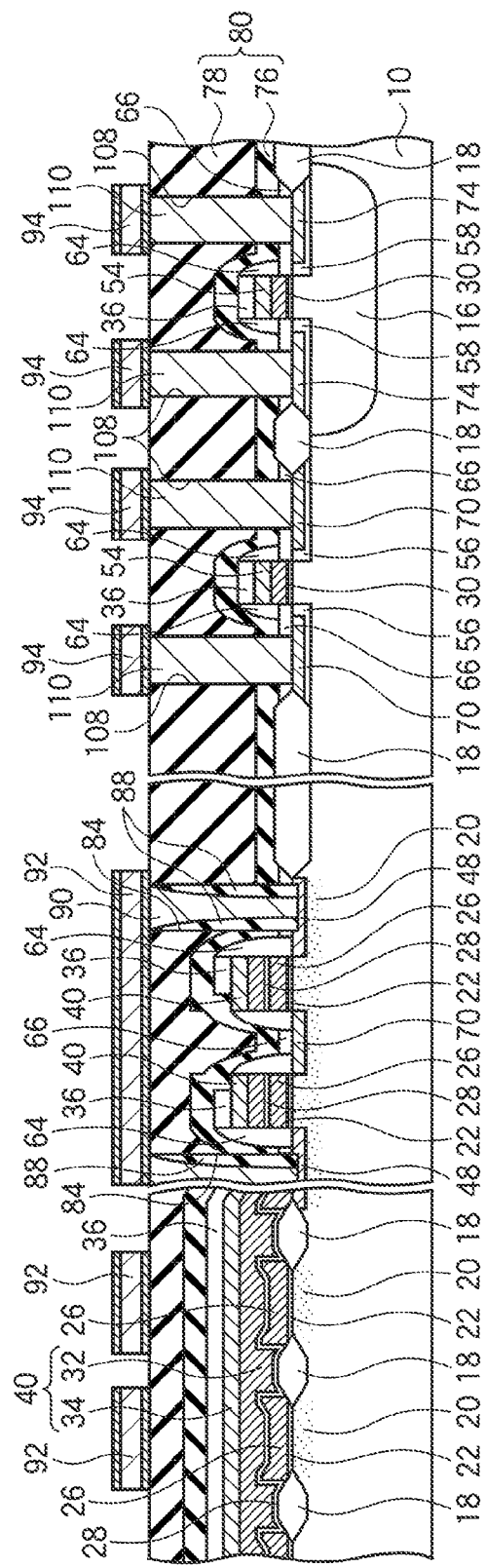
FIG. 49 is a diagrammatic cross-sectional view illustrating a structure of a semiconductor device according to a third embodiment.

FIG. 49 is a diagrammatic sectional view illustrating a structure of the semiconductor device according to the present embodiment. FIGS. 50A-56C are plan views and sectional views illustrating the structure of the semiconductor device according to the present embodiment.

First, the structure of the semiconductor device according to the present embodiment will be described with reference to FIG. 49.

As illustrated in FIG. 49, the semiconductor device according to the present embodiment is the same as the semiconductor device according to the first embodiment illustrated in FIGS. 1 to 3B in the structure of the memory cell region. The semiconductor device according to the present embodiment is different from the semiconductor device according to the first embodiment in that, in the former, the sidewall spacers are not formed on the side walls of the contact holes 108 with the contact plugs 110 connected to the peripheral circuit transistors buried in.

That is, in the inter-layer insulating film 80, the contact holes 108 down to the peripheral circuit transistors are formed. In the contact holes 108, the contact plugs 110 connected to the peripheral circuit transistors are buried. On the inter-layer insulating film 80, the interconnection layer 94 connected to the peripheral circuit transistors via the contact plugs 110 is formed. Between the inter-layer insulating film 80 and the contact plugs 110, the sidewall spacers are not formed.

The sidewall spacer 88 formed in the contact hole 84 of the memory cell region is for insulating the etch residue 42 exposed in the contact hole 84 and the contact plug 90 from each other, and the sidewall spacer 88 may not be formed in the peripheral circuit region, where the etch residue 42 cause no problem.

When the contact holes 84 to be formed in the memory cell region and the contact holes 84 to be formed in the peripheral circuit region are simultaneously opened, the etching for removing the etch residue 42 is made unnecessarily in the peripheral circuit region. Resultantly, excessive etching damages are caused, and the silicon substrate in the contact parts is excessively etched, which will cause degradation of the characteristics of the peripheral circuit transistors. The absence of the sidewall spacer in the contact hole 110 has an effect that the contact hole can be formed further downsized, and the integration of the peripheral circuit can be increased.

In view of this, in the semiconductor device according to the present embodiment, the contact holes 84 to be formed in the memory cell region, and the contact holes 108 to be formed in the peripheral circuit region are separately formed.

The simultaneous formation of the contact holes 84 to be formed in the memory cell region and the contact holes 108 to be formed in the peripheral circuit region as in the first embodiment and the second embodiment has a merit of shortening the manufacturing process.

Next, the method of manufacturing the semiconductor device according to the present embodiment will be described with reference to FIGS. 50A to 56C. In each drawing, FIG. A is a plan view, and FIG. B and FIG. C are diagrammatic sectional views. In FIG. B, the region on the left side of the drawing is the memory cell region, and the region on the right side of the drawing is the peripheral circuit region. The left side of the memory cell region is the sectional view in the X direction (along the word line), and the right side of the memory cell region is the sectional view in the Y direction (along the bit line). The left side of the peripheral circuit region is the n-channel transistor region, and the right side of the peripheral circuit region is the p-channel transistor region.

In the same way as in the method of manufacturing the semiconductor device according to the first embodiment illustrated in FIGS. 5A to 10B, the memory cell transistors and the peripheral circuit transistors, and the inter-layer insulating film covering them are formed.

Next, by photolithography, a photoresist film 82 having openings in the regions for the contact holes for connecting the bit lines to the drain regions of the memory cell transistors to be formed is formed on the inter-layer insulating film 80 (FIGS. 50A, 50B and 50C).

At this time, the openings of the photoresist film 82 have a shape elongated in the X direction containing the steps of the device isolation insulating film 18 so that the etch reside 42 is positioned in the openings (see FIGS. 1, 4B and 50C). For example, the openings of a 0.65 μm-width in the X direction and a 0.6 μm-width in the Y direction are formed.

Next, the inter-layer insulating film 80 is anisotropically etched with the photoresist film 82 as the mask to form the contact holes 84 down to the drain regions of the memory cell transistors (FIGS. 51A and 51B). At this time, the etch residue 42 formed on the device isolation insulating films 18 are concurrently removed (FIG. 51C). Specifically, the fences of the ONO film are etched in etching the inter-layer insulating film 80 to expose the residue of the floating gates 26.

This etching is mainly for forming the contact holes 84, and the major conditions are for etching the silicon oxide film. To remove the etching residue 42 more efficiently, the etching conditions may have the etching gas condition and the pressure varied so as to efficiently remove the silicon.

For example, the inter-layer insulating film 80 and the ONO film 28 are etched under the silicon oxide etching conditions of a gas flow rate of $CHF_3/CF_4/Ar=30/30/500$ sccm, a 500 mT pressure and a 1300 W power. The etch reside 42 of the floating gates 26 is etched under the silicon etching conditions of $CF4/Ar=200/400$ sccm, a 1200 mT pressure and a 400 W power. When the etch residue 42 slight, the etching may be made under the etching conditions of a gas flow rate of $CF_4/O_2=214/210$ sccm, a 1500 mT pressure and a 200 W power.

When the silicon nitride film is used in place of the silicon oxide film 76, the fences of the ONO film 28 can be removed in etching the silicon nitride film is etched.

Figure 52A:
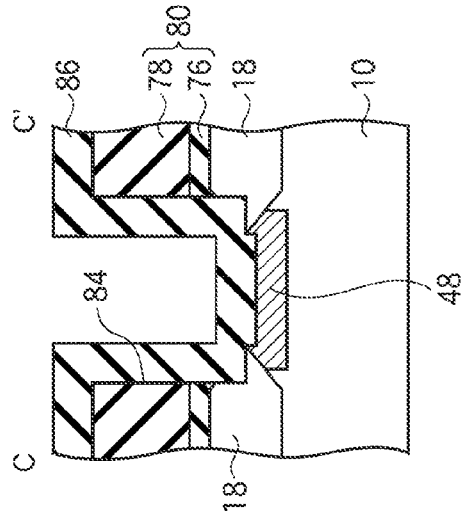
Figure 52C:
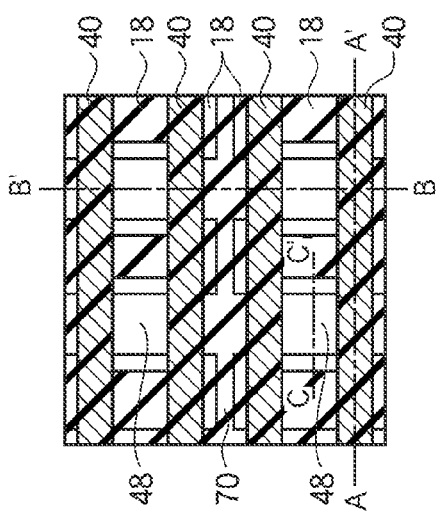
Figure 52B:
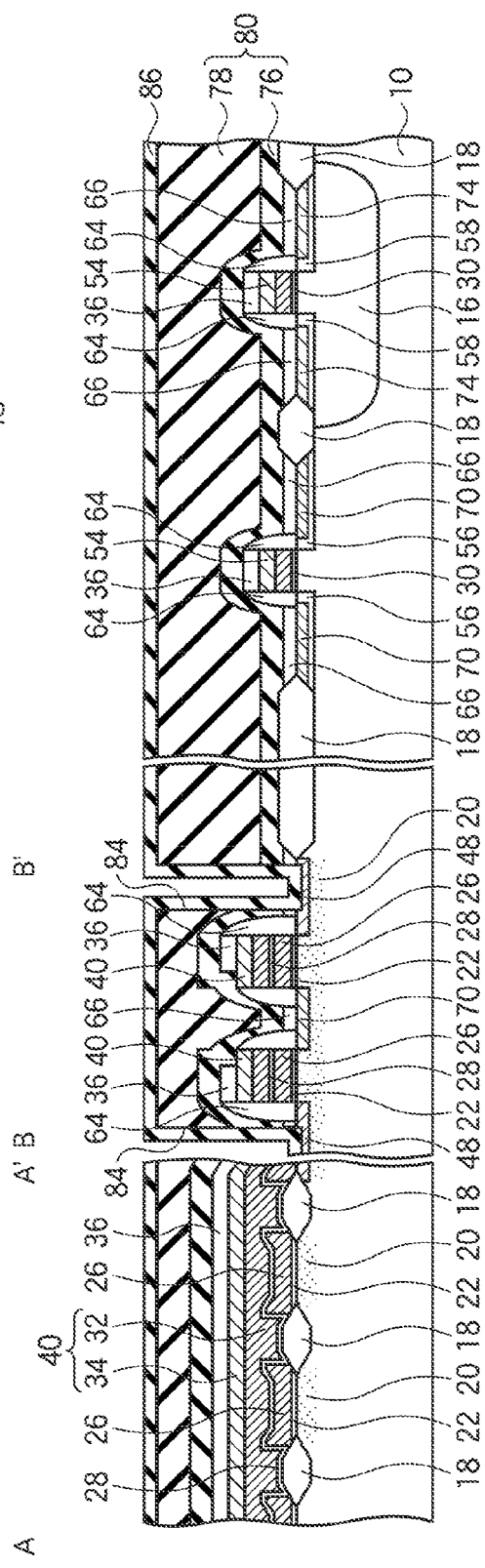

Next, over the entire surface, the silicon oxide film 86 of, e.g., a 150 nm-thickness is formed by, e.g., CVD method (FIGS. 52A, 52B and 52C).

Then, the silicon oxide film 86 is anisotropically etched to form the sidewall spacers 88 of the silicon oxide film 86 on the inside walls of the contact holes 84 (FIGS. 53A, 53B and 53C). The silicon oxide film 86 can be etched, e.g., under the conditions of a $CHF_3/CF_4/Ar=35/45/800$ sccm gas flow rate, a 1600 mT pressure and a 450 W power.

Even when the etch residue is exposed in the section of the contact hole 84 in the Y direction, by forming the sidewall spacer 88, the exposed part can be covered by the sidewall spacer 88. Thus, the insulation between the contact plug which will be formed later and the etch residue 42 can be ensured.

Then, a photoresist film 106 having openings in the region where the contact holes except the contact holes for connecting the bit lines to the drain regions of the memory cell transistors are to be formed is formed on the inter-layer insulating film 80 by photolithography (FIGS. 54A, 54B). For example, rectangular openings of a 0.40 μm-width in the X direction and a 0.40 μm-width in the Y direction are formed.

Next, with the photoresist film 106 as the mask, the inter-layer insulating film 80 is anisotropically etched to form the contact holes 108 down to the silicon substrate 10 in the inter-layer insulating film 80. The inter-layer insulating film 80 is etched, e.g., under the conditions of a $CHF_3/CF_4/Ar=30/30/500$ sccm gas flow rate and a 500 mT pressure and a 1300 W power.

Then, the photoresist film 106 is removed by, e.g., asking method (FIGS. 55A and 55B).

Then, required interconnection process is made to form the contact plugs 90 buried in the contact holes 84, the contact plugs 110 buried in the contact holes 108, the bit lines 92 connected to the memory cell transistors via the contact plugs 90, the interconnection layers 94 connected to the peripheral circuit transistors via the contact plugs 90, etc., and the semiconductor device according to the present embodiment is completed (FIGS. 56A, 56B and 56C).

As described above, according to the present embodiment, the contact holes of the memory cell region and the contact holes of the peripheral circuit regions are opened separately, whereby the peripheral circuit region is prevented from being affected by removal of the etch residue of the floating gates. The contact holes are formed separately, whereby the sidewall spacers cannot be formed in the contact holes of the peripheral circuit region. Thus, the size of the contact holes of the peripheral circuit region can be reduced in comparison with that of the first and the second embodiments. To apply the process of removing the etch residue of the floating gates, it is not necessary to change the layout of the peripheral circuit region, and the design step number can be decreased.

Modified Embodiments

The above-described embodiments can cover other various modifications.

For example, the first and the second embodiments have been described by means of the example that the etch residue 42 is generated, depending on a shape of the edges of the device isolation insulating film 18, but the etch residue 42 are not always generated by the device isolation insulating film 18 depending on a shape of the edges of the device isolation insulating film 18. For example, due to fluctuations of the etching conditions for forming the floating gates 26, the same wide-based configuration as described in the above-described embodiments, and the etch residue 42 are often generated. In such case, the methods described in the above-described embodiments are effective.

In the third embodiment, after the contact holes of the memory cell region have been formed, the contact holes 108 of the peripheral circuit region are formed. However, the contact holes 84 may be formed after the contact holes 108 have been formed. In this case, after the contact plugs 110 have been buried in the contact holes 108, the contact holes 84 are opened, the sidewall spacers 88 are formed, and the contact plugs 90 are buried in.

In the above-described third embodiment, the process of separately opening the contact holes of the memory cell region and the contact holes of the peripheral circuit region is applied to the method of manufacturing the semiconductor device according to the first embodiment, the process may be applied to the method of manufacturing the semiconductor device according to the second embodiment.

The above-described embodiments have been described by means of the example of the flash EEPROM as the semiconductor device including the gate electrodes of the stacked structure. The embodiments are applicable to other semiconductor memories, including gate electrodes of the stacked structure, such as the EPROM, etc.

The structures, the constituent materials, the manufacturing conditions, etc. of the semiconductor device described in the above-described embodiments are one example and can be suitably changed in accordance with technical common sense, etc. of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:
    forming, in semiconductor substrate, a device isolation insulating film defining a device region;
    forming a first insulating film above the device region;
    forming, above the first insulating film, a first conductive film having a first width in a first direction;
    forming a second insulating film above the first conductive film;
    forming, above the second insulating film, a control gate extended in the first direction;
    etching the second insulating film and the first conductive film with the control gate as the mask to form a floating gate of the first conductive film below the control gate;
    forming a third insulating film above the semiconductor substrate with the control gate and the floating gate formed;
    forming, in the third insulating film, a first contact hole reaching the device region and having a second width in the first direction; and
    forming a fourth insulating film on a inside wall of the first contact hole.

2. The method of manufacturing a semiconductor device according to claim 1, wherein
    the second width is larger than the first width.

3. The method of manufacturing a semiconductor device according to claim 1, wherein
    in forming the first contact hole, the first contact hole is formed in a region containing a part where an edge of the first conductive film in the first direction was positioned.

4. The method of manufacturing a semiconductor device according to claim 3, wherein
    in forming the first contact hole, an etch residue of the first conductive film formed in the part where the edge of the first conductive film was positioned is removed.

5. The method of manufacturing a semiconductor device according to claim 1, wherein the device region has a third width in the first direction, which is smaller than the first width, the first conductive film has an edge in the first direction positioned above the device isolation insulating film.

6. The method of manufacturing a semiconductor device according to claim 1, wherein a fourth width of the first contact hole in a second direction intersecting the first direction is smaller than the second width.

7. The method of manufacturing a semiconductor device according to claim 1, wherein forming the first contact hole includes etching under an condition of etching a constituent material of the third insulating film and etching under an condition of etching a constituent material of the first conductive film.

8. The method of manufacturing a semiconductor device according to claim 1, wherein the semiconductor substrate has a memory cell region and a peripheral circuit region, in forming the first contact hole, a second contact hole reaching down to the semiconductor substrate is further formed in the third insulating film in the peripheral circuit region, and in forming the fourth insulating film, the fourth insulating film is formed also on a inside wall of the second contact hole.

9. The method of manufacturing a semiconductor device according to claim 1, wherein the semiconductor substrate has a memory cell region and a peripheral circuit region, the method further comprises, after forming the fourth insulating film, forming a second contact hole reaching down to the semiconductor substrate in the third insulating film in the peripheral circuit region.

10. The method of manufacturing a semiconductor device according to claim 1, in which in forming the device isolation insulating film, the device isolation insulating film is formed in a stripe-shaped pattern extended in a second direction intersecting the first direction, the method further comprises, after forming the floating gate and before forming the third insulating film, etching the device isolation insulating film adjacent to the control gate in the second direction with the control gate as a mask.

11. The method of manufacturing a semiconductor device according to claim 10, wherein in etching the device isolation insulating film, the device isolation insulating film is etched together with an etch residue of the first conductive film formed in a part where an edge of the first conductive film was positioned.

12. The method of manufacturing a semiconductor device according to claim 1, wherein the device isolation insulating film is formed by locally oxidizing the semiconductor substrate.

13. The method of manufacturing a semiconductor substrate according to claim 1, wherein the device isolation film is formed by burying an isolating film in a trench formed in the semiconductor substrate.

14. The method of manufacturing a semiconductor device according to claim 1, further comprising:

forming a contact plug in the first contact hole with the fourth insulating film formed in; and forming above the third insulating film a bit line connected to the contact plug and extended in a second direction intersecting the first direction.

* * * * *